United States Patent
Sella et al.

(10) Patent No.: US 8,947,194 B2
(45) Date of Patent: Feb. 3, 2015

(54) THEFT DETECTION AND PREVENTION IN A POWER GENERATION SYSTEM

(75) Inventors: Guy Sella, Beit Aharon (IL); Meir Adest, Raanana (IL); Meir Gazit, Ashkelon (IL); Lior Handelsman, Givataim (IL); Ilan Yoskovitch, Ramat-Gan (IL); Amir Fishelov, Tel-Aviv (IL); Yaron Binder, Beit Arie (IL); Yoav Galin, Raanana (IL)

(73) Assignee: Solaredge Technologies Ltd., Hod Hasharon (IL)

( * ) Notice: Subject to any disclaimer, the term of this patent is extended or adjusted under 35 U.S.C. 154(b) by 780 days.

(21) Appl. No.: 12/788,066

(22) Filed: May 26, 2010

(65) Prior Publication Data

US 2010/0301991 A1 Dec. 2, 2010

Related U.S. Application Data

(60) Provisional application No. 61/180,940, filed on May 26, 2009.

(51) Int. Cl.
*G05B 23/02* (2006.01)
*H01L 31/042* (2014.01)
(Continued)

(52) U.S. Cl.
CPC .................................. *G08B 13/1409* (2013.01)
USPC .................... 340/3.1; 340/539.1; 340/286.01; 136/244

(58) Field of Classification Search
CPC ........ H01L 31/042; G08B 1/08; G01D 18/00; G05B 23/02
USPC .................... 340/3.1, 539.13, 539.11, 286.01; 700/66; 307/77, 82; 702/88, 182; 363/71, 72, 65
See application file for complete search history.

(56) References Cited

U.S. PATENT DOCUMENTS

| | | |
|---|---|---|
| 2,758,219 A | 8/1956 | Miller |
| 3,369,210 A | 2/1968 | Manickella |

(Continued)

FOREIGN PATENT DOCUMENTS

| | | |
|---|---|---|
| CN | 1309451 A | 8/2001 |
| CN | 1122905 C | 10/2003 |

(Continued)

OTHER PUBLICATIONS

English Translation of the Japan Application 2009-064809 filed (Mar. 26, 2009) by Machine translation from Japan Patent Office; pp. 1 to 30.*

(Continued)

*Primary Examiner* — Nam V Nguyen
(74) *Attorney, Agent, or Firm* — Banner & Witcoff, Ltd.

(57) ABSTRACT

A system for generation of electrical power including an inverter connected to a photovoltaic source including a theft prevention and detection feature. A first memory is permanently attached to the photovoltaic source. The first memory is configured to store a first code. A second memory is attached to the inverter. The second memory configured to store a second code. During manufacture or installation of the system, the first code is stored in the first memory attached to the photovoltaic source. The second code based on the first code is stored in the second memory. Prior to operation of the inverter, the first code is compared to the second code and based on the comparison; the generation of the electrical power is enabled or disabled.

20 Claims, 35 Drawing Sheets

(51) Int. Cl.
  *G08B 1/08*  (2006.01)
  *G08B 13/14*  (2006.01)

(56) References Cited

U.S. PATENT DOCUMENTS

| | | |
|---|---|---|
| 3,596,229 A | 7/1971 | Hohorst |
| 3,958,136 A | 5/1976 | Schroeder |
| 4,060,757 A | 11/1977 | McMurray |
| 4,101,816 A | 7/1978 | Shepter |
| 4,146,785 A | 3/1979 | Neale |
| 4,161,771 A | 7/1979 | Bates |
| 4,171,861 A | 10/1979 | Hohorst |
| 4,257,087 A | 3/1981 | Cuk |
| 4,296,461 A | 10/1981 | Mallory et al. |
| 4,346,341 A | 8/1982 | Blackburn et al. |
| 4,452,867 A | 6/1984 | Conforti |
| 4,460,232 A | 7/1984 | Sotolongo |
| 4,481,654 A | 11/1984 | Daniels et al. |
| 4,549,254 A | 10/1985 | Kissel |
| 4,554,515 A | 11/1985 | Burson et al. |
| 4,598,330 A | 7/1986 | Woodworth |
| 4,623,753 A | 11/1986 | Feldman et al. |
| 4,637,677 A | 1/1987 | Barkus |
| 4,639,844 A | 1/1987 | Gallios et al. |
| 4,641,042 A | 2/1987 | Miyazawa |
| 4,641,079 A | 2/1987 | Kato et al. |
| 4,644,458 A | 2/1987 | Harafuji et al. |
| 4,652,770 A | 3/1987 | Kumano |
| 4,685,040 A | 8/1987 | Steigerwald et al. |
| 4,686,617 A | 8/1987 | Colton |
| 4,706,181 A | 11/1987 | Mercer |
| 4,720,667 A | 1/1988 | Lee et al. |
| 4,720,668 A | 1/1988 | Lee et al. |
| 4,783,728 A | 11/1988 | Hoffman |
| RE33,057 E | 9/1989 | Clegg et al. |
| 4,864,213 A | 9/1989 | Kido |
| 4,868,379 A | 9/1989 | West |
| 4,888,063 A | 12/1989 | Powell |
| 4,888,702 A | 12/1989 | Gerken et al. |
| 4,899,269 A | 2/1990 | Rouzies |
| 4,903,851 A | 2/1990 | Slough |
| 4,906,859 A | 3/1990 | Kobayashi et al. |
| 4,910,518 A | 3/1990 | Kim et al. |
| 4,978,870 A | 12/1990 | Chen et al. |
| 4,987,360 A | 1/1991 | Thompson |
| 5,045,988 A | 9/1991 | Gritter et al. |
| 5,081,558 A | 1/1992 | Mahler |
| 5,191,519 A | 3/1993 | Kawakami |
| 5,280,232 A | 1/1994 | Kohl et al. |
| 5,287,261 A | 2/1994 | Ehsani |
| 5,289,361 A | 2/1994 | Vinciarelli |
| 5,327,071 A | 7/1994 | Frederick et al. |
| 5,345,375 A | 9/1994 | Mohan |
| 5,402,060 A | 3/1995 | Erisman |
| 5,446,645 A | 8/1995 | Shirahama et al. |
| 5,460,546 A | 10/1995 | Kunishi et al. |
| 5,493,154 A | 2/1996 | Smith et al. |
| 5,497,289 A | 3/1996 | Sugishima et al. |
| 5,517,378 A | 5/1996 | Asplund et al. |
| 5,530,335 A | 6/1996 | Decker et al. |
| 5,548,504 A | 8/1996 | Takehara |
| 5,563,780 A | 10/1996 | Goad |
| 5,604,430 A | 2/1997 | Decker et al. |
| 5,616,913 A | 4/1997 | Litterst |
| 5,644,219 A | 7/1997 | Kurokawa |
| 5,646,501 A | 7/1997 | Fishman et al. |
| 5,659,465 A | 8/1997 | Flack et al. |
| 5,686,766 A | 11/1997 | Tamechika |
| 5,773,963 A | 6/1998 | Blanc et al. |
| 5,777,515 A | 7/1998 | Kimura |
| 5,777,858 A | 7/1998 | Rodulfo |
| 5,780,092 A | 7/1998 | Agbo et al. |
| 5,798,631 A | 8/1998 | Spee et al. |
| 5,801,519 A | 9/1998 | Midya et al. |
| 5,804,894 A | 9/1998 | Leeson et al. |
| 5,821,734 A | 10/1998 | Faulk |
| 5,822,186 A | 10/1998 | Bull et al. |
| 5,838,148 A | 11/1998 | Kurokami et al. |
| 5,869,956 A | 2/1999 | Nagao et al. |
| 5,873,738 A | 2/1999 | Shimada et al. |
| 5,886,882 A | 3/1999 | Rodulfo |
| 5,886,890 A | 3/1999 | Ishida et al. |
| 5,892,354 A | 4/1999 | Nagao et al. |
| 5,905,645 A | 5/1999 | Cross |
| 5,917,722 A | 6/1999 | Singh |
| 5,919,314 A | 7/1999 | Kim |
| 5,923,158 A | 7/1999 | Kurokami et al. |
| 5,930,128 A | 7/1999 | Dent |
| 5,932,994 A | 8/1999 | Jo et al. |
| 5,933,327 A | 8/1999 | Leighton et al. |
| 5,945,806 A | 8/1999 | Faulk |
| 5,949,668 A | 9/1999 | Schweighofer |
| 5,961,739 A | 10/1999 | Osborne |
| 5,963,010 A | 10/1999 | Hayashi et al. |
| 5,990,659 A | 11/1999 | Frannhagen |
| 6,002,290 A | 12/1999 | Avery et al. |
| 6,031,736 A | 2/2000 | Takehara et al. |
| 6,037,720 A | 3/2000 | Wong et al. |
| 6,038,148 A | 3/2000 | Farrington et al. |
| 6,046,919 A | 4/2000 | Madenokouji et al. |
| 6,050,779 A | 4/2000 | Nagao et al. |
| 6,078,511 A | 6/2000 | Fasullo et al. |
| 6,081,104 A | 6/2000 | Kern |
| 6,082,122 A | 7/2000 | Madenokouji et al. |
| 6,087,738 A | 7/2000 | Hammond |
| 6,105,317 A | 8/2000 | Tomiuchi et al. |
| 6,111,188 A | 8/2000 | Kurokami et al. |
| 6,111,391 A | 8/2000 | Cullen |
| 6,111,767 A | 8/2000 | Handleman |
| 6,163,086 A | 12/2000 | Choo |
| 6,166,455 A | 12/2000 | Li |
| 6,166,527 A | 12/2000 | Dwelley et al. |
| 6,169,678 B1 | 1/2001 | Kondo et al. |
| 6,219,623 B1 | 4/2001 | Wills |
| 6,255,360 B1 | 7/2001 | Domschke et al. |
| 6,256,234 B1 | 7/2001 | Keeth et al. |
| 6,259,234 B1 | 7/2001 | Perol |
| 6,262,558 B1 | 7/2001 | Weinberg |
| 6,285,572 B1 | 9/2001 | Onizuka et al. |
| 6,292,379 B1 | 9/2001 | Edevold et al. |
| 6,301,128 B1 | 10/2001 | Jang et al. |
| 6,304,065 B1 | 10/2001 | Wittenbreder |
| 6,320,769 B2 | 11/2001 | Kurokami et al. |
| 6,339,538 B1 | 1/2002 | Handleman |
| 6,351,130 B1 | 2/2002 | Preiser et al. |
| 6,369,462 B1 | 4/2002 | Siri |
| 6,380,719 B2 | 4/2002 | Underwood et al. |
| 6,396,170 B1 | 5/2002 | Laufenberg et al. |
| 6,433,522 B1 | 8/2002 | Siri |
| 6,441,597 B1 | 8/2002 | Lethellier |
| 6,448,489 B2 | 9/2002 | Kimura et al. |
| 6,452,814 B1 | 9/2002 | Wittenbreder |
| 6,469,919 B1 | 10/2002 | Bennett |
| 6,483,203 B1 | 11/2002 | McCormack |
| 6,493,246 B2 | 12/2002 | Suzui et al. |
| 6,507,176 B2 | 1/2003 | Wittenbreder, Jr. |
| 6,531,848 B1 | 3/2003 | Chitsazan et al. |
| 6,545,211 B1 | 4/2003 | Mimura |
| 6,548,205 B2 | 4/2003 | Leung et al. |
| 6,587,051 B2 | 7/2003 | Takehara et al. |
| 6,590,793 B1 | 7/2003 | Nagao et al. |
| 6,593,521 B2 | 7/2003 | Kobayashi |
| 6,608,468 B2 | 8/2003 | Nagase |
| 6,611,441 B2 | 8/2003 | Kurokami et al. |
| 6,628,011 B2 | 9/2003 | Droppo et al. |
| 6,633,824 B2 | 10/2003 | Dollar, II |
| 6,650,031 B1 | 11/2003 | Goldack |
| 6,650,560 B2 | 11/2003 | MacDonald et al. |
| 6,653,549 B2 | 11/2003 | Matsushita et al. |
| 6,672,018 B2 | 1/2004 | Shingleton |
| 6,678,174 B2 | 1/2004 | Suzui et al. |
| 6,690,590 B2 | 2/2004 | Stamenic et al. |
| 6,693,781 B1 | 2/2004 | Kroker |
| 6,731,136 B2 | 5/2004 | Knee |

(56) References Cited

U.S. PATENT DOCUMENTS

| | | | |
|---|---|---|---|
| 6,738,692 B2 | 5/2004 | Schienbein et al. |
| 6,744,643 B2 | 6/2004 | Luo et al. |
| 6,765,315 B2 | 7/2004 | Hammerstrom et al. |
| 6,768,047 B2 | 7/2004 | Chang et al. |
| 6,788,033 B2 | 9/2004 | Vinciarelli |
| 6,788,146 B2 | 9/2004 | Forejt et al. |
| 6,795,318 B2 | 9/2004 | Haas et al. |
| 6,801,442 B2 | 10/2004 | Suzui et al. |
| 6,810,339 B2 | 10/2004 | Wills |
| 6,850,074 B2 | 2/2005 | Adams et al. |
| 6,882,131 B1 | 4/2005 | Takada et al. |
| 6,914,418 B2 | 7/2005 | Sung |
| 6,919,714 B2 | 7/2005 | Delepaut |
| 6,927,955 B2 | 8/2005 | Suzui et al. |
| 6,933,627 B2 | 8/2005 | Wilhelm |
| 6,936,995 B2 | 8/2005 | Kapsokavathis et al. |
| 6,950,323 B2 | 9/2005 | Achleitner et al. |
| 6,963,147 B2 | 11/2005 | Kurokami et al. |
| 6,984,967 B2 | 1/2006 | Notman |
| 6,984,970 B2 | 1/2006 | Capel |
| 7,030,597 B2 | 4/2006 | Bruno et al. |
| 7,031,176 B2 | 4/2006 | Kotsopoulos et al. |
| 7,038,430 B2 | 5/2006 | Itabashi et al. |
| 7,042,195 B2 | 5/2006 | Tsunetsugu et al. |
| 7,046,531 B2 | 5/2006 | Zocchi et al. |
| 7,053,506 B2 | 5/2006 | Alonso et al. |
| 7,072,194 B2 | 7/2006 | Nayar et al. |
| 7,079,406 B2 | 7/2006 | Kurokami et al. |
| 7,087,332 B2 | 8/2006 | Harris |
| 7,090,509 B1 | 8/2006 | Gilliland et al. |
| 7,091,707 B2 | 8/2006 | Cutler |
| 7,097,516 B2 | 8/2006 | Werner et al. |
| 7,126,053 B2 | 10/2006 | Kurokami et al. |
| 7,126,294 B2 | 10/2006 | Minami et al. |
| 7,138,786 B2 | 11/2006 | Ishigaki et al. |
| 7,148,669 B2 | 12/2006 | Maksimovic et al. |
| 7,158,359 B2 | 1/2007 | Bertele et al. |
| 7,158,395 B2 | 1/2007 | Deng et al. |
| 7,174,973 B1 | 2/2007 | Lysaght |
| 7,193,872 B2 | 3/2007 | Siri |
| 7,218,541 B2 | 5/2007 | Price et al. |
| 7,248,946 B2 | 7/2007 | Bashaw et al. |
| 7,256,566 B2 | 8/2007 | Bhavaraju et al. |
| 7,277,304 B2 | 10/2007 | Stancu et al. |
| 7,281,141 B2 | 10/2007 | Elkayam et al. |
| 7,282,814 B2 | 10/2007 | Jacobs |
| 7,291,036 B1 | 11/2007 | Daily et al. |
| RE39,976 E | 1/2008 | Schiff |
| 7,336,056 B1 | 2/2008 | Dening |
| 7,348,802 B2 | 3/2008 | Kasanyal et al. |
| 7,352,154 B2 | 4/2008 | Cook |
| 7,371,963 B2 | 5/2008 | Suenaga et al. |
| 7,372,712 B2 | 5/2008 | Stancu et al. |
| 7,385,380 B2 | 6/2008 | Ishigaki et al. |
| 7,385,833 B2 | 6/2008 | Keung |
| 7,394,237 B2 | 7/2008 | Chou et al. |
| 7,420,815 B2 | 9/2008 | Love |
| 7,435,134 B2 | 10/2008 | Lenox |
| 7,435,897 B2 | 10/2008 | Russell |
| 7,443,052 B2 | 10/2008 | Wendt et al. |
| 7,456,523 B2 | 11/2008 | Kobayashi |
| 7,471,014 B2 | 12/2008 | Lum et al. |
| 7,495,419 B1 | 2/2009 | Ju |
| 7,504,811 B2 | 3/2009 | Watanabe et al. |
| 7,589,437 B2 | 9/2009 | Henne et al. |
| 7,600,349 B2 | 10/2009 | Liebendorfer |
| 7,602,080 B1 | 10/2009 | Hadar et al. |
| 7,605,498 B2 | 10/2009 | Ledenev et al. |
| 7,612,283 B2 * | 11/2009 | Toyomura et al. ............ 136/244 |
| 7,646,116 B2 | 1/2010 | Batarseh et al. |
| 7,709,727 B2 | 5/2010 | Roehrig et al. |
| 7,719,140 B2 | 5/2010 | Ledenev et al. |
| 7,748,175 B2 | 7/2010 | Liebendorfer |
| 7,759,575 B2 | 7/2010 | Jones et al. |
| 7,763,807 B2 | 7/2010 | Richter |
| 7,780,472 B2 | 8/2010 | Lenox |
| 7,782,031 B2 | 8/2010 | Qiu et al. |
| 7,783,389 B2 | 8/2010 | Yamada et al. |
| 7,787,273 B2 | 8/2010 | Lu et al. |
| 7,804,282 B2 | 9/2010 | Bertele |
| 7,808,125 B1 | 10/2010 | Sachdeva et al. |
| 7,812,701 B2 | 10/2010 | Lee et al. |
| 7,839,022 B2 | 11/2010 | Wolfs |
| 7,843,085 B2 | 11/2010 | Ledenev et al. |
| 7,864,497 B2 | 1/2011 | Quardt et al. |
| 7,868,599 B2 | 1/2011 | Rahman et al. |
| 7,880,334 B2 | 2/2011 | Evans et al. |
| 7,893,346 B2 | 2/2011 | Nachamkin et al. |
| 7,900,361 B2 | 3/2011 | Adest et al. |
| 7,919,952 B1 * | 4/2011 | Fahrenbruch ................. 323/222 |
| 7,919,953 B2 | 4/2011 | Porter et al. |
| 7,925,552 B2 * | 4/2011 | Tarbell et al. .................... 705/30 |
| 7,944,191 B2 | 5/2011 | Xu |
| 7,945,413 B2 | 5/2011 | Krein |
| 7,948,221 B2 | 5/2011 | Watanabe et al. |
| 7,952,897 B2 | 5/2011 | Nocentini et al. |
| 7,960,650 B2 | 6/2011 | Richter et al. |
| 7,960,950 B2 | 6/2011 | Glovinsky |
| 8,003,885 B2 | 8/2011 | Richter et al. |
| 8,004,116 B2 | 8/2011 | Ledenev et al. |
| 8,004,117 B2 | 8/2011 | Adest et al. |
| 8,013,472 B2 | 9/2011 | Adest et al. |
| 8,058,747 B2 * | 11/2011 | Avrutsky et al. ................ 307/43 |
| 8,058,752 B2 | 11/2011 | Erickson, Jr. et al. |
| 8,067,855 B2 | 11/2011 | Mumtaz et al. |
| 8,077,437 B2 | 12/2011 | Mumtaz et al. |
| 8,089,780 B2 | 1/2012 | Mochikawa et al. |
| 8,093,756 B2 | 1/2012 | Porter et al. |
| 8,093,757 B2 | 1/2012 | Wolfs |
| 8,102,144 B2 | 1/2012 | Capp et al. |
| 8,111,052 B2 | 2/2012 | Glovinsky |
| 8,138,914 B2 * | 3/2012 | Wong et al. ............. 340/539.13 |
| 8,204,709 B2 * | 6/2012 | Presher et al. ................... 702/88 |
| 8,289,742 B2 * | 10/2012 | Adest et al. ..................... 363/71 |
| 8,410,950 B2 * | 4/2013 | Takehara et al. ............. 340/635 |
| 8,415,937 B2 | 4/2013 | Hester |
| 8,436,592 B2 | 5/2013 | Saitoh |
| 8,570,017 B2 | 10/2013 | Perichon et al. |
| 2001/0023703 A1 | 9/2001 | Kondo et al. |
| 2001/0034982 A1 | 11/2001 | Nagao et al. |
| 2002/0044473 A1 | 4/2002 | Toyomura et al. |
| 2002/0056089 A1 | 5/2002 | Houston |
| 2003/0058593 A1 | 3/2003 | Bertele et al. |
| 2003/0058662 A1 | 3/2003 | Baudelot et al. |
| 2003/0066076 A1 | 4/2003 | Minahan |
| 2003/0075211 A1 | 4/2003 | Makita et al. |
| 2003/0080741 A1 | 5/2003 | LeRow et al. |
| 2003/0214274 A1 | 11/2003 | Lethellier |
| 2004/0004402 A1 | 1/2004 | Kippley |
| 2004/0041548 A1 | 3/2004 | Perry |
| 2004/0061527 A1 | 4/2004 | Knee |
| 2004/0125618 A1 | 7/2004 | De Rooij |
| 2004/0140719 A1 | 7/2004 | Vulih et al. |
| 2004/0169499 A1 | 9/2004 | Huang et al. |
| 2004/0201279 A1 | 10/2004 | Templeton |
| 2004/0201933 A1 | 10/2004 | Blanc |
| 2004/0246226 A1 | 12/2004 | Moon |
| 2005/0002214 A1 | 1/2005 | Deng et al. |
| 2005/0005785 A1 | 1/2005 | Poss et al. |
| 2005/0017697 A1 | 1/2005 | Capel |
| 2005/0057214 A1 | 3/2005 | Matan |
| 2005/0057215 A1 | 3/2005 | Matan |
| 2005/0068820 A1 | 3/2005 | Radosevich et al. |
| 2005/0099138 A1 | 5/2005 | Wilhelm |
| 2005/0103376 A1 | 5/2005 | Matsushita et al. |
| 2005/0105224 A1 | 5/2005 | Nishi |
| 2005/0121067 A1 | 6/2005 | Toyomura et al. |
| 2005/0162018 A1 | 7/2005 | Realmuto et al. |
| 2005/0172995 A1 | 8/2005 | Rohrig et al. |
| 2005/0226017 A1 | 10/2005 | Kotsopoulos et al. |
| 2005/0281064 A1 | 12/2005 | Olsen et al. |
| 2006/0001406 A1 | 1/2006 | Matan |
| 2006/0017327 A1 | 1/2006 | Siri et al. |
| 2006/0034106 A1 | 2/2006 | Johnson |

(56) References Cited

U.S. PATENT DOCUMENTS

| | | |
|---|---|---|
| 2006/0038692 A1 | 2/2006 | Schnetker |
| 2006/0043792 A1 | 3/2006 | Hjort et al. |
| 2006/0053447 A1 | 3/2006 | Krzyzanowski et al. |
| 2006/0066349 A1 | 3/2006 | Murakami |
| 2006/0068239 A1 | 3/2006 | Norimatsu et al. |
| 2006/0108979 A1 | 5/2006 | Daniel et al. |
| 2006/0113843 A1 | 6/2006 | Beveridge |
| 2006/0113979 A1 | 6/2006 | Ishigaki et al. |
| 2006/0118162 A1 | 6/2006 | Saelzer et al. |
| 2006/0132102 A1 | 6/2006 | Harvey |
| 2006/0149396 A1 | 7/2006 | Templeton |
| 2006/0162772 A1 | 7/2006 | Presher, Jr. et al. |
| 2006/0163946 A1 | 7/2006 | Henne et al. |
| 2006/0171182 A1 | 8/2006 | Siri et al. |
| 2006/0174939 A1 | 8/2006 | Matan |
| 2006/0176716 A1 | 8/2006 | Balakrishnan et al. |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2006/0227578 A1 | 10/2006 | Datta et al. |
| 2006/0237058 A1 | 10/2006 | McClintock et al. |
| 2007/0013349 A1 | 1/2007 | Bassett |
| 2007/0030068 A1 | 2/2007 | Motonobu et al. |
| 2007/0044837 A1 | 3/2007 | Simburger et al. |
| 2007/0075711 A1 | 4/2007 | Blanc et al. |
| 2007/0081364 A1 | 4/2007 | Andreycak |
| 2007/0133241 A1 | 6/2007 | Mumtaz et al. |
| 2007/0147075 A1 | 6/2007 | Bang |
| 2007/0159866 A1 | 7/2007 | Siri |
| 2007/0164612 A1 | 7/2007 | Wendt et al. |
| 2007/0164750 A1 | 7/2007 | Chen |
| 2007/0165347 A1 | 7/2007 | Wendt et al. |
| 2007/0205778 A1 | 9/2007 | Fabbro et al. |
| 2007/0227574 A1 | 10/2007 | Cart |
| 2007/0236187 A1 | 10/2007 | Wai et al. |
| 2007/0247877 A1 | 10/2007 | Kwon et al. |
| 2007/0273342 A1 | 11/2007 | Kataoka et al. |
| 2007/0290636 A1 | 12/2007 | Beck et al. |
| 2008/0024098 A1 | 1/2008 | Hojo |
| 2008/0080177 A1 | 4/2008 | Chang |
| 2008/0088184 A1 | 4/2008 | Tung et al. |
| 2008/0097655 A1 | 4/2008 | Hadar et al. |
| 2008/0106250 A1 | 5/2008 | Prior et al. |
| 2008/0115823 A1 | 5/2008 | Kinsey |
| 2008/0136367 A1 | 6/2008 | Adest et al. |
| 2008/0143188 A1 | 6/2008 | Adest et al. |
| 2008/0143462 A1 | 6/2008 | Belisle et al. |
| 2008/0144294 A1 | 6/2008 | Adest et al. |
| 2008/0147335 A1 | 6/2008 | Adest et al. |
| 2008/0150366 A1 | 6/2008 | Adest et al. |
| 2008/0164766 A1 | 7/2008 | Adest et al. |
| 2008/0179949 A1 | 7/2008 | Besser et al. |
| 2008/0218152 A1 | 9/2008 | Bo |
| 2008/0236647 A1 | 10/2008 | Gibson et al. |
| 2008/0236648 A1 | 10/2008 | Klein et al. |
| 2008/0238195 A1 | 10/2008 | Shaver et al. |
| 2008/0246460 A1 | 10/2008 | Smith |
| 2008/0246463 A1 | 10/2008 | Sinton et al. |
| 2008/0252273 A1 | 10/2008 | Woo et al. |
| 2008/0303503 A1 | 12/2008 | Wolfs |
| 2009/0014050 A1 | 1/2009 | Haaf |
| 2009/0039852 A1 | 2/2009 | Fishelov et al. |
| 2009/0066399 A1 | 3/2009 | Chen et al. |
| 2009/0073726 A1 | 3/2009 | Babcock |
| 2009/0084570 A1 | 4/2009 | Gherardini et al. |
| 2009/0097172 A1 | 4/2009 | Bremicker et al. |
| 2009/0102440 A1 | 4/2009 | Coles |
| 2009/0140715 A1 | 6/2009 | Adest et al. |
| 2009/0141522 A1 | 6/2009 | Adest et al. |
| 2009/0145480 A1 | 6/2009 | Adest et al. |
| 2009/0146667 A1 | 6/2009 | Adest et al. |
| 2009/0146671 A1 | 6/2009 | Gazit |
| 2009/0147554 A1 | 6/2009 | Adest et al. |
| 2009/0184746 A1 | 7/2009 | Fahrenbruch |
| 2009/0190275 A1 | 7/2009 | Gilmore et al. |
| 2009/0206666 A1 | 8/2009 | Sella et al. |
| 2009/0217965 A1 | 9/2009 | Dougal et al. |
| 2009/0224817 A1 | 9/2009 | Nakamura et al. |
| 2009/0237042 A1 | 9/2009 | Glovinski |
| 2009/0237043 A1 | 9/2009 | Glovinsky |
| 2009/0242011 A1* | 10/2009 | Proisy et al. .................. 136/244 |
| 2009/0273421 A1 | 11/2009 | Cros et al. |
| 2009/0282755 A1 | 11/2009 | Abbott et al. |
| 2009/0284998 A1 | 11/2009 | Zhang et al. |
| 2009/0295225 A1 | 12/2009 | Asplund et al. |
| 2009/0322494 A1 | 12/2009 | Lee |
| 2010/0001587 A1 | 1/2010 | Casey et al. |
| 2010/0052735 A1 | 3/2010 | Burkland et al. |
| 2010/0060000 A1 | 3/2010 | Scholte-Wassink |
| 2010/0085670 A1 | 4/2010 | Palaniswami et al. |
| 2010/0096447 A1* | 4/2010 | Kwon et al. .................. 235/375 |
| 2010/0124027 A1 | 5/2010 | Handelsman et al. |
| 2010/0127571 A1 | 5/2010 | Hadar et al. |
| 2010/0139743 A1 | 6/2010 | Hadar et al. |
| 2010/0176773 A1 | 7/2010 | Capel |
| 2010/0181957 A1 | 7/2010 | Goeltner |
| 2010/0214808 A1 | 8/2010 | Rodriguez |
| 2010/0244575 A1 | 9/2010 | Coccia et al. |
| 2010/0264736 A1 | 10/2010 | Mumtaz et al. |
| 2010/0269430 A1 | 10/2010 | Haddock |
| 2010/0277001 A1 | 11/2010 | Wagoner |
| 2010/0282290 A1 | 11/2010 | Schwarze et al. |
| 2010/0286836 A1 | 11/2010 | Shaver, II et al. |
| 2010/0288327 A1 | 11/2010 | Lisi et al. |
| 2010/0294528 A1 | 11/2010 | Sella et al. |
| 2010/0294903 A1 | 11/2010 | Shmukler et al. |
| 2010/0297860 A1 | 11/2010 | Shmukler et al. |
| 2010/0308662 A1 | 12/2010 | Schatz et al. |
| 2011/0006743 A1 | 1/2011 | Fabbro |
| 2011/0037600 A1 | 2/2011 | Takehara et al. |
| 2011/0043172 A1 | 2/2011 | Dearn |
| 2011/0056533 A1 | 3/2011 | Kuan |
| 2011/0079263 A1 | 4/2011 | Avrutsky |
| 2011/0084553 A1 | 4/2011 | Adest et al. |
| 2011/0114154 A1 | 5/2011 | Lichy et al. |
| 2011/0115295 A1 | 5/2011 | Moon et al. |
| 2011/0121652 A1* | 5/2011 | Sella et al. ........................ 307/43 |
| 2011/0125431 A1 | 5/2011 | Adest et al. |
| 2011/0133552 A1 | 6/2011 | Binder et al. |
| 2011/0139213 A1 | 6/2011 | Lee |
| 2011/0140536 A1 | 6/2011 | Adest et al. |
| 2011/0181251 A1 | 7/2011 | Porter et al. |
| 2011/0181340 A1 | 7/2011 | Gazit |
| 2011/0210611 A1 | 9/2011 | Ledenev et al. |
| 2011/0227411 A1 | 9/2011 | Arditi |
| 2011/0232714 A1 | 9/2011 | Bhavaraju et al. |
| 2011/0254372 A1 | 10/2011 | Haines et al. |
| 2011/0260866 A1 | 10/2011 | Avrutsky et al. |
| 2011/0267859 A1 | 11/2011 | Chapman |
| 2011/0271611 A1 | 11/2011 | Maracci et al. |
| 2011/0273015 A1 | 11/2011 | Adest et al. |
| 2011/0273016 A1 | 11/2011 | Adest et al. |
| 2011/0285205 A1 | 11/2011 | Ledenev et al. |
| 2011/0290317 A1 | 12/2011 | Naumovitz et al. |
| 2011/0291486 A1 | 12/2011 | Adest et al. |
| 2011/0316346 A1 | 12/2011 | Porter et al. |
| 2012/0007613 A1 | 1/2012 | Gazit |
| 2012/0019966 A1 | 1/2012 | DeBoer |
| 2012/0032515 A1 | 2/2012 | Ledenev et al. |
| 2012/0043818 A1 | 2/2012 | Stratakos et al. |
| 2012/0048325 A1 | 3/2012 | Matsuo et al. |
| 2012/0081009 A1 | 4/2012 | Shteynberg et al. |
| 2012/0087159 A1 | 4/2012 | Chapman et al. |
| 2012/0091810 A1 | 4/2012 | Aiello et al. |
| 2012/0113554 A1 | 5/2012 | Paoletti et al. |

FOREIGN PATENT DOCUMENTS

| | | |
|---|---|---|
| CN | 101136129 A | 3/2008 |
| CN | 101488271 A | 7/2009 |
| CN | 101523230 A | 9/2009 |
| DE | 19737286 | 3/1999 |
| DE | 102005030907 | 1/2007 |
| DE | 102008057874 | 5/2010 |

(56) References Cited

FOREIGN PATENT DOCUMENTS

| | | |
|---|---|---|
| EP | 0419093 | 3/1991 |
| EP | 0420295 | 4/1991 |
| EP | 0604777 | 7/1994 |
| EP | 0756178 | 1/1997 |
| EP | 0827254 | 3/1998 |
| EP | 1039621 A2 | 9/2000 |
| EP | 1047179 A1 | 10/2000 |
| EP | 1330009 | 7/2003 |
| EP | 1503490 | 2/2005 |
| EP | 1531542 A2 | 5/2005 |
| EP | 1531545 | 5/2005 |
| EP | 1657557 | 5/2006 |
| EP | 1657797 | 5/2006 |
| EP | 1887675 | 2/2008 |
| EP | 2048679 | 4/2010 |
| EP | 2315328 A2 | 4/2011 |
| EP | 2393178 A2 | 12/2011 |
| ES | 2249147 | 3/2006 |
| ES | 2249149 | 3/2006 |
| GB | 2476508 A | 6/2011 |
| JP | 61065320 A | 4/1986 |
| JP | 6165320 | 5/1986 |
| JP | 6165310 A | 6/1994 |
| JP | 8009557 A | 1/1996 |
| JP | 11041832 | 2/1999 |
| JP | 11103538 | 4/1999 |
| JP | 11206038 A | 7/1999 |
| JP | 11289891 A | 10/1999 |
| JP | 11318042 A | 11/1999 |
| JP | 2000174307 A | 6/2000 |
| JP | 2000339044 A | 12/2000 |
| JP | 2001189476 A | 7/2001 |
| JP | 2002300735 A | 10/2002 |
| JP | 2003124492 | 4/2003 |
| JP | 2003134667 | 5/2003 |
| JP | 2004194500 A | 7/2004 |
| JP | 2004260944 A | 9/2004 |
| JP | 2004334704 A | 11/2004 |
| JP | 2005192314 A | 7/2005 |
| JP | 2007058845 | 3/2007 |
| JP | 2009-064809 A * | 3/2009 ...................... 340/3.1 |
| WO | 9313587 | 7/1993 |
| WO | 9613093 | 5/1996 |
| WO | 98023021 A2 | 5/1998 |
| WO | 00-00839 | 1/2000 |
| WO | 0021178 | 4/2000 |
| WO | 0075947 | 12/2000 |
| WO | 0231517 | 4/2002 |
| WO | 03050938 | 6/2003 |
| WO | 03071655 | 8/2003 |
| WO | 2004023278 | 3/2004 |
| WO | 2004090993 | 10/2004 |
| WO | 2004098261 A2 | 11/2004 |
| WO | 2004107543 | 12/2004 |
| WO | 2005076444 | 8/2005 |
| WO | 2005076445 | 8/2005 |
| WO | 2006005125 | 1/2006 |
| WO | 2006007198 | 1/2006 |
| WO | 2006078685 | 7/2006 |
| WO | 2007006564 | 1/2007 |
| WO | 2007048421 | 5/2007 |
| WO | 2007073951 | 7/2007 |
| WO | 2007084196 | 7/2007 |
| WO | 2007090476 | 8/2007 |
| WO | 2007113358 | 10/2007 |
| WO | 2008008528 A2 | 1/2008 |
| WO | 2008125915 | 10/2008 |
| WO | 2008132551 | 11/2008 |
| WO | 2008132553 | 11/2008 |
| WO | 2008142480 | 11/2008 |
| WO | 2009007782 | 1/2009 |
| WO | 2009046533 A1 | 4/2009 |
| WO | 2009051853 | 4/2009 |
| WO | 2009118682 | 10/2009 |
| WO | 2009118683 | 10/2009 |
| WO | 2009136358 | 11/2009 |
| WO | 2010/002960 A1 | 1/2010 |
| WO | 2010065388 | 6/2010 |
| WO | 2010072717 | 7/2010 |
| WO | 2010078303 A2 | 7/2010 |
| WO | 2010094012 A1 | 8/2010 |
| WO | 2011011711 | 1/2011 |
| WO | 2011017721 | 2/2011 |
| WO | 2011023732 A2 | 3/2011 |
| WO | 2011059067 A1 | 5/2011 |
| WO | 2011074025 A1 | 6/2011 |

OTHER PUBLICATIONS

Extended European Search Report—EP12176089.6—Mailing date: Nov. 8, 2012.
Gwon-Jong Yu et al: "Maximum power point tracking with temperature compensation of photovoltaic for air conditioning system with fuzzy controller", 19960513; 19960513-19960517, May 13, 1996, pp. 1429-1432, XP010208423.
Extended European Search Report—EP12177067.1—Mailing Date: Dec. 7, 2012.
GB Combined Search and Examination Report—GB1200423.0—Mailing date: Apr. 30, 2012.
GB Combined Search and Examination Report—GB1201499.9—Mailing date: May 28, 2012.
GB Combined Search and Examination Report—GB1201506.1—Mailing date: May 22, 2012.
Ciobotaru, et al., Control of single-stage single-phase PV inverter, Aug. 7, 2006.
Chen, et al., "A New Low-Stress Buck-Boost Converter for Universal-Input PFC Applications", IEEE Applied Power Electronics Converence, Feb. 2001, Colorado Power Electronics Center Publications.
Chen, et al., "Buck-Boost PWM Converters Having Two Independently Controlled Switches", IEEE Power Electronics Specialists Converence, Jun. 2001, Colorado Power Electronics Center Publications.
Esram, et al., "Comparison of Photovoltaic Array Maximum Power Point Tracking Techniques", IEEE Transactions on Energy Conversion, vol. 22, No. 2, Jun. 2007, pp. 439-449.
Walker, et al., "PhotoVoltaic DC-DC Module Integrated Converter for Novel Cascaded and Bypass Grid Connection Topologies-Design and Optimisation", 37th IEEE Power Electronics Specialists Converence, Jun. 18-22, 2006, Jeju, Korea.
Alonso, et al., "Cascaded H-Bridge Multilevel Converter for Grid Connected Photovoltaic Generators with Independent Maximum Power Point Tracking of Each Solor Array", 2003 IEEE 34th, Annual Power Electronics Specialists Conference, Acapulco, Mexico, Jun. 15-19, 2003, pp. 731-735, vol. 2.
Walker, "Cascaded DC-DC Converter Connection of Photovoltaic Modules", IEEE Transactions on Power Electronics, vol. 19, No. 4, Jul. 2004, pp. 1130-1139.
Hou, et al., Application of Adaptive Algorithm of Solar Cell Battery Charger, Apr. 2004.
Stamenic, et al., "Maximum Power Point Tracking for Building Integrated Photovoltaic Ventilation Systems", 2000.
International Preliminary Report on Patentability for PCT/IB2008/055092 dated Jun. 8, 2010.
International Search Report for PCT/IB2008/055092 dated Sep. 8, 2009.
International Search Report and Opinion of International Patent Application WO2009136358 (PCT/IB2009/051831), dated Sep. 16, 2009.
Informal Comments to the International Search Report dated Dec. 3, 2009.
PCT/IB2010/052287 International Search Report and Written Opinion dated Sep. 2, 2010.
UK Intellectual Property office, Combined Search and Examination Report for GB1100450.4 under Sections 17 and 18 (3), Jul. 14, 2011.
Jain, et al., "A Single-Stage Grid Connected Inverter Topology for Solar PV Systems with Maximum Power Point Tracking", IEEE Transactions on Power Electronics, vol. 22, No. 5, Sep. 2007, pp. 1928-1940.

(56) References Cited

OTHER PUBLICATIONS

Lynch, et al., "Flexible DER Utility Interface System: Final Report", Sep. 2004-May 2006, Northern Power Systems, Inc., Waitsfield, Vermont B. Kroposki, et al., National Renewable Energy Laboratory Golden, Colorado Technical Report NREL/TP-560-39876, Aug. 2006.

Schimpf, et al., "Grid Connected Converters for Photovoltaic, State of the Art, Ideas for improvement of Transformerless Inverters", NORPIE/2008, Nordic Workshop on Power and Industrial Electronics, Jun. 9-11, 2008.

Sandia Report SAND96-2797 IUC-1290 Unlimited Release, Printed Dec. 1996, "Photovoltaic Power Systems and the National Electrical Code: Suggested Practices", by John Wiles, Southwest Technology Development Instutte New Mexico State University Las Cruces, NM.

United Kingdom Intellectual Property Office, Combined Search and Examination Report Under Sections 17 and 18(3), GB1020862.7, dated Jun. 16, 2011.

QT Technical Application Papers, "ABB Circuit-Breakers for Direct current Applications", ABB SACE S.p.A., An ABB Group Coupany, L.V. Breakers, Via Baioni, 35, 24123 Bergamo-Italy, Tel.: +39 035.395.111—Telefax: +39 035.395.306-433.

Woyte, et al., "Mains Monitoring and Protection in a European Context", 17th European Photovoltaic Solar Energy Conference and Exhibition, Munich, Germany, Oct. 22-26, 2001, Achim, Woyte, et al., pp. 1-4.

"Implementation and testing of Anti-Islanding Algorithms for IEEE 929-2000 Compliance of Single Phase Photovoltaic Inverters", Raymond M. Hudson, Photovoltaic Specialists Conference, 2002. Conference Record of the Twenty-Ninth IEEE, May 19-24, 2002.

Fairchild Semiconductor, Application Note 9016, IGBT Basics 1, by K.S. OH Feb. 1, 2001.

"Disconnect Switches in Photovoltaic Applications", ABB, Inc., Low Voltage Control Products & Systems, 1206 Hatton Road, Wichita Falls, TX 86302, Phone 888-385-1221, 940-397-7000, Fax: 940-397-7085, 1SXU301197B0201, Nov. 2009.

Walker, "A DC Circuit Breaker for an Electric Vehicle Battery Pack", Australasian Universities Power Engineering Conference and IEAust Electric Energy Conference, Sep. 26-29, 1999.

Combined Search and Examination Report for GB1018872.0 dated Apr. 15, 2011, 2 pages.

International Search Report and Opinion of International Patent Application PCT/2009/051222, dated Oct. 7, 2009.

UK Intellectual Property Office, Application No. GB1109618.7, Patents Act 1977, Examination Report Under Section 18(3), Sep. 16, 2011.

UK Intellectual Property Office, Patents Act 1977: Patents Rules Notification of Grant: Patent Serial No. GB2480015, Nov. 29, 2011.

Walker, et al. "PV String Per-Module Maximum Power Point Enabling Converters", School of Information Technology and Electrical Engineering The University of Queensland, Sep. 28, 2003.

Walker, "Cascaded DC-DC Converter Connection of Photovoltaic Modules", 33rd Annual IEEE Power Electronics Specialists Conference. PESC 2002. Conference Proceedings. Cairns, Queensland, Australia, Jun. 23-27, 2002; [Annual Power Electronics Specialists Conference], New York, NY: IEEE US, vol. 1, Jun. 23, 2002, pp. 24-29, XP010596060 ISBN: 978-0/7803-7262-7, figure 1.

Baggio, "Quasi-ZVS Activity Auxiliary Commutation Circuit for Two Switches Forward Converter", 32nd Annual IEEE Power Electronics Specialists Conference. PESC 2001. Conference Proceedings. Vancouver, Canada, Jun. 17-21, 2001; [Annual Power Electronics Specialists Conference] New York, NY: IEEE, US.

Ilic, "Interleaved Zero-Current-Transition Buck Converter", IEEE Transactions on Industry Applications, IEEE Service Center, Piscataway, NJ, US, vol. 43, No. 6, Nov. 1, 2007, pp. 1619-1627, XP011197477 ISSN: 0093-9994, pp. 1619-1922.

Lee: "Novel Zero-Voltage-Transition and Zero-Current-Transition Pulse-Width-Modulation Converters", Power Electronics Specialists Conference, 1997, PESC '97, Record, 28th Annual IEEE St. Louis, MO, USA, Jun. 22-27, 1997, New York, NY, USA IEEE, US, vol. 1, Jun. 22, 1997, pp. 233-239, XP010241553, ISBN: 978-0-7803-3840-1, pp. 233-236.

Sakamoto, "Switched Snubber for High-Frequency Switching Converters", Electronics & Communications in Japan, Part 1—Communications, Wiley, Hoboken, NJ, US, vol. 76, No. 2, Feb. 1, 1993, pp. 30-38, XP000403018 ISSN: 8756-6621, pp. 30-35.

Duarte, "A Family of ZVX-PWM Active-Clamping DC-to-DC Converters: Synthesis, Analysis and Experimentation", Telecommunications Energy Conference, 1995, INTELEC '95, 17th International The Hague, Netherlands, Oct. 29-Nov. 1, 1995, New York, NY, US, IEEE, US, Oct. 29, 1995, pp. 502-509, XP010161283 ISBN: 978-0-7803-2750-4 p. 503-504.

Geoffrey R. Walker Affidavit re: U.S. Appl. No. 11/950,307, submitted in an IDS for U.S. Appl. No. 11/950,271 on Mar. 9, 2010.

Geoffrey R. Walker Affidavit re: U.S. Appl. No. 11/950,271, submitted in an IDS for U.S. Appl. No. 11/950,271 on Mar. 9, 2010.

QT Technical Application Papers, "ABB Circuit-Breakers for Direct current Applications", ABB SACE S.p.A., An ABB Group Coupany, L.V. Breakers, Via Baioni, 35, 24123 Bergamo-Italy, Tel.: +39 035.395.111—Telefax: +39 035.395.306-433, Sep. 2007.

Gao, et al., "Parallel-Connected Solar PV System to Address Partial and Rapidly Fluctuating Shadow Conditions", IEEE Transactions on Industrial Electronics, vol. 56, No. 5, May 2009, pp. 1548-1556.

"Study of Energy Storage Capacitor Reduction for Single Phase PWM Rectifier", Ruxi Wang et al., Virginia Polytechnic Institute and State University, Feb. 2009.

"Multilevel Inverters: A Survey of Topologies, Controls, and Applications", José Rodríguez et al., IEEE Transactions on Industrial Electronics, vol. 49, No. 4, Aug. 2002.

Extended European Search Report—EP 08878650.4—Mailing date: Mar. 28, 2013.

Satcon Solstice—Satcon Solstice 100 kW System Solution Sheet—2010.

John Xue, "PV Module Series String Balancing Converters", University of Queensland—School of Infroamtion Technology & Electrical Engineering, Nov. 6, 2002.

Robert W. Erickson, "Future of Power Electronics for Photovoltaics", IEEE Applied Power Electronics Conference, Feb. 2009.

GB Combined Search and Examination Report—GB1203763.6—Mailing date: Jun. 25, 2012.

Mohammad Reza Amini et al., "Quasi REsonant DC Link Inverter with a Simple Auxiliary Circuit", Journal of Power Electronics, vol. 11, No. 1, Jan. 2011.

Khairy Fathy et al., "A Novel Quasi-Resonant Snubber-Assisted ZCS-PWM DC-DC Converter with High Frequency Link", Journal of Power Electronics, vol. 7, No. 2, Apr. 2007.

Cheng K.W.E., "New Generation of Switched Capacitor Converters", Department of Electrical Engineering, The Hong Kong Polytechnic University, Hung Hom, Hong Kong, Power Electronics Conference, 1998, PESC 98.

Per Karlsson, "Quasi Resonant DC Link Converters—Analysis and Design for a Battery Charger Application", Universitetstryckeriet, Lund University, 1999, ISBN 91-88934-14-4.

Hsiao Sung-Hsin et al., "ZCS Switched-Capacitor Bidirectional Converters with Secondary Output Power Amplifier for Biomedical Applications", Power Electronics Conference (IPEC) Jun. 21, 2010.

Yuang-Shung Lee et al.,"A Novel QR ZCS Switched-Capacitor Bidirectional Converter", IEEE, 2007.

Antti Tolvanen et al., "Seminar on Solar Simulation Standards and Measurement Principles", May 9, 2006 Hawaii.

J.A. Eikelboom and M.J. Jansen, "Characterisation of PV Modules of New Generations—Results of test and simulations", Jun. 2000.

Yeong-Chau Kuo et al., "Novel Maximum-Power-Point-Tracking Controller for Photovoltaic Energy Conversion System", IEEE Transactions on Industrial Electronics, Vol. 48, No. 3, Jun. 2001.

C. Liu et al., "Advanced Algorithm for MPPT Control of Photovoltaic Systems", Canadian Solar Buildings Conference, Montreal, Aug. 20-24, 2004.

Chihchiang Hua and Chihming Shen, "Study of Maximum Power Tracking Techniques and Control of DC/DC Converters for Photovoltaic Power System", IEEE 1998.

(56) References Cited

OTHER PUBLICATIONS

Tore Skjellnes et al., "Load sharing for parallel inverters without communication", Nordic Workshop in Power and Industrial Electronics, Aug. 12-14, 2002.
Giorgio Spiazzi at el., "A New Family of Zero-Current-Switching Variable Frequency dc-dc Converters", IEEE 2000.
Nayar, C.V., M. Ashari and W.W.L Keerthiphala, "A Gridinteractive Photovoltaic Uninterruptible Power Supply System Using Battery Storage and a Back up Diesel Generator", IEEE Transactions on Energy Conversion, vol. 15, No. 3, Sep. 2000, pp. 348?353.
Ph. Strauss et al., "AC coupled PV Hybrid systems and Micro Grids-state of the art and future trends", 3rd World Conference on Photovoltaic Energy Conversion, Osaka, Japan May 11-18, 2003.
Nayar, C.V., abstract, Power Engineering Society Summer Meeting, 2000. IEEE, 2000, pp. 1280-1282 vol. 2.
D. C. Martins et al., "Analysis of Utility Interactive Photovoltaic Generation System using a Single Power Static Inverter", Asian J. Energy Environ., vol. 5, Issue 2, (2004), pp. 115-137.
Rafael C. Beltrame et al., "Decentralized Multi String PV System With Integrated ZVT Cell", Congresso Brasileiro de Automática / 12 a 16-setembro-2010, Bonito-MS.
Sergio Busquets-Monge et al., "Multilevel Diode-clamped Converter for Photovoltaic Generators With Independent Voltage Control of Each Solar Array", IEEE Transactions on Industrial Electronics, vol. 55, No. 7, Jul. 2008.
Soeren Baekhoej Kjaer et al., "A Review of Single-Phase Grid-Connected Inverters for Photovoltaic Modules", IEEE Transactions on Industry Applications, vol. 41, No. 5, Sep./Oct. 2005.
Office Action—JP 2011-539491—Mailing date: Mar. 26, 2013.
Supplementary European Search Report—EP08857456—Mailing Date Dec. 6, 2013.
Extended European Search Report—EP14151651.8—Mailing date: Feb. 25, 2014.
Iyomori H et al: "Three-phase bridge power block module type auxiliary resonant AC link snubber-assisted soft switching inverter for distributed AC power supply", Intelec 2003. 25th. International Telecommunications Energy Conference. Yokohama, Japan, Oct. 19-23, 2003; Tokyo, IEICE, JP, Oct. 23, 2003, pp. 650-656, XP031895550, ISBN: 978-4-88552-196-6.
Yuqing Tang: "High Power Inverter EMI characterization and Improvement Using Auxiliary Resonant Snubber Inverter", Dec. 17, 1998, XP055055241, Blacksburg, Virginia Retrieved from the Internet: URL:http:jjscholar.lib.vt.edu/theses/available/etd-012299-165108/unrestricted/THESIS.PDF, [retrieved on Mar. 5, 2013].
Yoshida M et al: "Actual efficiency and electromagnetic noises evaluations of a single inductor resonant AC link snubber-assisted three-phase soft-switching inverter", Intelec 2003. 25th. International Telecommunications Energy Conference. Yokohama, Japan, Oct. 19-23, 2003; Tokyo, IEICE, JP, Oct. 23, 2003, pp. 721-726, XP031895560, ISBN: 978-4-88552-196-6.
Third party observation—EP07874025.5—Mailing date: Aug. 6, 2011.
International Search Report for PCT/IB2007/004591 dated Jul. 5, 2010.
European Communication for EP07873361.5 dated Jul. 12, 2010.
European Communication for EP07874022.2 dated Oct. 18, 2010.
European Communication for EP07875148.4 dated Oct. 18, 2010.
Geoffrey R. Walker Affidavit re: U.S. Appl. No. 11/950,307.
Geoffrey R. Walker Affidavit re: U.S. Appl. No. 11/950,271.
International Search Report for PCT/IB2007/004610 dated Feb. 23, 2009.
International Search Report for PCT/IB2007/004584 dated Jan. 28, 2009.
International Search Report for PCT/IB2007/004586 dated Mar. 5, 2009.
International Search Report for PCT/IB2007/004643 dated Jan. 30, 2009.
International Search Report for PCT/US2008/085736 dated Jan. 28, 2009.
International Search Report for PCT/US2008/085754 dated Feb. 9, 2009.
International Search Report for PCT/US2008/085755 dated Feb. 3, 2009.
Kajihara, et al., "Model of Photovoltaic Cell Circuits Under Partial Shading", 2005 IEEE, pp. 866-870.
Knaupp, et al., "Operation of a 10 KW PV Façade with 100 W AC Photovoltaic Modules", 1996 IEEE, 25th PVSC, May 13-17, 1996, pp. 1235-1238, Washington, DC.
Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.
Chen, et al., "Predictive Digital Current Programmed Control", IEEE Transactions on Power Electronics, vol. 18, Issue 1, Jan. 2003.
Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.
Alonso, "A New Distributed Converter Interface for PV Panels", 20th European Photovoltaic Solar Energy Conference, Jun. 6-10, 2005, Barcelona, Spain, pp. 2288-2291.
Alonso, "Experimental Results of Intelligent PV Module for Grid-Connected PV Systems", 21st European Photovoltaic Solar Energy Conference, Sep. 4-8, 2006, Dresden, Germany, pp. 2297-2300.
Enslin, "Integrated Photovoltaic Maximum Power Point Tracking Converter", IEEE Transactions on Industrial Electronics, vol. 44, No. 6, Dec. 1997, pp. 769-773.
Lindgren, "Topology for Decentralised Solar Energy Inverters with a Low Voltage AC-Bus", Chalmers University of Technology, Department of Electrical Power Engineering, EPE '99—Lausanne.
Nikraz, "Digital Control of a Voltage Source Inverter in a Photovoltaic Applications", 2004 35th Annual IEEE Power Electronics Specialists Conference, Aachen, Germany, 2004, pp. 3266-3271.
Orduz, "Evaluation Test Results of a New Distributed MPPT Converter", 22nd European Photovoltaic Solar Energy Conference, Sep. 3-7, 2007, Milan, Italy.
Palma, "A Modular Fuel Cell, Modular DC-DC Converter Concept for High Performance and Enhanced Reliability", IEEE 2007, pp. 2633-2638.
Quaschning, "Cost Effectiveness of Shadow Tolerant Photovoltaic Systems", Berlin University of Technology, Institute of Electrical Energy Technology, Renewable Energy Section. EuroSun '96, pp. 819-824.
Roman, "Intelligent PV Module for Grid-Connected PV Systems", IEEE Transactions on Industrial Electronics, vol. 52, No. 4, Aug. 2006, pp. 1066-1073.
Roman, "Power Line Communications in Modular PV Systems", 20th European Photovoltaic Solar Energy Conference, Jun. 6-10, 2005, Barcelona, Spain, pp. 2249-2252.
Uriarte, "Energy Integrated Management System for PV Applications", 20th European Photovoltaic Solar Energy Conference, Jun. 6-10, 2005, Barcelona, Spain, pp. 2292-2295.
Matsui, et al., "A New Maximum Photovoltaic Power Tracking Control Scheme Based on Power Equilibrium at DC Link", IEEE, 1999, pp. 804-809.
International Search Report and Opinion of International Patent Application PCT/2009/051221, dated Oct. 19, 2009.
Communication in EP07874025.5 dated Aug. 17, 2011.
IPRP for PCT/IB2008/055095 dated Jun. 8, 2010, with Written Opinion.
ISR for PCT/IB2008/055095 dated Apr. 30, 2009.
IPRP for PCT/IL2007/001064 dated Mar. 17, 2009, with Written Opinion dated Mar. 25, 2008.
ISR for PCT/IL07/01064 dated Mar. 25, 2008.
IPRP for PCT/IB2007/004584 dated Jun. 10, 2009, with Written Opinion.
IPRP for PCT/IB2007/004586 dated Jun. 10, 2009, with Written Opinion.
IPRP for PCT/IB2007/004591 dated Jul. 13, 2010, with Written Opinion.
IPRP for PCT/IB2007/004610 dated Jun. 10, 2009, with Written Opinion.

(56) References Cited

OTHER PUBLICATIONS

IPRP for PCT/IB2007/004643 dated Jun. 10, 2009, with Written Opinion.
Written Opinion for PCT/IB2008/055092 submitted with IPRP dated Jun. 8, 2010.
IPRP for PCT/US2008/085754 dated Jun. 8, 2010, with Written Opinion dated Jan. 21, 2009.
IPRP for PCT/US2008/085755 dated Jun. 8, 2010, with Written Opinion dated Jan. 20, 2009.
IPRP for PCT/IB2009/051221 dated Sep. 28, 2010, with Written Opinion.
IPRP for PCT/IB2009/051222 dated Sep. 28, 2010, with Written Opinion.
IPRP for PCT/IB2009/051831 dated Nov. 9, 2010, with Written Opinion.
IPRP for PCT/US2008/085736 dated Jun. 7, 2011, with Written Opinion.
IPRP for PCT/IB2010/052287 dated Nov. 22, 2011, with Written Opinion.
ISR for PCT/IB2010/052413 dated Sep. 7, 2010.
Extended European Search Report—EP 13152967.9—Mailing date: Aug. 28, 2014.

\* cited by examiner

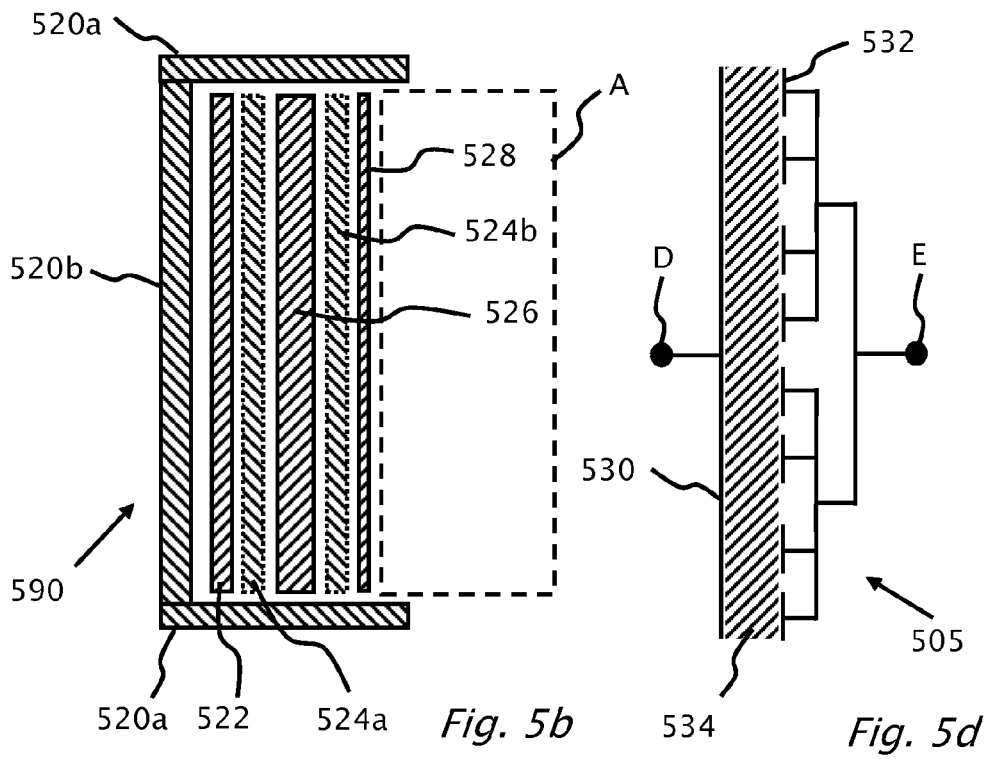
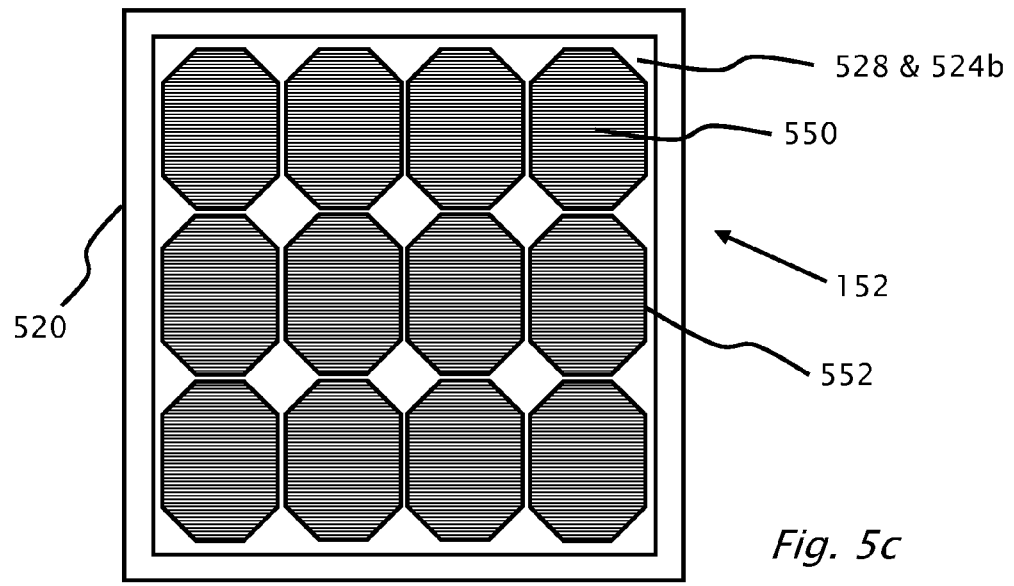
Fig. 5b
Fig. 5d
Fig. 5c

THEFT DETECTION AND PREVENTION IN A POWER GENERATION SYSTEM

CROSS REFERENCE TO RELATED APPLICATIONS

The present application claims the benefit of U.S. patent application No. 61/180,940 filed May 26, 2009, the disclosure of which is incorporated by reference herein in its entirety.

FIELD AND BACKGROUND

1. Field

The present invention is related to power generation systems, and specifically to theft detection and prevention of components of photovoltaic power generation systems.

2. Related Art

A photovoltaic power generation system incorporates one or more photovoltaic panels typically mounted on a roof of a building. An inverter located inside the building connects to the photovoltaic panels. The power output from the photovoltaic panels is direct current (DC) power. The inverter converts the direct current power to alternating current (AC) power.

The use of photovoltaic panel based power generation systems are attractive from an environmental point of view. However, the cost of photovoltaic panels and their relative ease of theft, might limit their adoption for use in power generation systems. There is therefore a need for methods and systems for theft detection and prevention of photovoltaic panels.

The term "memory" as used herein refers to one or more of read only memory (PROM), erasable programmable read only memory (EPROM,) electrically erasable programmable read only memory (EEPROM), FLASH memory, optical memory, e.g. compact disk, switches, random access memory (RAM), magnetic memory such as a hard disk or other memory types known in the art of A hash function is a transformation that takes an input and returns a fixed-size string or a numeric value, which is called the hash value. The term "hash" as used herein refers to the hash value output of the transformation.

The term "pairing or paired" as used herein refers to at least two power generation system components such as an inverter, photovoltaic panels and/or electronic modules for example which are "paired' or associated with each other. "Pairing" establishes a unique association between for example an inverter (as opposed to other inverters in a power generation system) and a particular set of photovoltaic panels and/or electronic modules. The "pairing" between power generation components such as an inverter, photovoltaic panel and/or electronic module is typically performed via assignment codes/re-hash of codes, signals or permanently attaching additional hardware to each power generation component and each power generation component being aware of the codes/re-hash of codes, signals or permanently attached additional hardware of other power generation components as part and parcel of a "pairing" process. The "pairing" process may take place at the time manufacture of power generation system components, during installation of a power generation system and/or during the operation of the power generation system. The codes/re-hash of codes, signals or permanently attached additional hardware assigned to power generation system components, typically establishes the electrical connections, topographic location, continued presence/absence, numbers, types of power generation system components within a power generation system.

The terms "sensing" and "measuring" as used herein are used interchangeably.

The term "direct current (DC) power source" as used herein refers to (DC) power source such as batteries, DC motor generator; switch mode power supply (SMPS), photovoltaic panels and/or photovoltaic panels operatively attached to a converter module such as a DC to DC converter.

The term "photovoltaic source" as used herein refers to a photovoltaic panel and/or a photovoltaic panel operatively attached to a converter module such as a DC to DC converter.

The term "central unit" as used herein refers to a load such as an inverter or an element such as a control circuit attached directly to the load or in the immediate vicinity of the load.

BRIEF SUMMARY

According to an aspect of the present invention there is provided a method for preventing theft of components from a system for generating electrical power. The system includes an inverter connected to a photovoltaic source. A first memory is permanently attached to the photovoltaic source. A microprocessor and a second memory are attached to the inverter. A first code is written in the first memory and a second code is stored in the second memory based on the first code. The second code is preferably either a copy or a hash of the first code. The writing of the first code and/or the storing of the second code is preferably performed during installation of the system. The writing of the first code and/or the storing of the second code is optionally performed by a remote server attached to the system. After the first code is read and stored in the first memory, and the second code is read and stored in the second memory during the electrical power generation, the first code is compared with the second code or its hash. Power conversion and/or inversion is initialized or continued based on the comparison of the first code with the second code. The reading of the first and second codes and the comparison are preferably performed by the microprocessor. Alternatively, a remote server operatively attached to the microprocessor receives the first code and the second code. The remote server stores in remote storage attached to the remote server either copies of the first code and the second code or a hash based on the first code and the second code. Prior to initializing/continuing power conversion operation of the inverter, the remote server receives the first and second codes. The remote server compares the first and second codes to the copies/hash previously stored. If the comparison is correct, (for instance the codes correspond) then power conversion by the inverter is allowed. Optionally, the first code or the second code or portion thereof is generated by a global positioning system module which bases the first code or the second code on the global coordinates of the photovoltaic source or the inverter.

According to another aspect of the present invention there is provided a method for preventing theft of a system for generating electrical power. The system includes an inverter connected to a photovoltaic source. A first memory is permanently attached to the photovoltaic source. A second memory is attached to the inverter. A first code is written in the first memory and a second code is stored in the second memory based on the first code. The second code is preferably either a copy or a hash of the first code. The writing of the first code and/or the storing of the second code is preferably performed during installation of the system. The first code and the second code are compared preferably during or prior to the electrical power generation. The comparison may be performed by a processor either a first processor attached to the photovoltaic source and configured to address the first memory, a second processor attached to the inverter configured to address the second memory and/or a remote server attached to either the first processor or the second processor over a wide area network. Based on the comparison, either the power conversion of the inverter is disabled or the electrical power output of the photovoltaic source to the inverter is disabled. The first code or the second code of respective portions thereof may be based on global coordinates.

According to another aspect of the present invention there is provided a system for generation of electrical power including an inverter connected to a photovoltaic source having a theft prevention and detection feature. A first memory is permanently attached to the photovoltaic source. The first memory is configured to store a first code. A second memory is attached to the inverter. The second memory configured to store a second code. During manufacture or installation of the system, the first code is stored in the first memory attached to the photovoltaic source. The second code based on the first code is stored in the second memory. Prior to operation of the inverter, the first code is compared to the second code and based on the comparison. The generation of the electrical power may be enabled or disabled. The comparison is performed by a processor: a first processor attached to the photovoltaic source addressing the first memory, a second processor attached to the inverter addressing the second memory and/or a remote server attached to selectably either the first processor or the second processor over a wide area network. The system optionally includes a global position module located at the site of the inverter or the site of the panel The first code or the second code is based on global coordinates generated by the global position module.

According to another aspect of the present invention there is provided a theft detection device in a system for generating electrical power, the system including a direct current (DC) power source and a load connectable to the DC power source with a DC power line. The theft prevention device has an alternating current (AC) source operatively attached between the load and the DC power source. The AC source is preferably adapted for superimposing an AC current onto the DC power line. A receiver located in vicinity of the alternating current (AC) source. An impedance probe operatively attached to the DC power line. The impedance probe is adapted for sensing impedance responsive to the AC current. A rectifier may be adapted to rectify the AC current to supply power to the impedance probe. A reactive component a capacitor and/or an inductor may be configured to increase impedance sensed by the impedance probe. The impedance probe may include a voltage probe and a current probe, an energy storage device, a memory adapted to store an impedance datum and/or a transmitter which is adapted to transmit the impedance datum. A potential theft of a component of the system is alerted which is responsive to a change in the impedance greater than a previously determined threshold.

According to the present invention there is provided a method for theft detection in a system for generation of electrical power, the system including a DC power line. An alternating current (AC) is applied to the DC power line from an alternating current (AC) source and an impedance component of the system is sensed. The impedance is responsive to the applied alternating current (AC). An impedance datum proportional to the impedance is stored with the impedance datum transmitted to a receiver. Electrical charge is stored to power the sensing when the system is not generating electrical power. The sensing includes measuring voltage and current of the alternating current (AC) source. A potential theft of a component of the system is alerted which is responsive to a change in the impedance greater than a previously determined threshold or upon not receiving an expected transmission of the impedance datum.

According to another aspect of the present invention there is provided a theft detection device in a system for generating electrical power. The system includes a direct current (DC) power source with DC outputs. The DC outputs are connectable to a load with a DC power line. The theft prevention device has an impedance probe connectable to the DC outputs and the DC power line. The impedance probe includes a transmitter configured to transmit a probe signal. A receiver module is operatively attached to the direct current (DC) power source and said load. The receiver module includes a receiver configured to receive the probe signal. The probe signal may include data encoded using power line communications. A module is operatively attached to the direct current (DC) power source and the load. The module includes a receiver configured to receive the probe signal and/or the data. The impedance probe may include a voltage probe and a current probe, energy storage device and/or memory adapted to store an impedance datum.

According to another aspect of the present invention there is provided a method for theft detection in a system for generation of electrical power. The system includes a direct current (DC) power source. An impedance of the DC power source is measured from which an impedance datum is stored which is proportional to the impedance. The impedance datum is transmitted and received. The impedance datum is compared with a previously stored datum and a potential theft of DC power source responsive to the comparison is alerted. The measured impedance may include measured voltage and current of the DC power source. Electrical energy may be stored for supplying power for the measuring of impedance and for supplying power for the receiving of impedance datum. According to another aspect of the present invention there is provided a theft detection device in a distributed electrical power generation system including a direct current (DC) power source connected to an electronic module with DC outputs. The DC outputs are connectable to a load with a DC power line. A central impedance probe is connectable to the DC power line. The central impedance probe includes a impedance sensing module adapted for sensing impedance of the DC power source. An electronic module may include a bypass switch adapted to present impedance of said photovoltaic panel to said central impedance probe.

According to another aspect of the present invention there is provided a theft detection method of theft protection in a distributed electrical power generation system including a direct current (DC) power source with DC outputs. The DC outputs are connectable to a load with a DC power line. A central impedance unit is connected to the DC power line. A probe signal is transmitted on the DC power line and impedance is sensed responsive to said probe signal. The sensed impedance is compared to a previously stored impedance value of the direct current (DC) power source, and an alert may be performed based on the comparison of impedance values. The probe signal may be an AC power feed, a power line communication signal or a dedicated signal for the impedance measurement. The electronic module may be bypassed to present impedance of the power source, e.g. photovoltaic panel, to the central impedance probe.

According to another aspect of the present invention there is provided a theft detection device in a photovoltaic system for generating electrical power. The theft detection device has an electronic module attached to a photovoltaic source. An image sensor is preferably adapted for capturing images of the photovoltaic source. A central controller is adapted to provide a signal to the electronic module. A thermal property of the photovoltaic source changes which is responsive to the signal. A load is preferably connected to the electronic module and the load is typically an inverter. The image sensor is a thermal image sensor. The electronic module may include a receiver, direct current (DC) to DC converter or a DC to alternating current (AC) converter.

According to another aspect of the present invention there is provided a method for theft detection in a system for generation electrical power, the system including an electronic module attached to a photovoltaic source. The electronic module is signaled whereupon after receiving the signaling, the photovoltaic source is reverse biased, thereby causing increased heat dissipation in the photovoltaic source. Image frames are captured of the photovoltaic source and the image frames are analyzed for thermal changes responsive to the signaling. The presence of the photovoltaic source is ascertained based on the analyzing of the image frames and potential theft is alerted of the photovoltaic source based on the ascertaining. The signaling typically causes the electronic module to reverse bias the photovoltaic source.

According to another aspect of the present invention there is provided a theft detection device in a system for generating electrical power, the system including an inverter connected to a photovoltaic source, the theft detection device has a transmitter attached to the photovoltaic source. The transmitter adapted for transmitting a signal and a receiver is adapted for receiving the signal. The transmitter may be adapted to store electrical charge.

According to another aspect of the present invention there is provided a method for theft detection in a system for generation electrical power, the system including an inverter connected to and receiving power from a photovoltaic source, a transmitter operatively attached to the photovoltaic source and a receiver. A signal is transmitted from the transmitter. The signal is monitored and upon an absence of the signal being sensed a potential theft of the photovoltaic source is alerted or alarmed.

According to another aspect of the present invention there is provided a theft detection device in a system for generating electrical power, the system including an inverter connected to a photovoltaic source. The theft prevention device has a transmitter attached to the photovoltaic source and the transmitter is adapted for transmitting a signal. A receiver attached to the photovoltaic source is adapted for receiving the signal and a controller is operatively attached to the receiver and the transmitter.

According to another aspect of the present invention there is provided a method for theft detection in a system for generating electrical power, the system including an inverter connected to a photovoltaic source, a transmitter and receiver attached to the photovoltaic source. The signal strength of the transmitter is measured using the receiver and an object in vicinity of the photovoltaic source is detected by virtue of change in the measuring. A potential theft of the photovoltaic source is alerted based on the detecting;

According to another aspect of the present invention there is provided a theft detection device in a system for generating electrical power, the system including an inverter connected to a photovoltaic source, the theft detection device has a sensor measuring electric field strength of the photovoltaic source and a controller operatively attached to the sensor.

According to another aspect of the present invention there is provided a method for theft detection in a system for generating electrical power, the system including an inverter connected to a photovoltaic source, a sensor operatively attached to the photovoltaic source and a controller operatively attached to the sensor. The electric field of the photovoltaic source is measured using the sensor. The measuring is adapted to indicate a change in threshold of the electric field. An object in vicinity of the photovoltaic source is detected by virtue of change in threshold of the electric field. Potential theft of the photovoltaic source is alerted using the controller.

According to another aspect of the present invention there is provided a theft detection device in a system for generating electrical power, the system including a photovoltaic string and a load connectable to the photovoltaic string with a DC power line, the theft prevention device has a central control unit operatively attached between the load and the photovoltaic string. The central control unit is adapted for superimposing a control signal and a test signal onto the DC power line. A switch unit operatively attached to the photovoltaic string. The switch unit is adapted for receiving the control signal and the test signal.

According to another aspect of the present invention there is provided a method for theft detection in a system for generation electrical power, the system including a photovoltaic source and a load connectable to the photovoltaic source with a DC power line, a central control unit operatively attached between the load and the photovoltaic source and a switch unit with a resonant circuit, the switch unit operatively attached to the photovoltaic source. A first control signal from the central control unit is superimposed onto the DC line. The resonant circuit is connected to the photovoltaic source. The resonant circuit is responsive to the control signal. A second control signal from the central control unit is superimposed onto the DC line. A reflected signal responsive to the second superimposing is sensed. The test signal is a time domain reflectometry (TDR) signal or a frequency domain reflectometry (FDR) signal. The sensing may be in terms of sensing phase shift of the reflected signal, sensing frequency shift of the reflected signal and/or sensing amplitude change of the reflected signal.

According to another aspect of the present invention there is provided a theft detection device in a system for generating electrical power. The device includes multiple electronic modules attached to multiple photovoltaic sources. At least one of the electronic modules is adapted for constructing a confirmation signal. A central control unit is operatively attached to at least one of the electronic modules. The central control unit is adapted for sending a signal to the at least one electronic module and for receiving the confirmation signal. The confirmation signal typically includes information that the at least one electronic module collects from other electronic modules in the immediate vicinity of the at least one electronic module. The central control unit may alert of potential theft based on the confirmation signal.

According to another aspect of the present invention there is provided a method of theft detection in a system for generation electrical power. The system includes multiple photovoltaic sources, and multiple electronic modules attached to the photovoltaic sources and a central control unit. The central control unit is operatively attached to the electronic modules. A signal is sent from the central control unit to at least one of the electronic modules. The at least one electronic module is adapted for constructing a confirmation signal which is sent to the central controller in response. The constructed confirmation signal typically includes information that the at least one electronic module collects from other electronic modules in the immediate vicinity of the at least one electronic module. The confirmation signal is based on or includes data collected from the electronic modules connected in a mesh network. The data is received at the central control unit. The confirmation signal may be decoded and the decoded data are compared with a look up table stored at the central control unit. Potential theft of one of the photovoltaic sources may be alerted by the central control unit.

The foregoing and/or other aspects will become apparent from the following detailed description when considered in conjunction with the accompanying drawing figures.

BRIEF DESCRIPTION OF THE DRAWINGS

The invention is herein described, by way of example only, with reference to the accompanying drawings, wherein:

FIG. 1b illustrates in more detail a communications module and a memory of the power generation system of FIG. 1a;

FIGS. 1l and 1m illustrate a process flow of a method for theft prevention of the electrical power generation system of FIG. 1k;

FIG. 5b shows a typical cross section of photovoltaic panel according to an embodiment of the present invention;

FIG. 5c shows a plan view photovoltaic panel according to an embodiment of the present invention;

FIG. 5d shows an equivalent capacitor representing a photovoltaic panel according to an embodiment of the present invention;

DETAILED DESCRIPTION

Figure 1A:
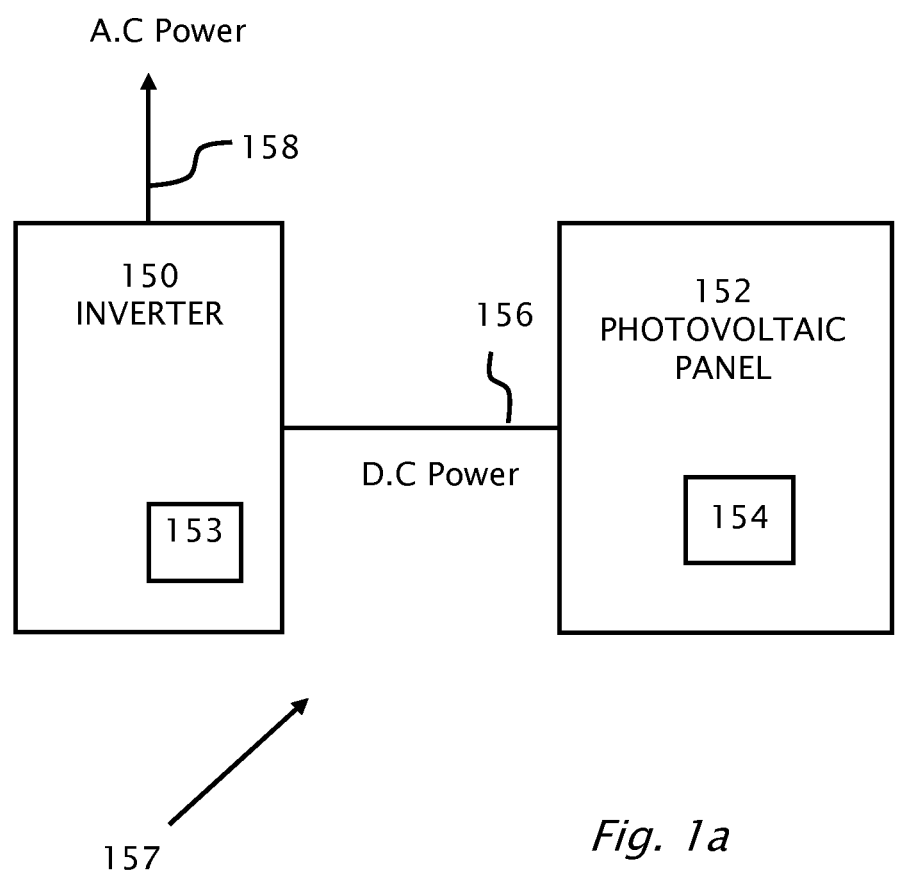
FIG. 1a illustrates an electrical power generation system including a theft prevention feature according to an embodiment of the present invention.

Reference will now be made in detail to embodiments of the present invention, examples of which are illustrated in the accompanying drawings, wherein like reference numerals refer to the like elements throughout. The embodiments are described below to explain the present invention by referring to the figures.

Code Storage

Referring now to the drawings, FIG. 1a illustrates an electrical power generation system 157 including a theft prevention feature according to an embodiment of the present invention. System 157 includes one or more photovoltaic panels 152 connected to an inverter 150 by a direct current (DC) power cable 156. During operation of electrical power generation system 157, DC power is produced by photovoltaic panel 152 and transferred to the input of inverter 150 via DC cable 156. Inverter 150 converts the DC power at its input to AC power at inverter 150 output 158. A memory module 154 is permanently attached to photovoltaic panel 152. A communication module 153 is attached to inverter 150. The term "permanently attached" as used herein refers to a method or device for attachment such that physical removal or attempt thereof, e.g. of memory module 154 from photovoltaic panel 152, would likely result in damage, e.g. to module 154 and/or panel 152. Typically, during manufacture of the photovoltaic (PV) panel 152 and/or inverter 150, modules 154, 153 are "permanently attached" respectively to photovoltaic panel 152 and/or inverter 150. For example, when module 154 is permanently attached to the photovoltaic panel 152, the operation of photovoltaic panel 152 ceases or connections thereof are broken on attempting to remove module 154 from photovoltaic panel 152. Any mechanism known in the art for "permanently attaching" may be applied in different embodiments of the present invention. One such mechanism for permanently attaching uses a thermoset adhesive, e.g. epoxy based resin, and hardener.

Figure 1B:
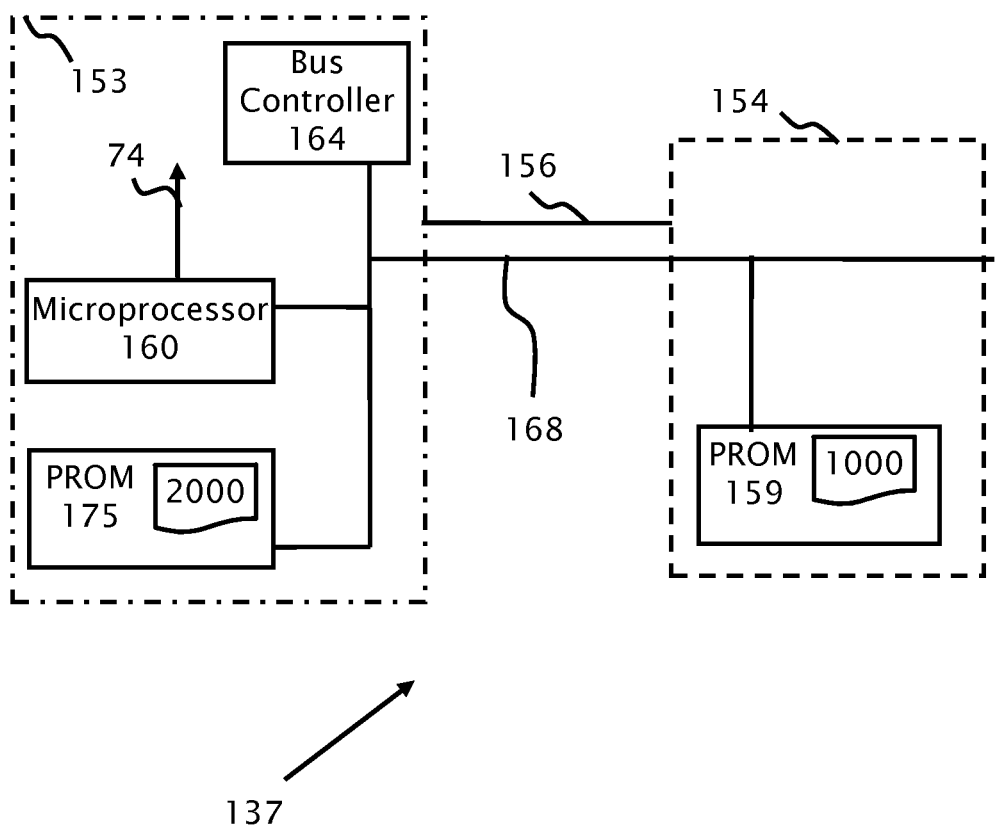

Reference is now also made to FIG. 1b, which illustrates in more detail 137 communications module 153 and memory module 154 of system 157. A communications cable 168 connects memory module 154 to communications module 153. Power cable 156 which transfers DC power from photovoltaic panel 152 to the input of inverter 150, is optionally a multi-core cable 156/168. At least two wires of the multi-core cable 156/168 preferably are used for communication cable 168. If a long distance, separates inverter 150 from photovoltaic panel 154 communication cable 168 is preferably a twisted pair cable. Alternatively, communications are superimposed on DC power line 156, i.e. power line communications. Alternatively, radio frequency wireless communication may be used either centrally from inverter to power sources or a mesh network may be used. Communication module 153 attached to inverter 150 preferably includes a bus controller 164 (e.g. Cyclone™ 1C3, $i^2c$ bus controller, Altera, 101 San Jose, Calif. 95134) which controls communications over cable 168. Bus controller 164 is preferably connected to a microprocessor 160. A memory 175, is preferably connected to both bus controller 164 and microprocessor 160. Microprocessor 160 preferably outputs a signal 174, which is used to allow/disallow the operation of inverter 150 for converting DC power to AC power. Memory module 154 which is permanently attached to photovoltaic panel 152 includes a memory 159. Memory 159 is connected to bus controller 164 in communication module 153 by communication cable 168. Memory 159 stores a code 1000. Memory 175 stores a code 2000.

Figure 1C:
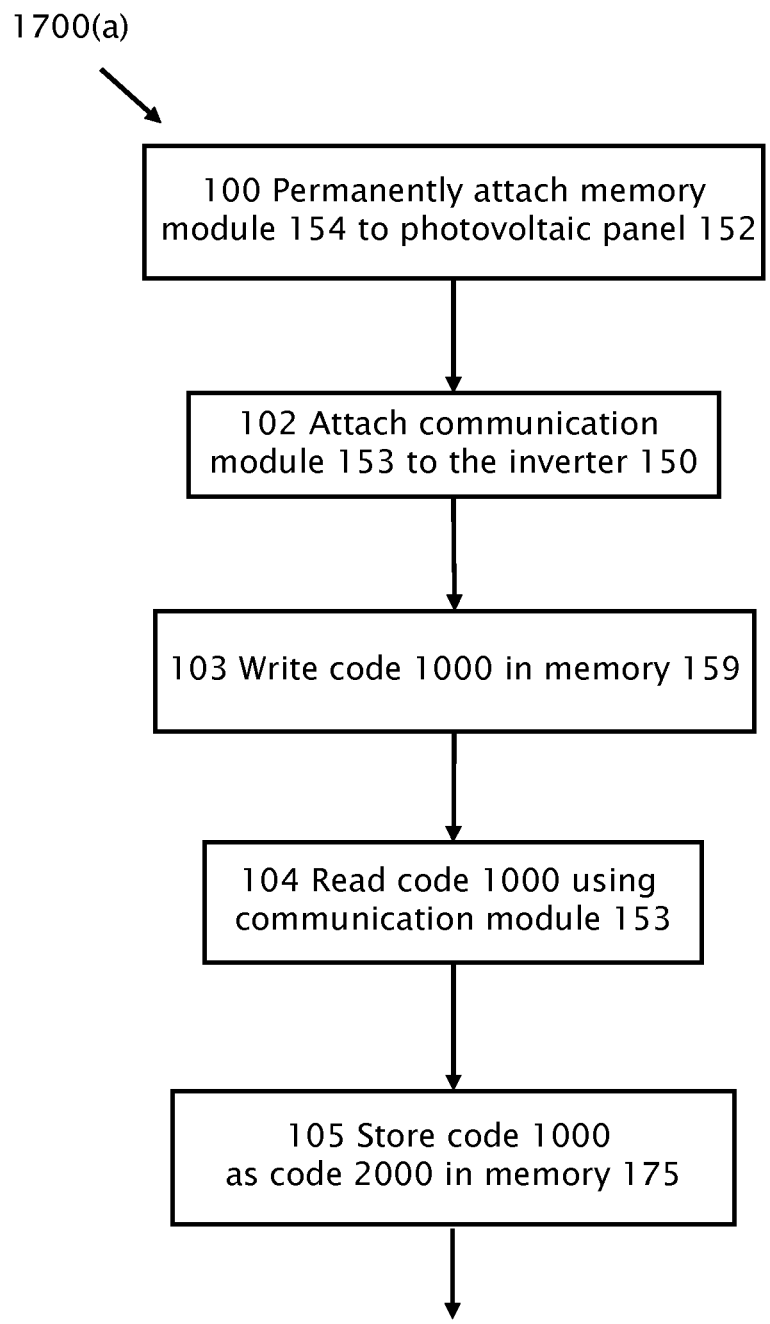
FIGS. 1c and 1d illustrate a process flow of a method for theft prevention, according to embodiments of the present invention.
Figure 1D:
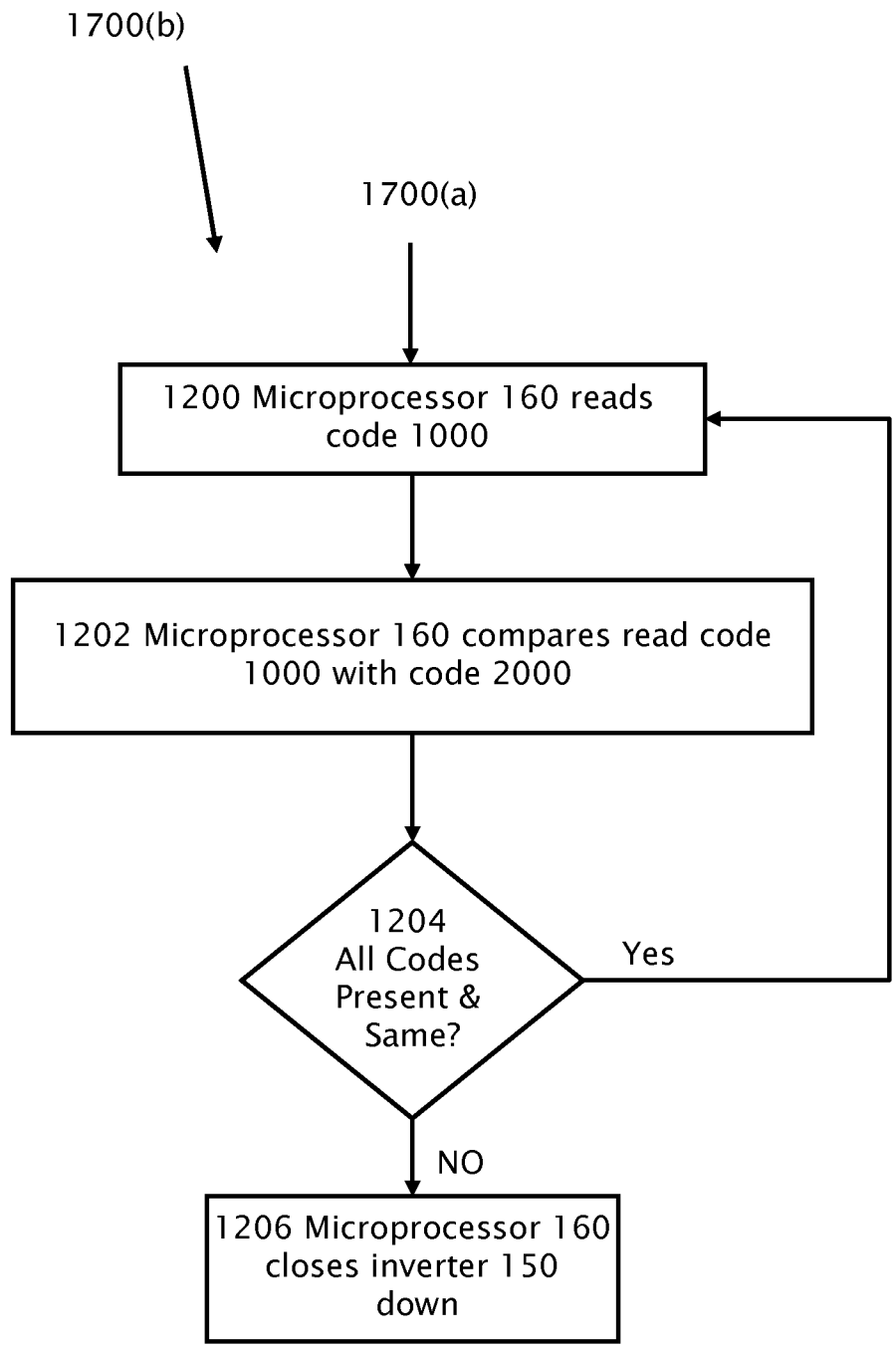

Reference is now also made to FIGS. 1c and 1d which show a process flow of a method 1700 for theft prevention which illustrates pairing in electrical power generation system 157, according to an embodiment of the present invention. Typically, during manufacture, memory module 154 is permanently attached (step 100) to photovoltaic panel 152. In step 102, communication module 153 is attached to inverter 150. Although steps 100 and 102 are typically performed during manufacture/assembly of photovoltaic panel 152 and/or inverter 150, steps 100 and 102 may be performed as a retrofit or during installation. In step 103, code 1000 is written in memory 159 during manufacture of photovoltaic panel 152 or during installation of photovoltaic panel 152. Communication module 153 reads (step 104) code 1000 using bus controller 164 and microprocessor 160. Microprocessor 160 stores (step 105) a copy or hash of code 1000 read in step 104 into code 2000 in memory 175. Although, method steps 103, 104 and 105 are typically performed during installation of photovoltaic panel 152 and inverter 150, steps 103, 104 and 105 may be performed during manufacture/assembly of photovoltaic panel 152 and/or of inverter 150. Method 1700 continues in FIG. 1d as sub-process 1700(b) performed typical during power generation operation of system 157. Microprocessor 160 reads (step 1200) code 1000 in memory module 154. In step 1202, microprocessor 160 compares code 1000 with code 2000 previously stored in communication module 153 and memory module 175. In decision box, 1204 if codes 1000 and 2000 are the same or otherwise correctly compare then output 174 is set by microprocessor 160 to allow the power conversion of DC to AC of inverter 150 and anti-theft process 1700 continues at step 1200. Otherwise power conversion DC/AC of inverter 150 is disabled (step 1206) by microprocessor 160 using output 174.

Figure 1E:
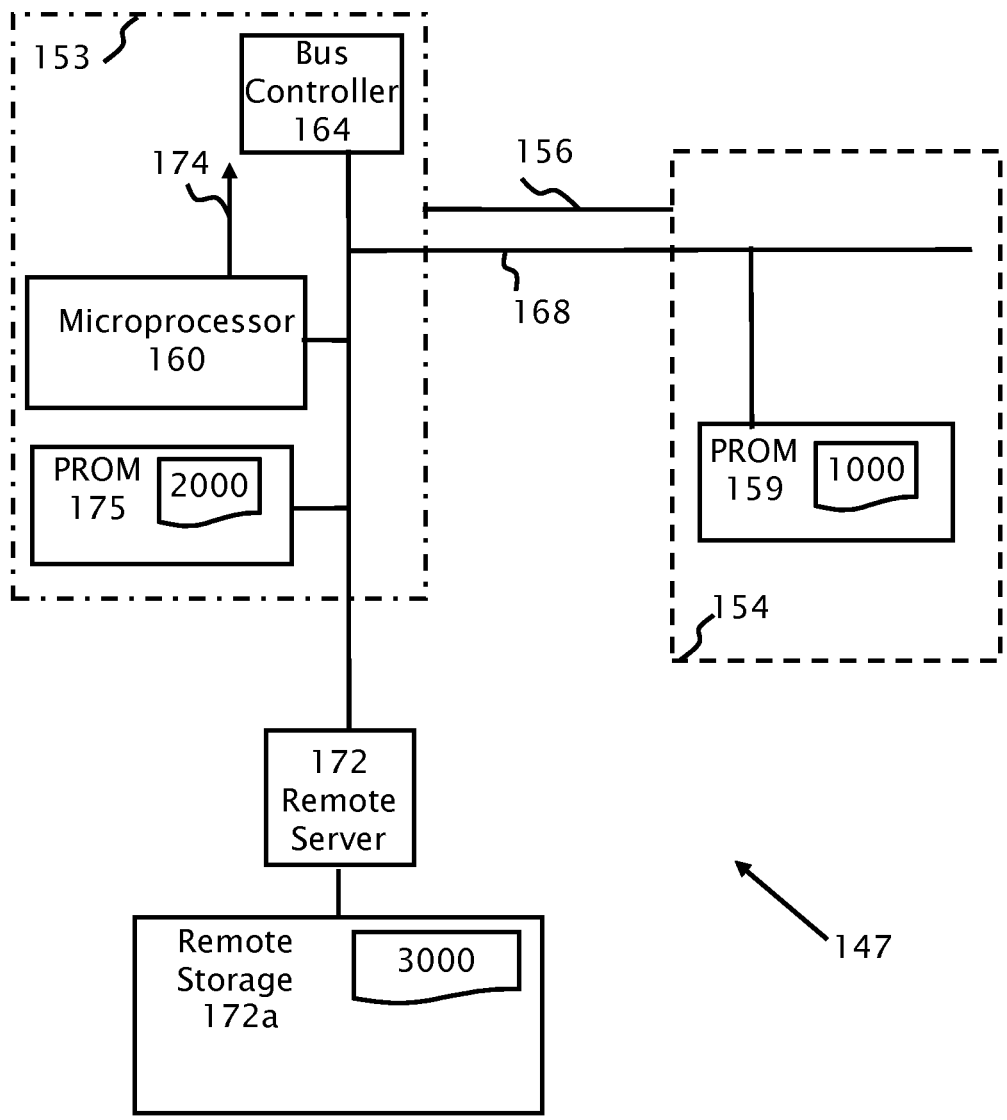
FIG. 1e illustrates an electrical power generation system with a theft prevention feature, according to another embodiment of the present invention.

Reference is made to FIG. 1e which illustrates another embodiment of the present invention, photovoltaic system 147 with a theft prevention feature. Memory module 154 is permanently attached to photovoltaic panel 152 (not shown in FIG. 1e). Memory module 154 includes memory 159 for storing code 1000. Memory 159 is connected to bus controller 164 in communication module 153 by communication cable 168. Communication module 153 is attached to inverter 150 (not shown in FIG. 1e). Bus controller 164 is connected to microprocessor 160 and memory 175 for storing code 2000. A remote server 172 is connected to microprocessor 160 by bus 168 or by a dedicated WAN interface (not shown). Remote server 172 is connected to a remote storage 172a. Remote storage 172a preferably stores copies or hashes of codes 1000 and 2000. Microprocessor 160 has output signal 174, which is activated by remote server 172 to allow the operation of inverter 150 to convert DC Power to AC power.

Figure 1F:
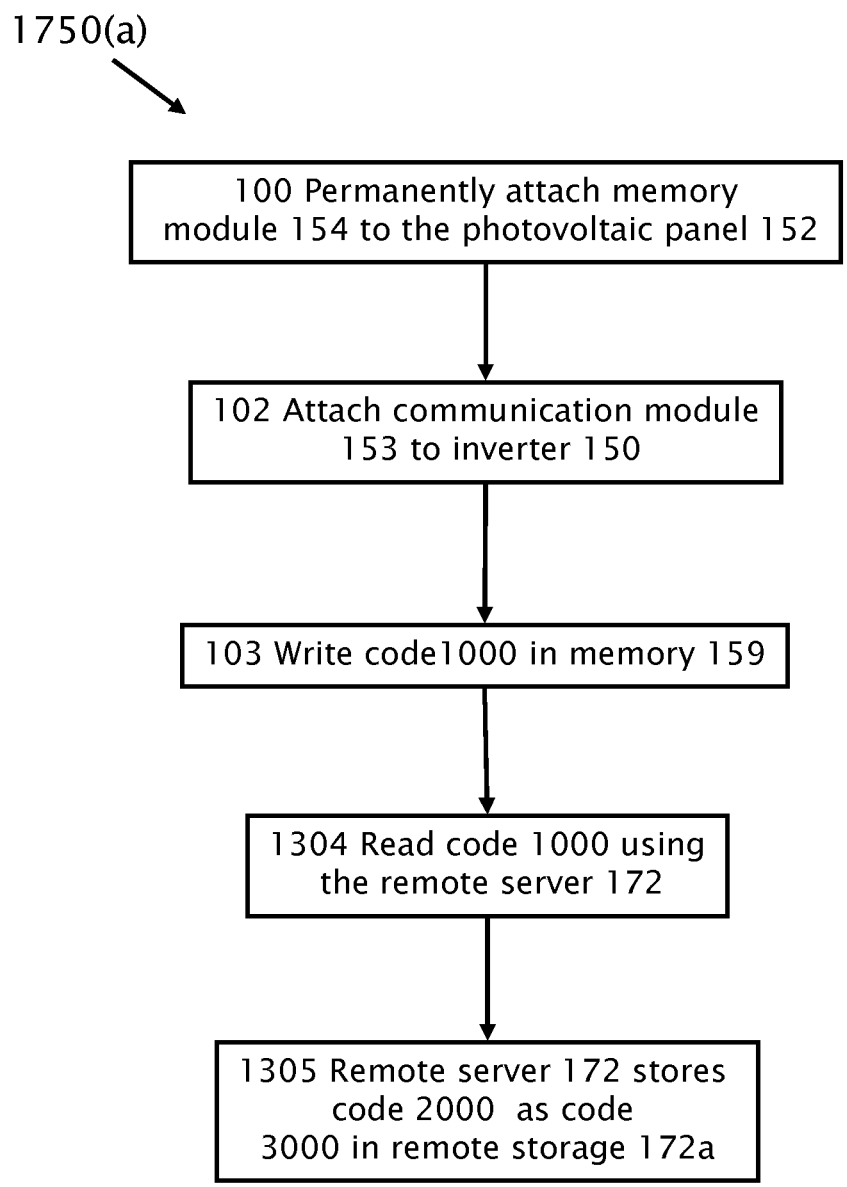
FIGS. 1f and 1g illustrate a process flow of a method for theft prevention of in the system of FIG. 1e.
Figure 1G:
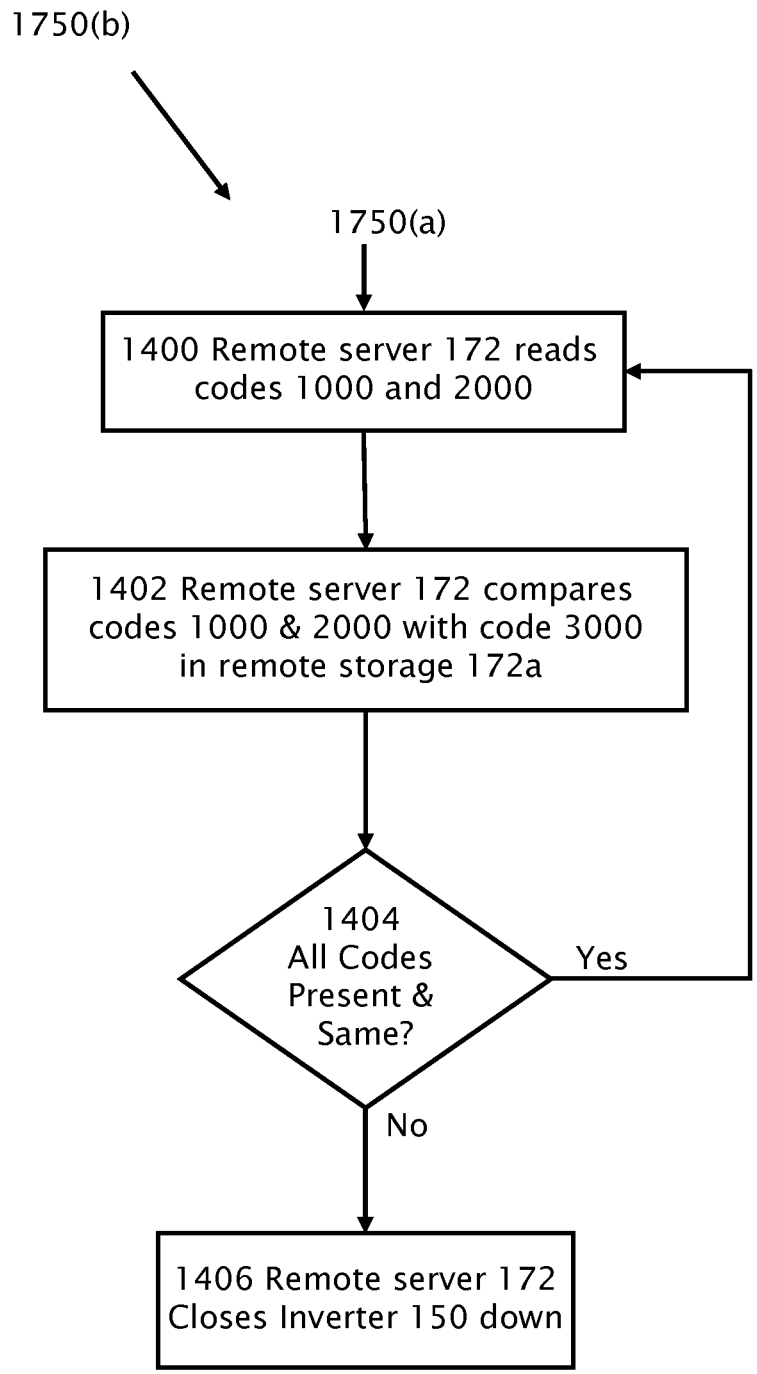

Reference is now also made to FIGS. 1f and 1g which illustrate process flow of a method 7150 for theft prevention of electrical power generation system 147 (of FIG. 1e) according to an embodiment of the present invention using. In step 100, memory module 154 is permanently attached to photovoltaic panel 152. In step 102 communication module 153 is attached to inverter 150. In step 103, code 1000 is written in memory 159 during manufacture of photovoltaic panel 152 or during installation of photovoltaic panel 152. Remote server 172 reads (step 1304) code 1000 preferably using bus controller 164. Remote server 172 stores (step 1305) copies or hashes of code 1000 and code 2000 as code 3000 at remote storage 172a. Method steps 103, 1304 and 1305 are typically performed during installation of photovoltaic panel 152 and inverter 150. Method 7150 continues in FIG. 1g as sub-process 7150(b) during which steps 1400, 1402, 1404 and 1406 are performed during the power generation operation of system 147. To protect against theft during operation, remote server 172 reads codes 1000 and 2000 (step 1400). In step 1402, remote server 172 compares the code reads in step 1400 with code 3000 in remote storage 172a. In step 1404 if codes (1000, 2000) and 3000 are the same or when code 3000 is a hash of codes 1000 and 2000, and code 3000 compares correctly with codes 1000 and 2000, then output 174 of microprocessor 160 activated via remote server 172, allows the power conversion of DC to AC of inverter 150 and operation continues at step 1400. Otherwise, remote server 172 does not allow inverter 150 to convert DC power to AC power (step 1406).

Figure 1H:
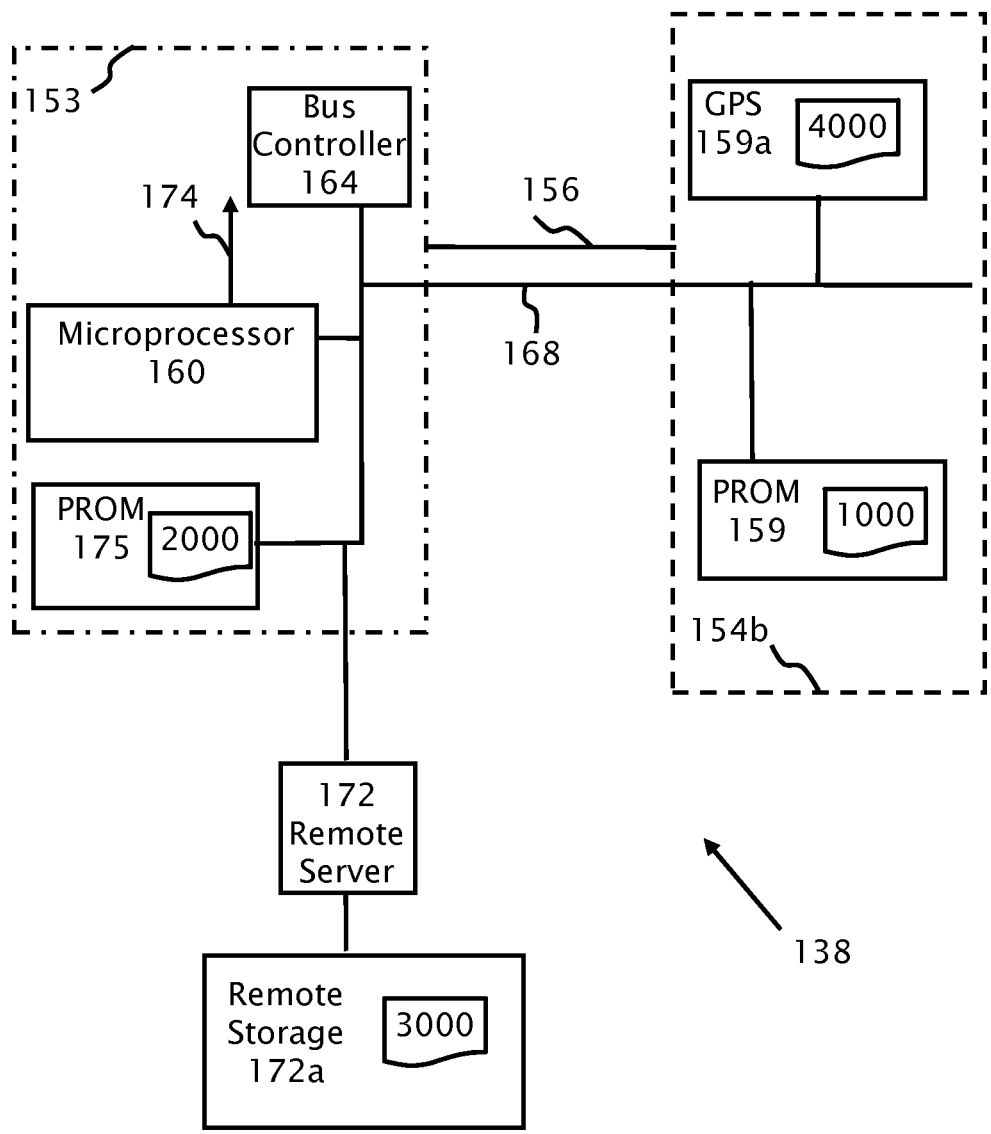
FIG. 1h illustrates an electrical power generation system, according to yet another embodiment of the present invention.

Reference is made to FIG. 1h of a system 138, according to another embodiment of the present invention for theft prevention of photovoltaic system 157. Communication module 153 is attached to inverter 150 (not shown) and contains bus controller 164 connected to a microprocessor 160 and memory 175 having a code 2000. Connected to bus controller 164 is remote server 172. Remote server 172 is connected to remote storage 172a. Microprocessor 160 has output signal 174, which is activated by remote server 172 to allow the operation of inverter 150 to convert DC Power to AC power. Memory module 154b permanently attached to photovoltaic panel 154b includes memory 159 (e.g. EPROM, EEPROM or FLASH), having a code 1000 and a Global Position System (GPS) module 159a having a code 4000. Code 4000 is based on global coordinates of photovoltaic panel 152 during installation of panel 152. Memory 159 and GPS module 159a are preferably connected to microprocessor 160 by bus controller 164 in communication module 153 by communication cable 168.

Figure 1I:
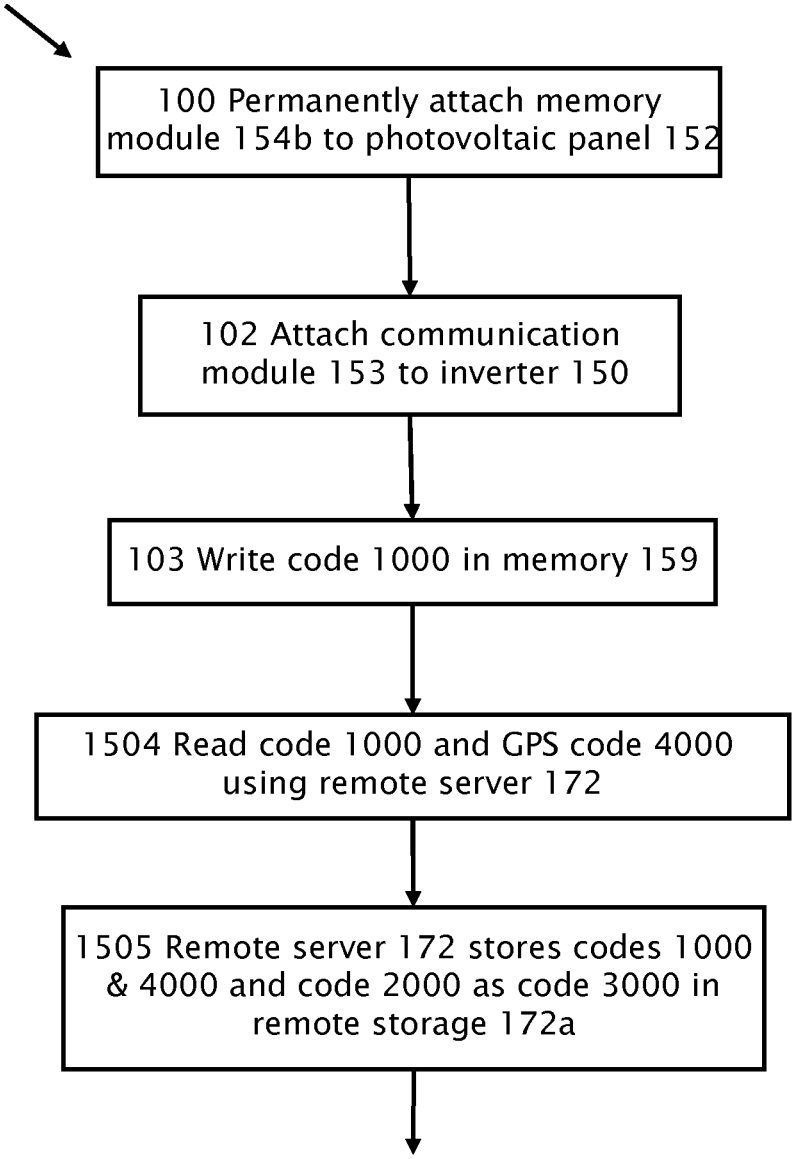
FIGS. 1i and 1j illustrate a process flow of a method for theft prevention of the electrical power generation system of FIG. 1h.
Figure 1J:
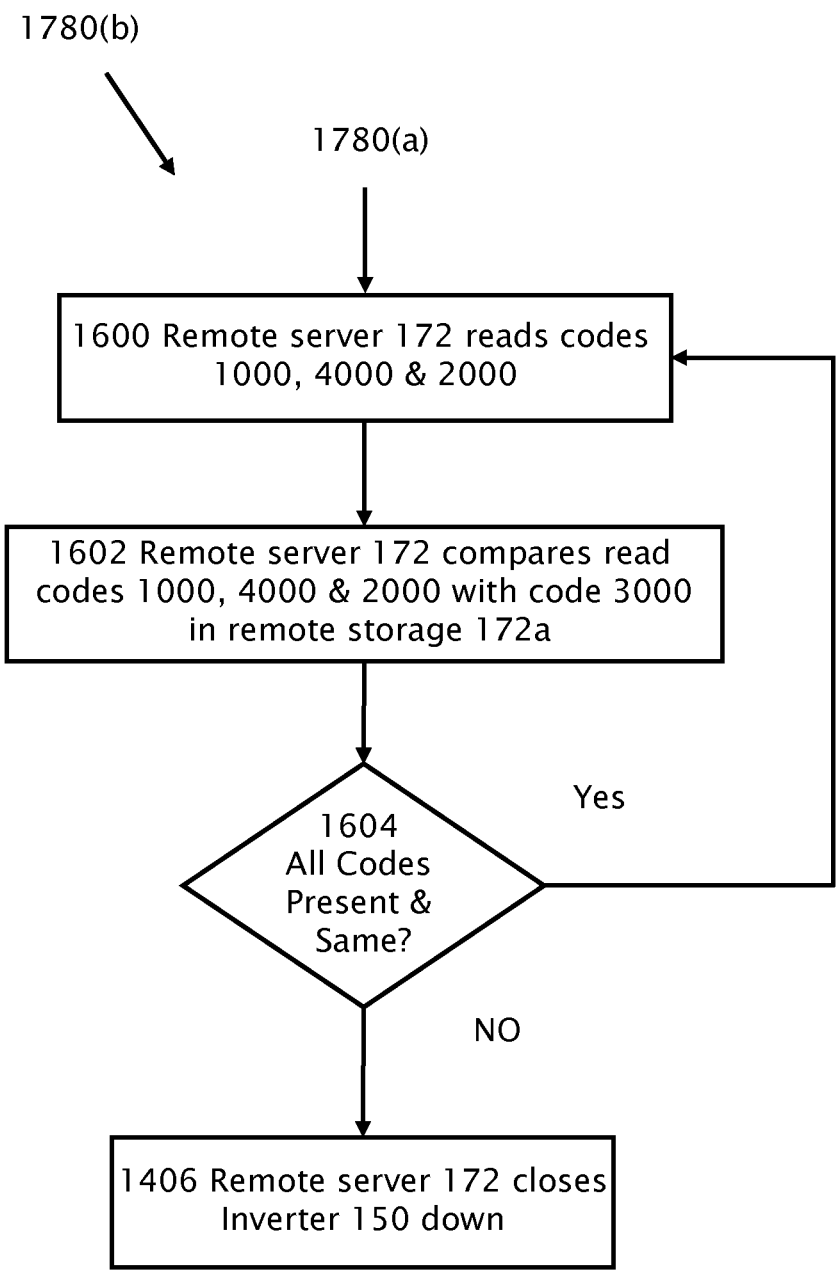

Reference is now also made to FIGS. 1*i* and 1*j* which illustrate a process flow of a method 1780 for theft prevention of electrical power generation system 138 (FIG. 1*h*) according to an embodiment of the present invention. In step 100, typically performed during manufacture of electrical power generation system 138, memory module 154*b* is permanently attached to photovoltaic panel 152. In step 102, communication module 153 is attached to inverter 150. In step 103, code 1000 is written in memory 159 during manufacture of photovoltaic panel 152 or at installation of photovoltaic panel 152. Remote server 172 reads (step 1504) code 1000 and code 4000 of GPS module 159*a* using bus controller 164. Remote server 172 stores a copy/hash of codes 1000 and 4000 read in step 1504 into code 2000 in memory 175 and in code 3000 of remote storage 172*a* (step 1505). Method steps 103, 1504 and 1505 are typically performed during installation of photovoltaic panel 152 and inverter 150. Method 1780 continues in FIG. 1*j* as sub-process 1780(*b*) performed during power conversion operation of system 138. To protect against theft, remote server 172 reads (step 1600) codes 1000, 2000 and 4000. In step 1602, remote server 172 compares codes (1000, 2000 and 4000) read in step 1600 with code 3000 in remote storage 172*a*. At step 1604, if codes (1000, 2000, 4000) and 3000 are the same or otherwise compare correctly, output 174 of microprocessor 160 via remote server 172, allows the power conversion of DC to AC of inverter 150 and operation continues at step 1600. Otherwise remote server 172 does not allow inverter 150 to convert DC power to AC power (step 1406).

Figure 1K:
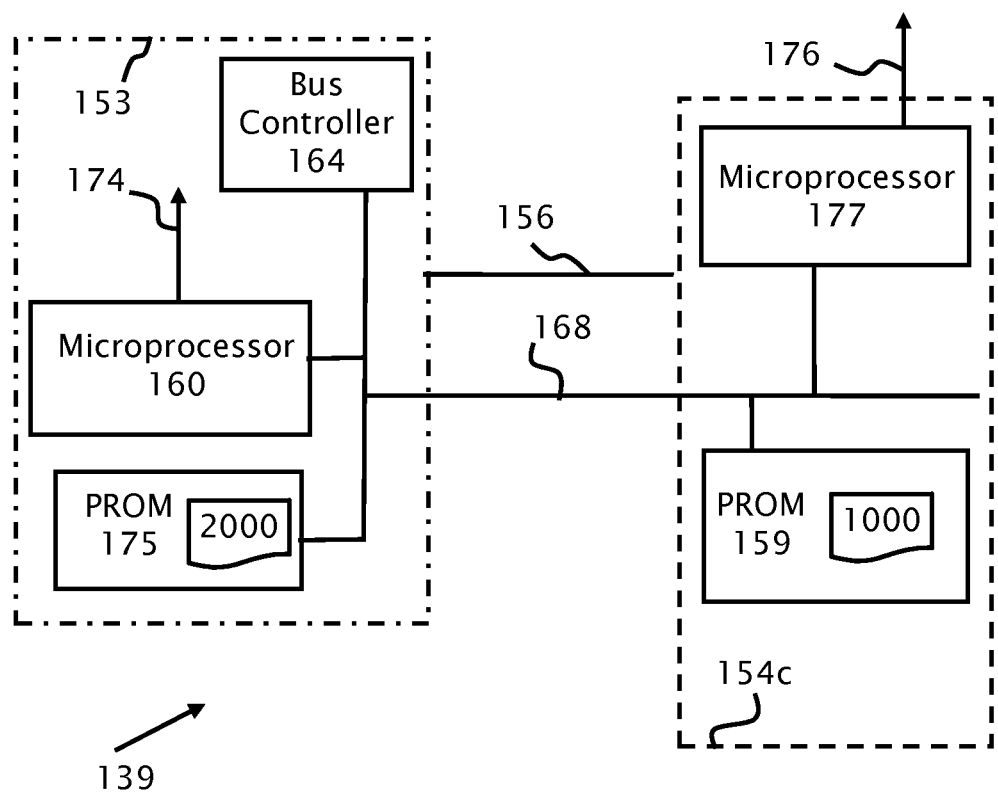
FIG. 1k illustrates an electrical power generation system with a theft prevention feature, according to still another embodiment of the present invention.
Figure 1I:
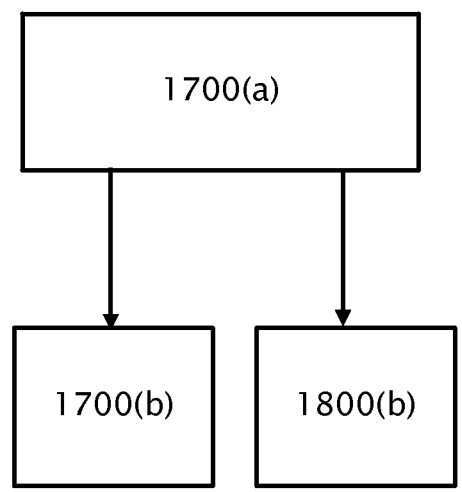

Reference is made to FIG. 1*k* of photovoltaic system 139, another embodiment of the present invention for theft prevention. Communication module 153 attached to inverter 150 contains a bus controller 164 connected to microprocessor 160 and memory 175, having code 2000. Microprocessor 160 has an output signal 174, which is used to allow the operation of inverter 150 to convert DC Power to AC power. Memory module 154*c* permanently attached to photovoltaic panel 152 contains memory 159, having a code 1000 and microprocessor 177 with output 176. Memory 159 and microprocessor 177 are connected to bus controller 164 in communication module 153 by communication cable 168.

Reference is now made to FIG. 1*l* which illustrates sub-processes 1700(*b*) and 1800(*b*) being performed in parallel during power conversion operation after manufacturing/installation is performed according to sub-process 1700(*a*). Sub-processes 1700(*b*) and 1800(*b*) work together in parallel and at the same time to achieve theft detection and prevention of electrical power generation system 139, according to an embodiment of the present invention. Sub-process 1700(*b*) illustrates the use of microprocessor 160 for theft detection and prevention of electrical power generation system 139. Sub-process 1800(*b*) illustrates the use of microprocessor 177 for theft detection and prevention of electrical power generation system 139.

Figure 1M:
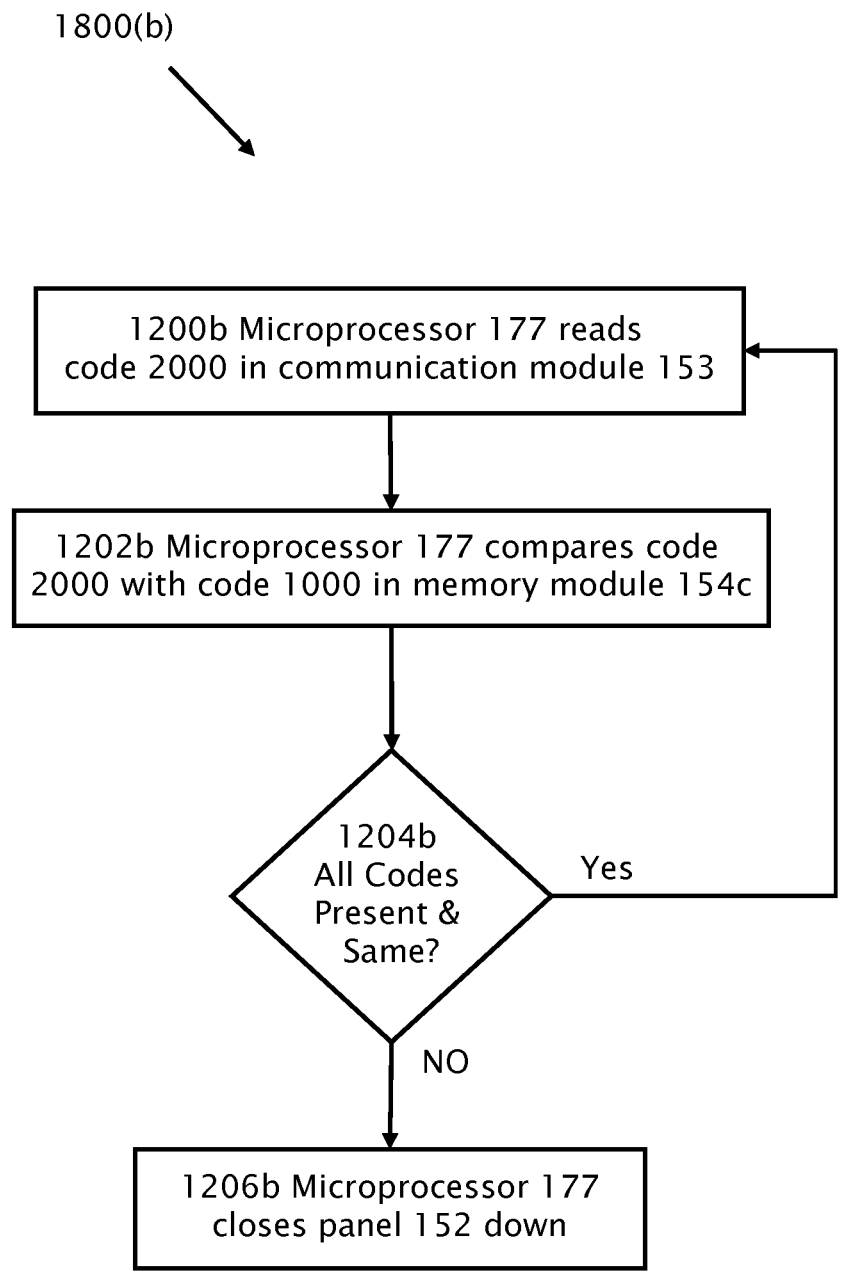

Referring to FIG. 1*m*, sub-process 1800(*b*) in step 1200*b* microprocessor 177 reads code 2000 in communication module 153 by signaling over communications bus 168. In step 1202*b*, microprocessor 177 compares code 2000 with code 1000. If in decision box 1204*b*, codes 1000 and 2000 are not the same, output 176 of microprocessor 177 is used to shut down photovoltaic panel 152 (step 1206*b*). Photovoltaic panel 152 may be shut down by several mechanisms, by simple bypass using a bypass diode in parallel with photovoltaic panel 152 or by turning off a DC/DC conversion circuit if present in module 154.

A supervisory mechanism is typically provided to remove the pairing in order to perform re-pairing using different inverters 150 and modules 154.

Impedance Measurement

Figure 2A:
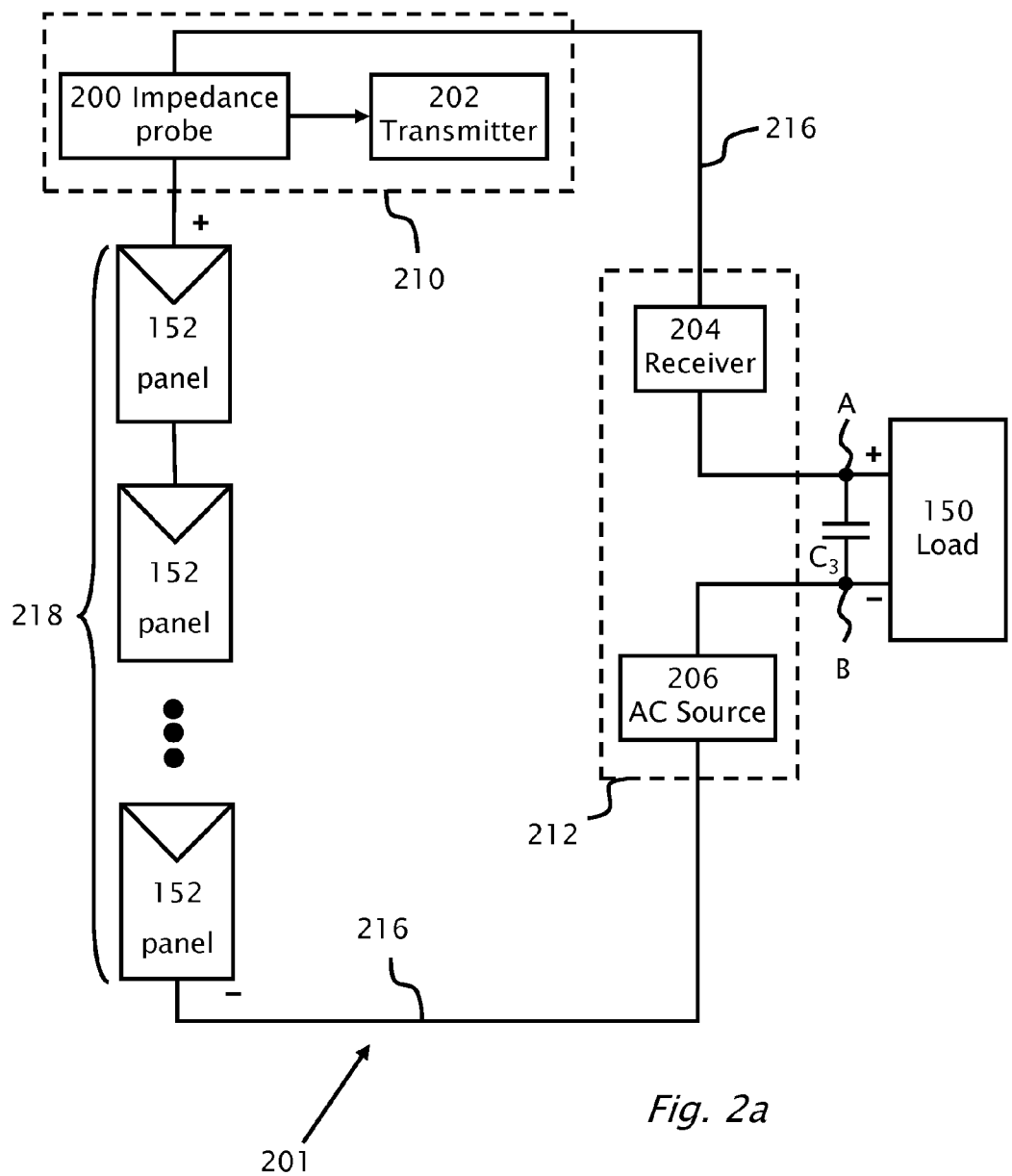
FIG. 2a shows a power generation system including a theft prevention feature according to an embodiment of the present invention.

Reference is now made to FIG. 2*a* which shows a power generation system 201 including a theft prevention feature according to an embodiment of the present invention. Power generation system 201 has at least one string 218 of photovoltaic panels 152, an impedance unit 210, a unit 212, capacitor $C_3$, DC power line 216 and load 150. Load 150 is preferably an inverter. Impedance unit 210 has an impedance probe 200 which is connected serially via direct current (DC) line 216 between the positive output of string 218 and unit 212. When more than one string 218 is present each string 218 typically includes its own impedance probe 200. Unit 210 maybe optionally incorporated in load 150. Impedance unit 210 senses impedance of panels 152 with an output connected to a transmitter 202. During daytime operation, impedance unit 210 may be powered by the current in string 218 or by attaching the probe to a single photovoltaic panel and receiving power from the photovoltaic panel in parallel with the string. Impedance unit 210 and/or unit 212 may have a charge storage element such as a battery or capacitor for nighttime operation with the charge storage element being charged during daytime operation. Transmitter 202 periodically transmits a signal proportional to the measured impedance by impedance probe 200. Unit 212 has receiver 204 and an alternating current (AC) source module 206. Unit 212 is connected serially between unit 210 and negative output of string 218. Unit 210 may be incorporated in a panel 152 or in an electronic module 302 (not shown) which is operatively attached/permanently attached to a photovoltaic panel 152. Load 150 has a DC input which is serially connected between receiver 204 and alternating current source module 206 at nodes A and B respectively. Current source module 206 is optional and may be not needed if unit 210 includes a charge storage. A capacitor $C_3$ connects between nodes A and B. Receiver 204 is serially connected between the positive output of string 218 and node A. Alternating current source module 206 is serially connected between node B and the negative output of string 218. AC source module 206 is connected to string of panels 152 and superimposes an AC signal on DC power lines 216. Impedance probe 200 attached to the string of panels 152 measures impedance preferably by independently measuring AC current and AC voltage along the string of panels.

Figure 2B:
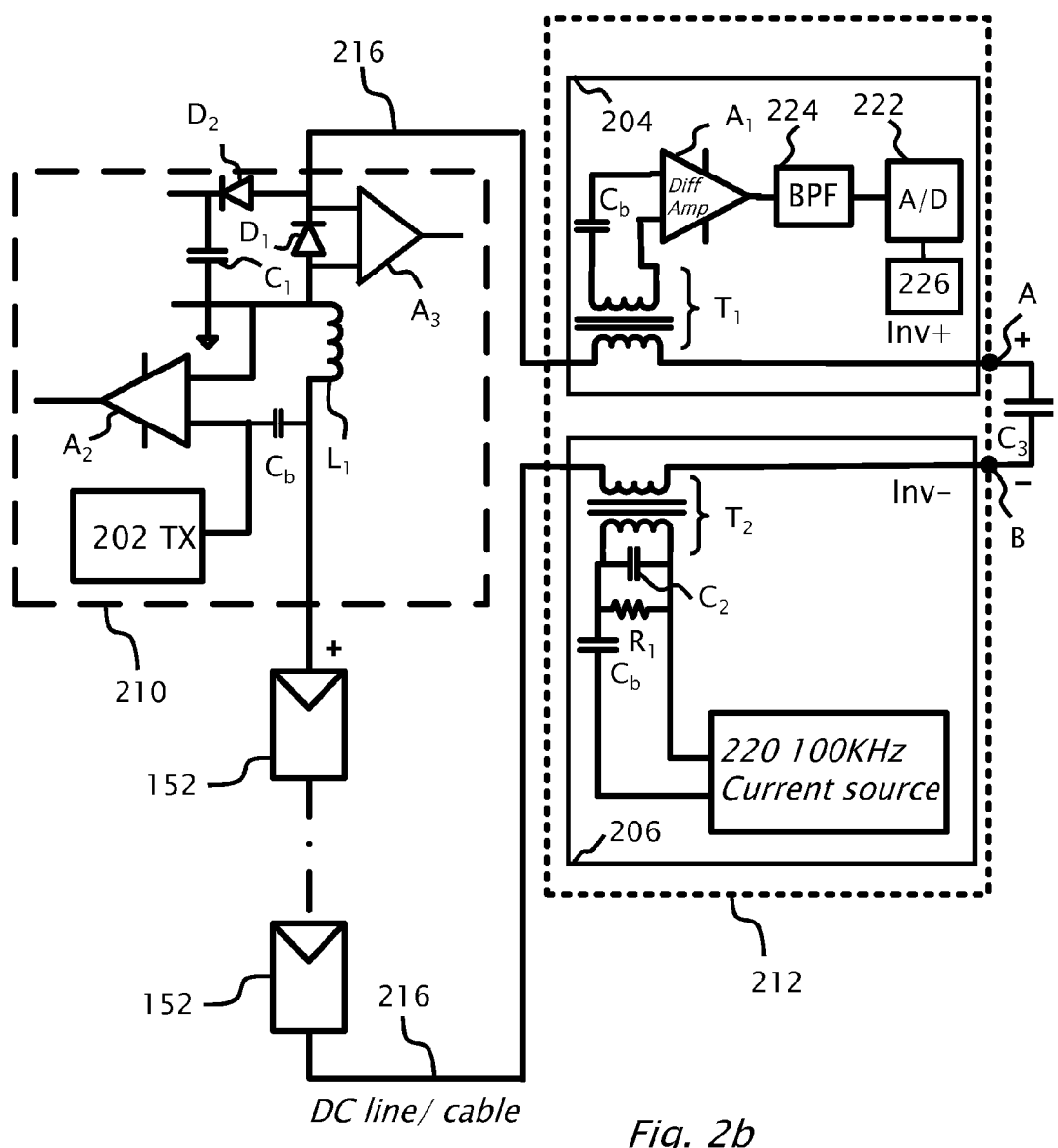
FIG. 2b shows further details of receiver/current source unit and impedance unit connected as shown in FIG. 2a according to an embodiment of the present invention.

Reference is now made to FIG. 2*b* which shows further details of unit 212 and impedance unit 210 connected as shown in FIG. 2*a* according to an embodiment of the present invention. Load 150 connected at nodes A and B is not shown. Unit 212 has a receiver 204 and AC source module 206. AC source module 206 includes an AC current source 220 which operates at a frequency typically of 100 KHz. The AC current of source 220 is superimposed on to DC line 216 via transformer $T_2$ or any other AC coupling device. One side of transformer $T_2$ coil is connected in shunt to a capacitor $C_2$ and resistor $R_1$ connected in parallel. One end of $R_1$ is connected to the output of current source 220. The other end of $R_1$ is connected to the other output of current source 220 via a DC blocking capacitor $C_b$. The other side of transformer coil $T_2$ is connected in series between node B and panels 152 via DC line 216. Receiver 204 receives an input of AC present on DC line 216 via one coil of transformer $T_1$ connected in series between node A and impedance unit 210 via DC line 216. The other coil of transformer $T_1$ is connected at one end to the input of a differential amplifier $A_1$ and the other end of the coil to the other input of amplifier $A_1$ via a blocking capacitor $C_b$. The output of amplifier $A_1$ connects into the input of a band pass filter (BPF) 224. The output of band pass filter (BPF) 224 connects into the input of an analogue to digital (A/D) converter 222. The output of analogue to digital (A/D) converter 222 operatively attached to processor 226 (with memory).

Impedance unit 210 is connected in series between panels 152 and receiver 204 via DC line 216. The positive DC output of panels 152 is connected to one end of an inductor $L_1$ and one end of a DC blocking capacitor $C_b$. The other end of DC blocking capacitor $C_b$ connects to the input of transmitter 202 as well as to the input of amplifier $A_2$. The other input of amplifier $A_2$ connects to one end of capacitor $C_1$, the anode of a diode $D_1$ and the other end of inductor $L_1$. Capacitor $C_1$ may serve as a charge storage device to provide power to impedance unit 210 during night-time operation. The cathode of $D_1$ connects the anode of diode $D_2$. The cathode of $D_2$ connects to the other end of capacitor $C_1$. The node where the cathode of $D_1$ connects the anode of diode $D_2$ provides the connection to DC line 216. Amplifier $A_3$ has an input which connects across diode $D_1$. The output of amplifier $A_2$ may be connected to the input of an analogue to digital (A/D) converter (not shown) with an output connected to a memory storage device (not shown). The output of amplifier $A_3$ may be connected to the input of an analogue to digital (A/D) converter (not shown) with an output connected to a memory storage device (not shown).

Figure 2C:
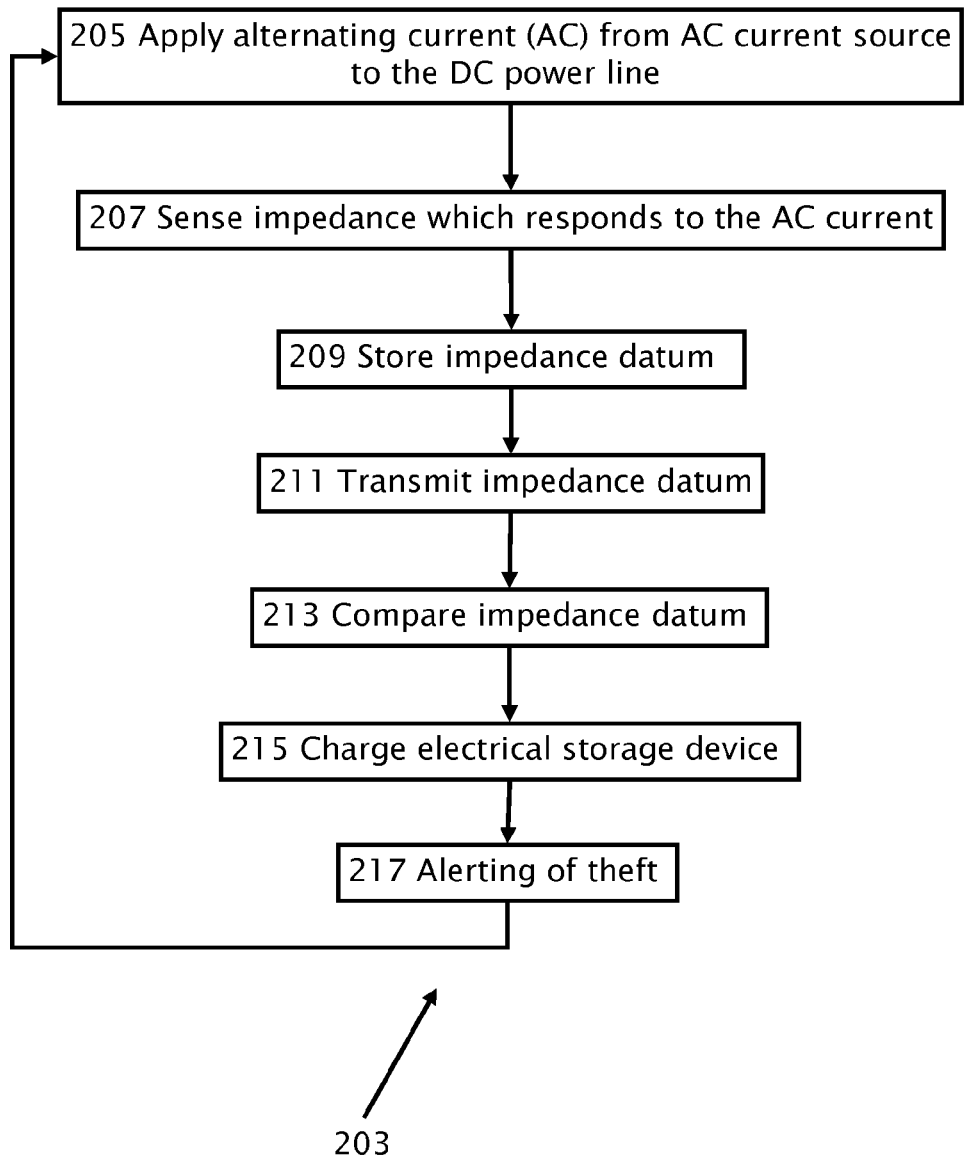
FIG. 2c shows a method for theft detection of a power generation system, according to an aspect of the present invention.

Reference is now also made to FIG. 2c which shows a method 203 for theft detection of a power generation system 201 which illustrates pairing in system 201, according to an aspect of the present invention. An alternating current of typically 100 KHz is superimposed or applied (step 205) onto DC line 216 for example via unit 212 and transformer $T_2$. Optionally, the coil of transformer $T_2$ connected in parallel with $C_2$ and $R_1$ have values selected to operate at a resonance with the series inductance of DC line 216 and inductor $L_1$ located in impedance unit 210. During daylight operation of system 201 direct current flows out from panels 152 through $L_1$ and $D_1$ in impedance unit 210, through receiver 104, inverter 150, source 260 and back to the other end of panels 152. A measure of the impedance of panels 152 is achieved by sensing (step 207) the current through inductor $L_1$ via amplifier $A_2$ and the voltage across diode $D_1$ via amplifier $A_3$. A measure of the impedance of panels 152 is achieved by dividing the magnitude of the voltage across diode $D_1$ by the magnitude of the current through inductor $L_1$ during sensing (step 207). The measure of the impedance of panels 152 by sensing (step 207) may be stored (step 209) as an impedance datum in a memory (not shown) attached to amplifier $A_2$ and $A_3$ via analogue to digital (A/D) converters (not shown). The stored impedance datum derived by sensing (step 207) may also be transmitted (step 211) by transmitter 202 onto power lines 216. Typically during night-time transmitter 202 transmits every 3 minutes. Receiver 204 receives the transmissions of the impedance datum from transmitter 202 via one side of transformer $T_1$. The other side of transformer $T_1$ is applied to the input of amplifier $A_1$. The output of amplifier $A_1$ is fed into the input of band-pass filter 224 which extracts the impedance data sent by transmitter 202. The output of band-pass filter 224 is then converted to a digital value via analogue to digital (A/D) converter 222 which is optionally stored in processor 226 (with memory) operatively attached to the output of analogue to digital (A/D) converter 222. Comparisons (step 213) of stored impedance datum (step 209) and transmitted impedance datum (step 211) are preferably made by processor 226. During daylight operation of capacitor $C_1$ serves as a charge storage device (step 215) to optionally provide power to impedance unit 210 during night-time operation. A potential theft of a component of system 201 is alerted (step 217) which is responsive to a change in the sensed impedance datum comparisons (step 213) according to previously determined thresholds. A potential theft is alerted once there is no report from impedance unit 210 since transmitter 202 may transmit once in 3 minutes and if a transmission is not received then the cable may have been cut, when power line communication is used.

Figure 2D:
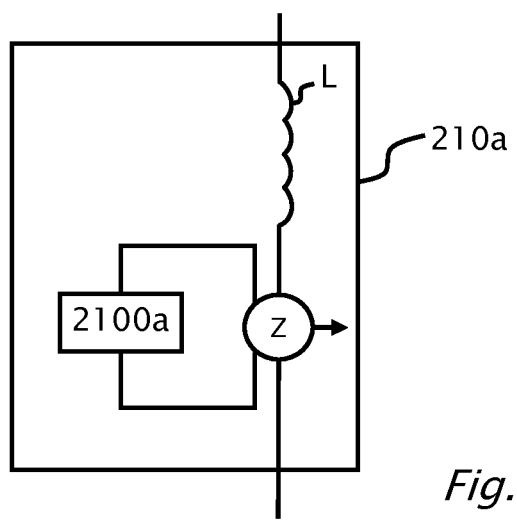
FIG. 2d shows an alternative embodiment of the impedance unit shown in FIG. 2b.

Reference is now made to FIG. 2d which shows impedance unit 210a, impedance unit 210a is an alternative embodiment of impedance unit 210 shown in FIG. 2b. Impedance unit 210a includes a high impedance inductor L, possibly using resonance to increase impedance and an impedance meter Z. Inductor L is connected in series with impedance meter Z. Impedance meter Z may have a charge storage element 2100a such as a battery or capacitor for nighttime operation which is charged during daytime operation. Alternatively, impedance meter Z may be powered by the method of AC feed. The AC signal that is imposed on the inductor L is rectified when unit 212 includes an AC source used for the purpose of feeding power to probes 200 and for impedance measurement. Impedance meter Z is typically adapted to transmit impedance/voltage/current datum via power line communications or via a wireless connection.

Figure 2E:
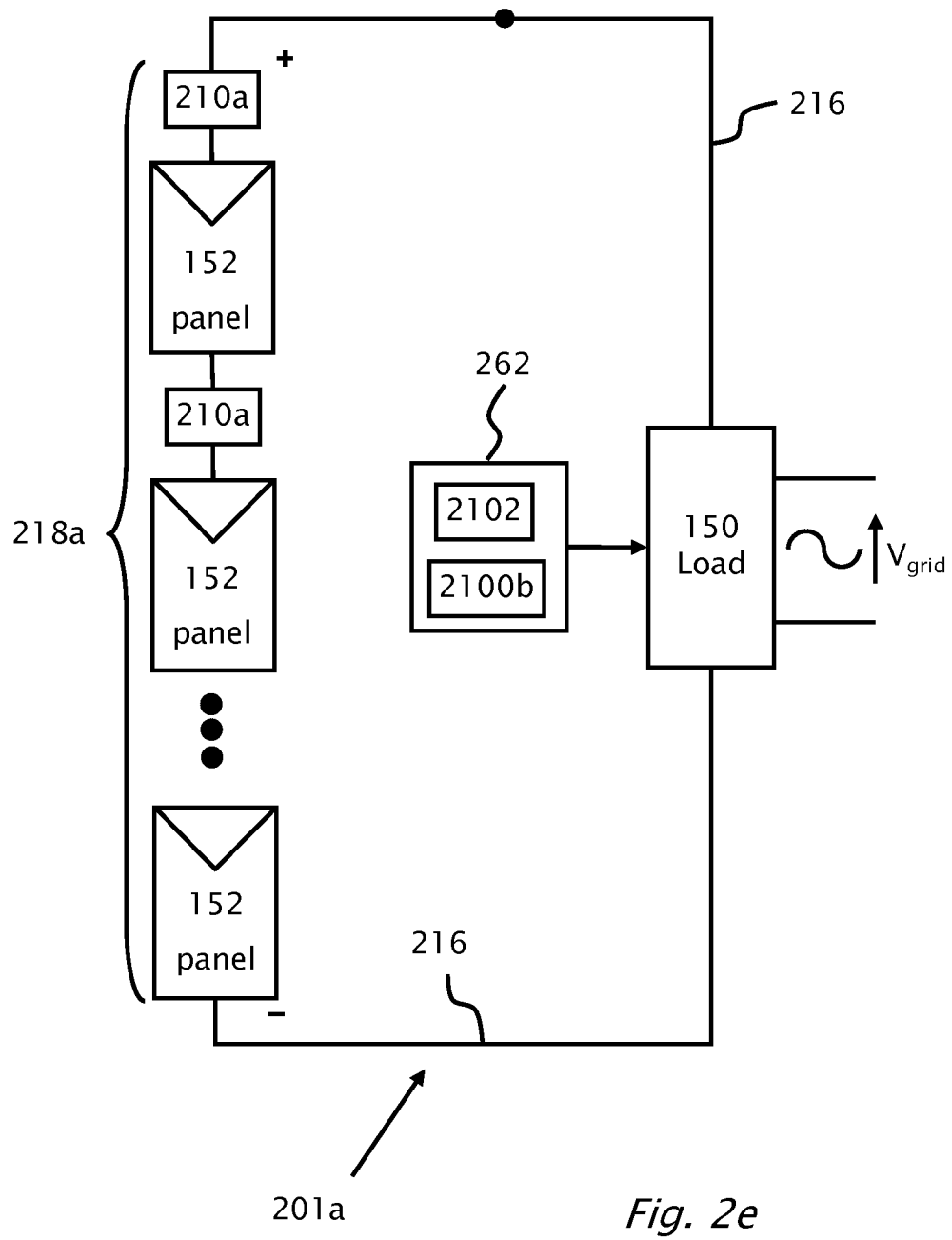
FIG. 2e shows a power generation system including a theft prevention feature according to an embodiment of the present invention.

Reference is now made to FIG. 2e which shows a power generation system 201a including a theft prevention feature which illustrates pairing in system 201a according to an embodiment of the present invention. Power generation system 201a has a string 218a of photovoltaic panels 152, impedance units 210a, a module 262 and load 150. Load 150 may be a direct current (DC) to alternating current (AC) inverter with an output which connects to a grid voltage ($V_{grid}$). Impedance units 210a are connected serially with panels 152 or may be incorporated as a part of a panel 152 to form string 218a. Module 262 typically includes a receiver 2102 to receive datum transmitted from units 210a.

During daytime operation module 262 may be powered by the voltage of string 218b, by the grid voltage ($V_{grid}$) during nighttime operation or module 262 may have a charge storage element 2100b such as a battery or capacitor for nighttime operation which is charged during daytime operation. During nighttime operation, impedance units 210a may be powered by module 262 (providing a typical 12 volts DC current to module 210a) which is powered by the grid voltage ($V_{grid}$) and/or a charge storage device 2100b. During daytime operation, impedance units 210a may be powered by the current in string 218b or by taking power from a single panel. Impedance units 210a may have a charge storage element 2100a such as a battery or capacitor for nighttime operation which is charged during daytime operation.

String 218a is connected serially to the DC input of load 150 via direct current (DC) lines 216. Module 262 may be incorporated as a part of the circuitry of load 150 or operatively attached to load 150. Impedance units 210a may sense the impedance of panels 152, the current flowing in string 218a or the voltage at a certain point within string 218a depending where impedance unit 210a is connected in string 218a. Impedance unit 210a periodically transmits a datum corresponding to the measured impedance/DC or AC current/DC or AC voltage datum over power line communications or via a wireless connection to module 262. Module 262 alerts a potential theft of a component of system 201a which is responsive to a change in the sensed impedance/current/voltage datum provided by impedance units 210a. Not receiving a report is a potential theft on its own.

Figure 2F:
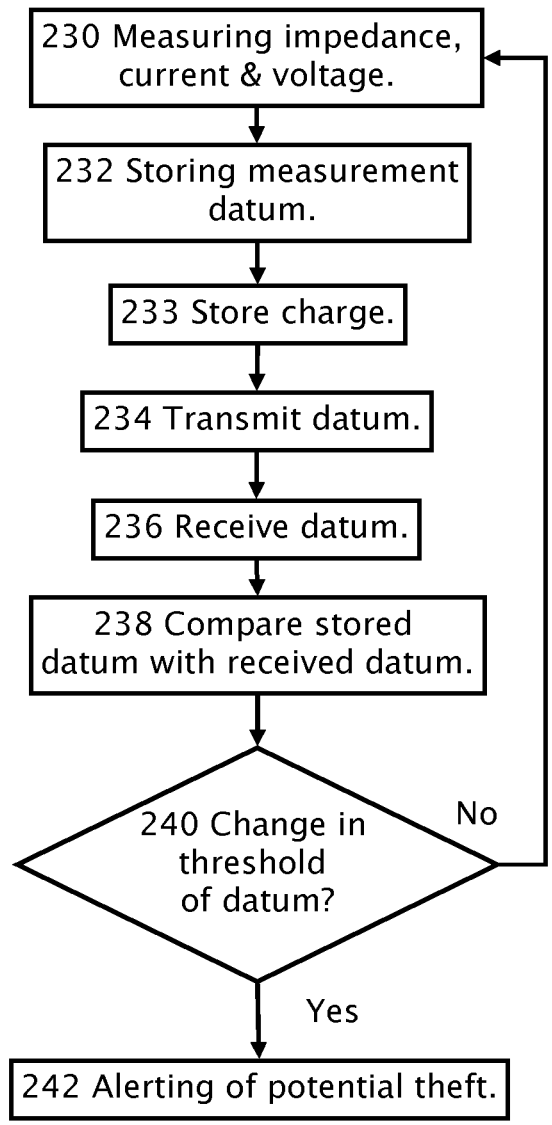
FIG. 2f shows a method for theft detection according to an embodiment of the present invention using the power generation system shown in FIG. 2e.

Reference is now made to FIG. 2f which shows a method 219 for theft detection according to an embodiment of the present invention using system 201a (shown in FIG. 2e). Impedance units 210a preferably measures impedance, DC current or DC voltage at various points in string 218a (step 230). Impedance units 210a preferably have memories to store measured impedance, DC current or DC voltage as datum (step 232). During daytime operation, impedance units 210a may be powered by the current in string 218b. Impedance units 210a and/or module 262 may have a charge storage element (2100a and 2100b respectively) such as a battery or capacitor for nighttime operation. The charge storage elements (2100a and 2100b respectively) are used to store charge during daytime operation (step 233). Impedance units 210a transmit (step 234) stored measurement datum (step 232) by power line communications or via a wireless connection to module 262. Module 262 receives the transmitted measurement datum with receiver 2102 and compares (step 238) the transmitted datum with datum that has been stored previously in a look table in module 262 as part of a pairing process between module 262 and impedance units 210a. If the comparison between stored datum (step 232) and received datum (step 236) is above a certain pre-defined threshold level, then module 262 may alert a potential theft of a component of system 201a (step 242), otherwise measurement of the impedance, DC current or DC voltage at various points in string 218a (step 230) continues. Not receiving a report in the central unit is a potential theft.

Figure 2G:
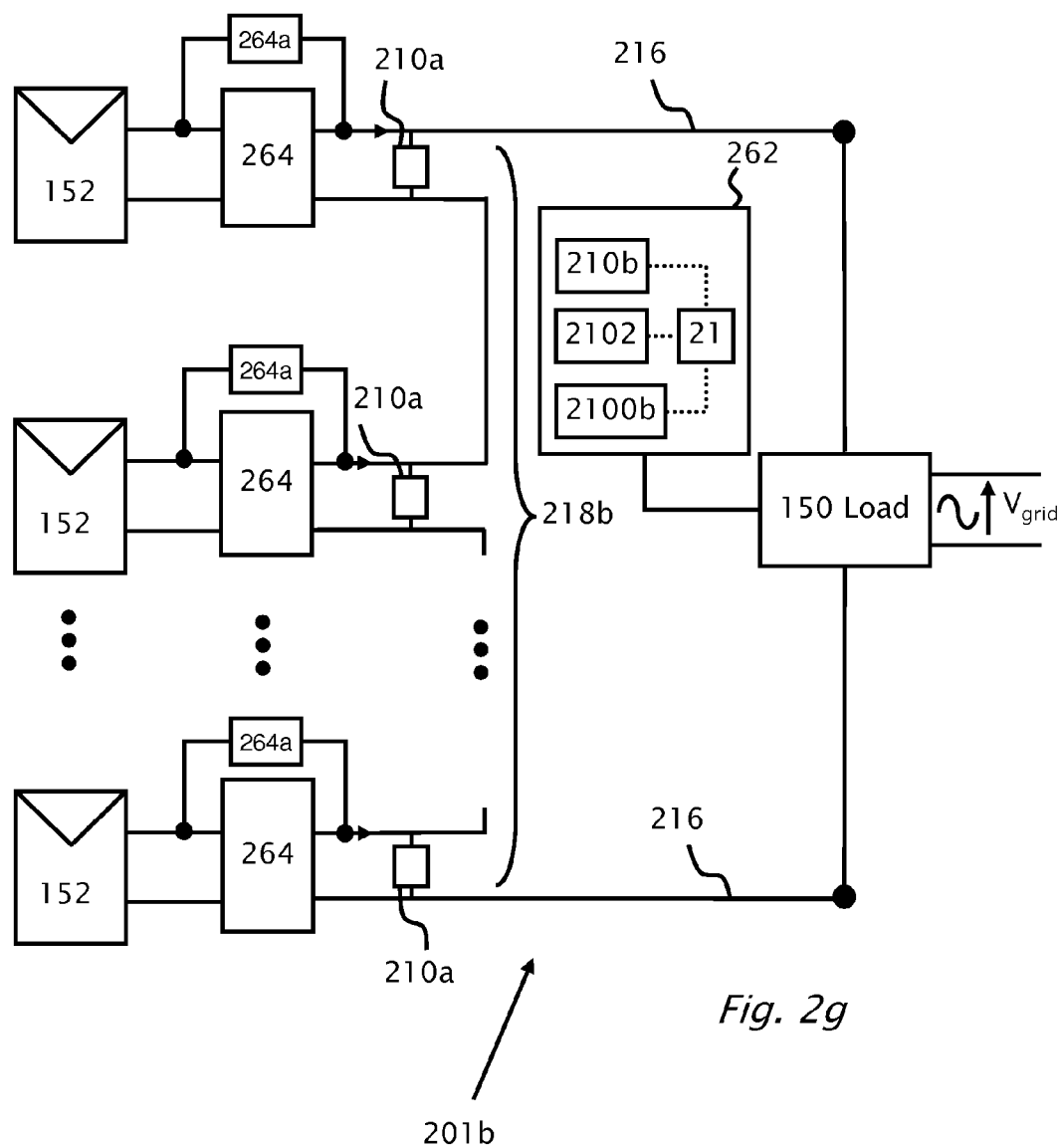
FIG. 2g shows a power generation system including a theft prevention feature according to an embodiment of the present invention.

Reference is now made to FIG. 2g which shows a power generation system 201b including a theft prevention feature according to an embodiment of the present invention. Power generation system 201b has a string 218b, photovoltaic panels 152, impedance units 210a, electronic modules 264, a module 262 and load 150. Load 150 is preferably a direct current (DC) to alternating current (AC) inverter with an output which connects to a grid voltage ($V_{grid}$). The outputs impedance units 210a are connected serially to form a string 218b. The inputs of impedance units 210a are connected to the outputs of electronic modules 264 either in parallel or in series. Impedance unit 210a may be incorporated as a part of an electronic module 264. The inputs of electronic modules 264 are connected to the outputs of panels 152. Module 262 typically includes a receiver 2102 to receive datum transmitted from units 210a. Electronic module 264 additionally may include a bypass 264a which is connected serially between the input and output of module 264. Bypass 264a is typically a single pole switch which is energized to be open circuit when module 264 is receiving power from panel 152 or is a capacitor or a series capacitor and inductor.

During daytime operation module 262 may be powered by the voltage of string 218b, by the grid voltage ($V_{grid}$) during nighttime operation or module 262 may have a charge storage element 2100b such as a battery or capacitor for nighttime operation which is charged during daytime operation. During nighttime operation impedance units 210a may be powered by module 262 (providing a typical 12 volts DC current) which is being powered by the grid voltage ($V_{grid}$) and/or a charge storage device 2100b. During daytime operation, impedance units 210a may be powered by the voltage of module 264 or impedance units 210a may have a charge storage element 2100a such as a battery or capacitor for nighttime operation which is charged during daytime operation. There is an additional option for day and/or night operation for 210a where module 262 sends an AC signal that is rectified by 210a on some impedance (e.g. inductor in resonance) to produce DC.

String 218b is connected serially to the DC input of load 150 via direct current (DC) lines 216. Module 262 maybe optionally incorporated as a part of the circuitry of load 150 or operatively attached to load 150. Impedance units 210a preferably measures the impedance of modules 264, the current flowing in string 218b or the voltage at a certain point within string 218b depending where an impedance unit 210a is connected in string 218b or the voltage output of a module 264. Impedance unit 210a periodically transmits datum corresponding to the measured impedance/DC current/DC voltage over power line communications or via a wireless connection to module 262. Module 262 includes a receiver 2102 to receive datum from module 210a. Module 262 alerts a potential theft of a component of system 201a which is responsive to a change in the sensed impedance/current/voltage datum provided by impedance units 210a. Again, theft can be detected by not getting a report from the impedance unit 210a whether or not impedance unit 210a is incorporated within modules 264.

Impedance measurement may be performed by impedance unit 210a alone or by using central impedance probe 210b located in external AC source 262, the latter method being appropriate for the case of simple panels with or without DC module 264. Impedance probe is attached to microprocessor 21 which has ports for analogue to digital/digital to analogue conversion an on board memory.

The impedance that is measured by impedance unit 210a is actually the sum of impedances reflected by all other impedance units 210a. Reference is now made to to FIG. 2d as an example of a circuit which may be included in impedance unit 210a. Impedance unit 210a may be part of DC module 264 and has the output capacitance of the DC module 264 and a series inductor (a regular inductor L or in resonance in order to increase its impedance. Another example is that impedance unit 210a behaves as a capacitor (either as part of DC module 264 or separately) and the impedance measured is the impedance of the capacitor.

According to a feature of the present invention is the ability to sense that photovoltaic panel 152 is no longer connected to DC module 264, in case that only photovoltaic panel 152 is being stolen. During the day it is straightforward to detect a DC input from panel 152. During the night, when panel 152 does not output DC, DC module 264 can measure the panel capacitance or try to impose a voltage and sense whether panel 152 draws current at some point (which is its diode voltage).

According to another feature of the present invention, where a panel 152 is attached to a module 264 and a panel 152 is stolen at night for instance by detaching from DC module 264; it is possible to configure module 264 to passively present the impedance of panel 152 by use of bypass 264a so that such a theft may be detected.

Figure 2H:
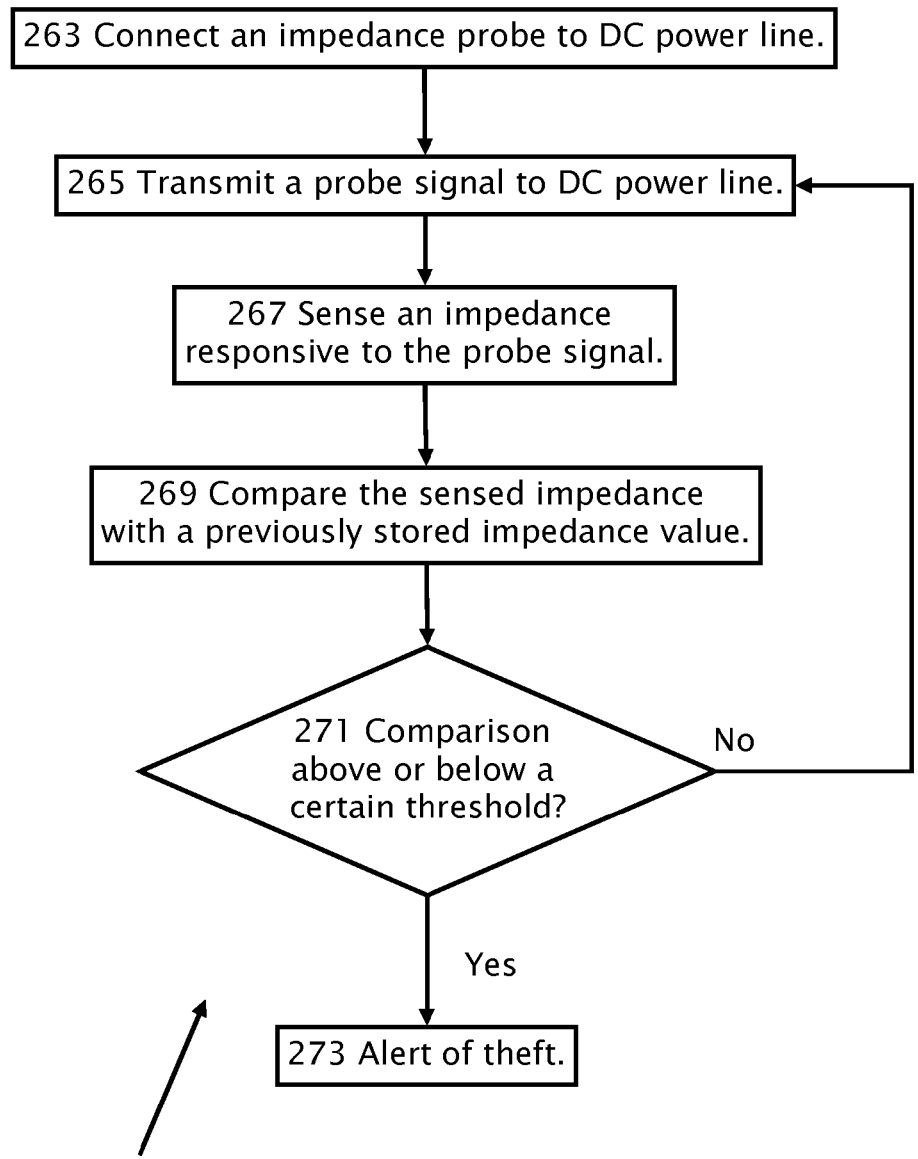
FIG. 2h which shows a method of theft protection in a distributed electrical power generation system according to an embodiment of the present invention.

Reference is now made FIG. 2h which shows a method 261c of theft protection in a distributed electrical power generation system 201b, according to an aspects of the present invention. Central impedance probe 210b is connected to DC line 216 (step 263). Probe 210b then transmits (step 265) a probe signal onto DC line 216, the probe signal may be an AC feed or a DC power line communication signal. Transmit step 265 is controlled and performed using microprocessor 21. Probe 210b then senses (step 267) the impedance of string 218b as a result of applying the probe signal. The sensed impedance in step 267 may then be compared (step 269) with a previously stored impedance value stored in the memory of microprocessor 21. The comparison may be to subtract the sensed impedance in step 267 from the previously stored impedance value stored in the memory of microprocessor 21 to produce a difference value. In decision box 271, the difference value may then may be above or below a certain threshold value, in which case an alert of theft is made (step 273), otherwise transmitting of the probe signal continues with step 265.

When bypass 264a is a single pole switch (magnetic reed relay for example); during the night, when panel 152 does not output DC, the single pole switch is normally closed and the panel 152 impedance is bypassed from the input of module 264 to the output of module 264. Typically if module 264 is a power converter circuit, the main switches in the power converter circuit are open circuit at night, so that the shunt impedance of the output and input of module 264 does not affect the measurement (step 267) of the panel 152 impedance by probe 210b (via bypass 264a). During daytime operation the single pole switch 264a is activated to be open circuit. Another preferable implementation for bypass 264a, is to make bypass 264a a fixed bypass between the input and output of the module 264, were the fixed bypass 264a reflects panel 152 impedance to the output of module 264 but will not interfere with the way module 264 works. The fixed bypass 264a may be a series capacitor between the input and output of module 264 or a series capacitor and inductor between the input and output of module 264 which may be operated at resonance.

According to an aspect of the present invention there is provided a method which relies on impedance measurement performed by a central unit (load/inverter) by sending a signal and measuring voltage/current. In one example, the signal is a dedicated measurement signal. In this case, impedance/capacitance of panels 152 without any additional circuitry may be sensed. In another example, the signal is an AC feed for power modules 264 (during the night or day). In another example, the signal is a power-line-communication that may be used for other purposes (such as command and control, monitoring etc.). The additional circuitry, e.g. power modules 264 may reflect an impedance or output capacitance to measure. Alternatively, the impedance of a series inductor (e.g. regular, resonance, switched resonance) of DC module 264 is measured by command and control from the central unit).

Reference is now made again to FIG. 2f which shows a method 219 for theft detection according to an embodiment of the present invention using system 201b shown in FIG. 2g. Impedance units 210a preferably measures impedance, DC current or DC voltage at various points in string 218b (step 230). Impedance units 210a preferably have memories to store measured impedance, DC or AC current or DC or AC voltage as datum (step 232). During daytime operation, impedance units 210a may be powered by the output voltages of modules 264 or impedance units 210a and module 262 may optionally have a charge storage element 2100b such as a battery or capacitor which is used during nighttime operation. The charge storage elements (2100a and 2100b) are used to store charge during daytime operation (step 233). Impedance units 210a transmit the measurement datum (step 234) by power line communications or via a wireless connection to module 262. Module 262 receives the transmitted measurement datum with receiver 2102 and compares (step 238) the transmitted datum with datum that has been stored previously in a look table in module 262 as part of a process between module 262 and impedance units 210a. If the comparison of datum is above a certain pre-defined level module 262 alerts a potential theft of a component of system 201a (step 242), otherwise measurement of the impedance, DC current or DC voltage at various points in string 218a (step 230) continues.

Thermal Camera

Infrared (IR) radiation or heat radiation is herein defined as electromagnetic radiation whose wavelength is longer than that of visible light (400-700 nm), but shorter than that of terahertz radiation (100 μm-1 mm) and microwaves.

Figure 3A:
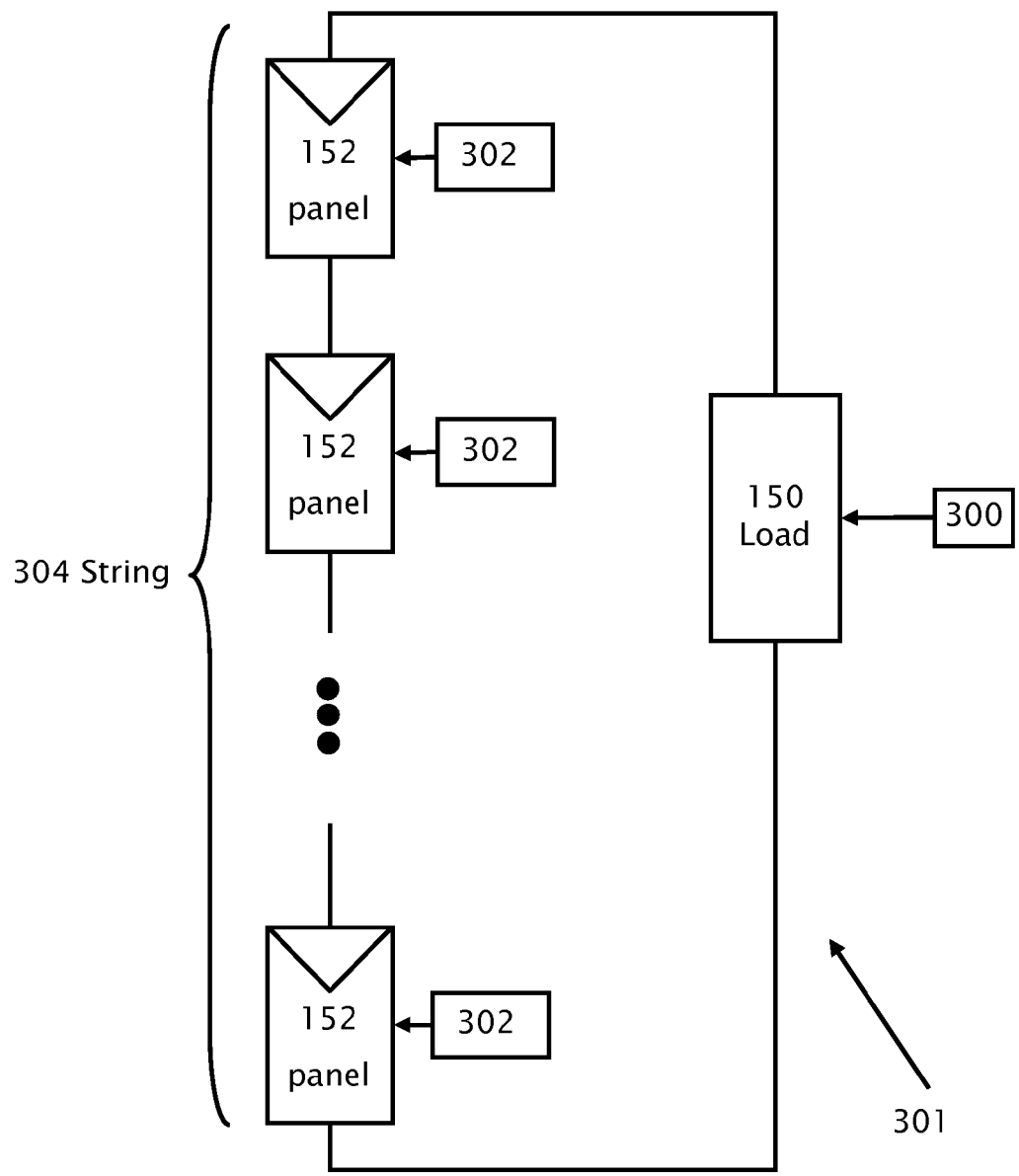
FIG. 3a shows a power generation system including a theft prevention feature according to an embodiment of the present invention.

Reference is now made to FIG. 3a which shows a power generation system 301 including a theft prevention feature according to an embodiment of the present invention. An electronic module 302 is operatively attached to a photovoltaic panel 152. Electronic module 302 may perform direct current to direct current (DC/DC) conversion or DC to alternating current (AC) inverter and according to an embodiment of the present invention is capable of reverse biasing a panel 152. Multiple panels 152 are connected in series to form a string 304. Load 150 may be a direct current (DC) to alternating current (AC) inverter. A central control unit 300 preferably located in the vicinity of load 150 is operatively connected to load 150 and electronic module 302. Central control unit 300 optionally provides a signal to electronic module 302 as well as being connected to a camera 306 (not shown). The signal from central controller 300 to electronic module 302 may be conveyed over the power lines connecting load 150 to string 304 or via a wireless connection between controller 300 and module 302.

Figure 3B:
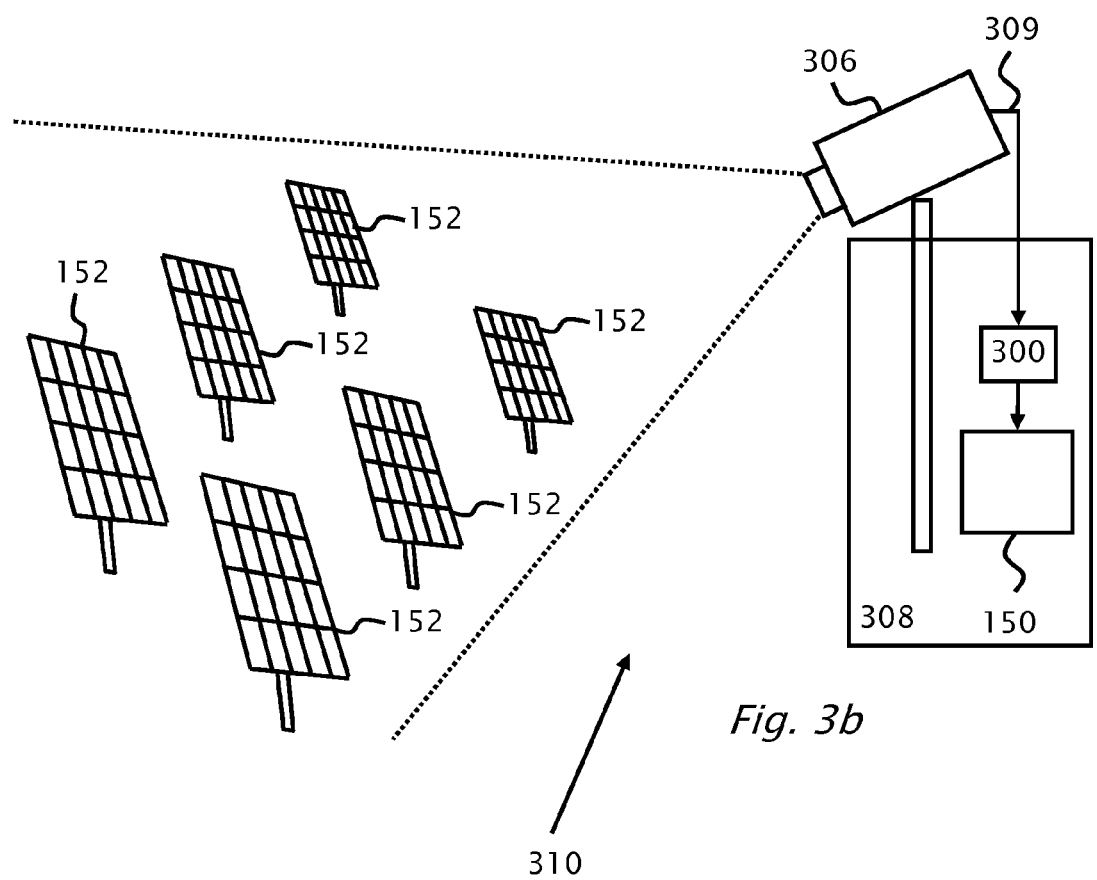
FIG. 3b shows a typical topography of the power generation system (shown in FIG. 3a) including a theft prevention feature according to an embodiment of the present invention.

Reference is now made to FIG. 3b which shows a typical topography 310 of power generation system 301 (shown in FIG. 3a) including a theft prevention feature according to an embodiment of the present invention. Topography 310 includes multiple panels 152 with modules 302 (not shown) which are connected to load 150 and controller 300. A camera 306 is located in the vicinity of controller 300 and load 150 which are located in a building 308. Camera 306 is preferably a thermal imaging camera. The field of view of camera 306 preferably captures images of panels 152. The captured images of panels 152 by camera 306 are preferably sent to controller 300 for analysis via power/signal line 309 or via wireless communications.

Figure 3C:
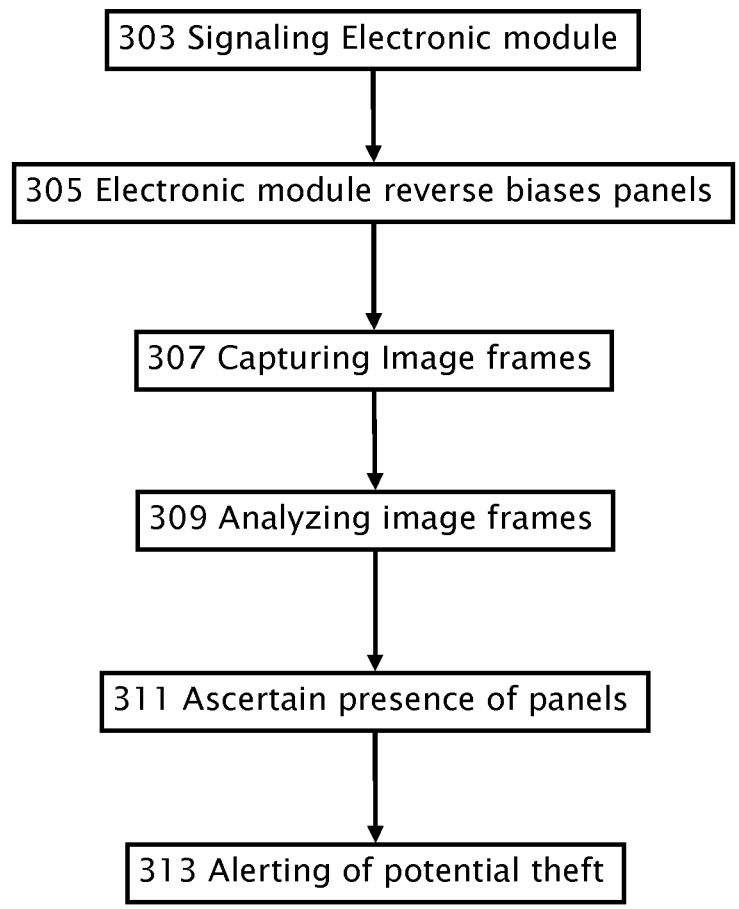
FIG. 3c shows a method for theft detection according to an embodiment of the present invention using the system of FIG. 3a with topography shown in FIG. 3b.

Reference is now also made to FIG. 3c which shows a method 311 for theft detection according to an embodiment of the present invention using system 301 with topography 310. During theft detection a signal is sent from central unit 300 to an electronic module 302 (step 303). The signal from unit 300 to electronic module 302 may be conveyed over the power lines connecting load 150 to string 304 or via a wireless connection between unit 300 and module 302. Typically the signal sent from unit 300 reverse biases panel 152 via module 302 (step 305) for a period of time which causes a noticeable rise in panel 152 temperature. After reverse biasing panels 152 (step 305) using module 302, image frames of panels 152 are captured using camera 306 (step 307). Unit 300 then analyzes (step 309) the image frames of panels 152 captured by camera 306 (step 307). Analyzing the captured image frames preferably means monitoring the effects of reverse biasing panels 152 or alternatively monitoring the thermal effects of normal current flow produced during daylight operation of panels 152 without the use of the signal sent from unit 300. Reverse biasing panels using the signal from unit 300 has the effect of heating up panels 152 thereby altering the infrared radiation/heat radiation of panels 152. The presence of panels 152 is ascertained (step 311) by virtue of the infrared radiation change analyzed by unit 300 in captured image frames, after a signal from unit 300 is applied to a panel 152 via module 302. The alerting of a potential theft (step 313) is therefore achieved by the absence of panel 152 not providing a thermal change as a result of applying a signal to a panel 152 via module 302.

Wireless Communications

Figure 4A:
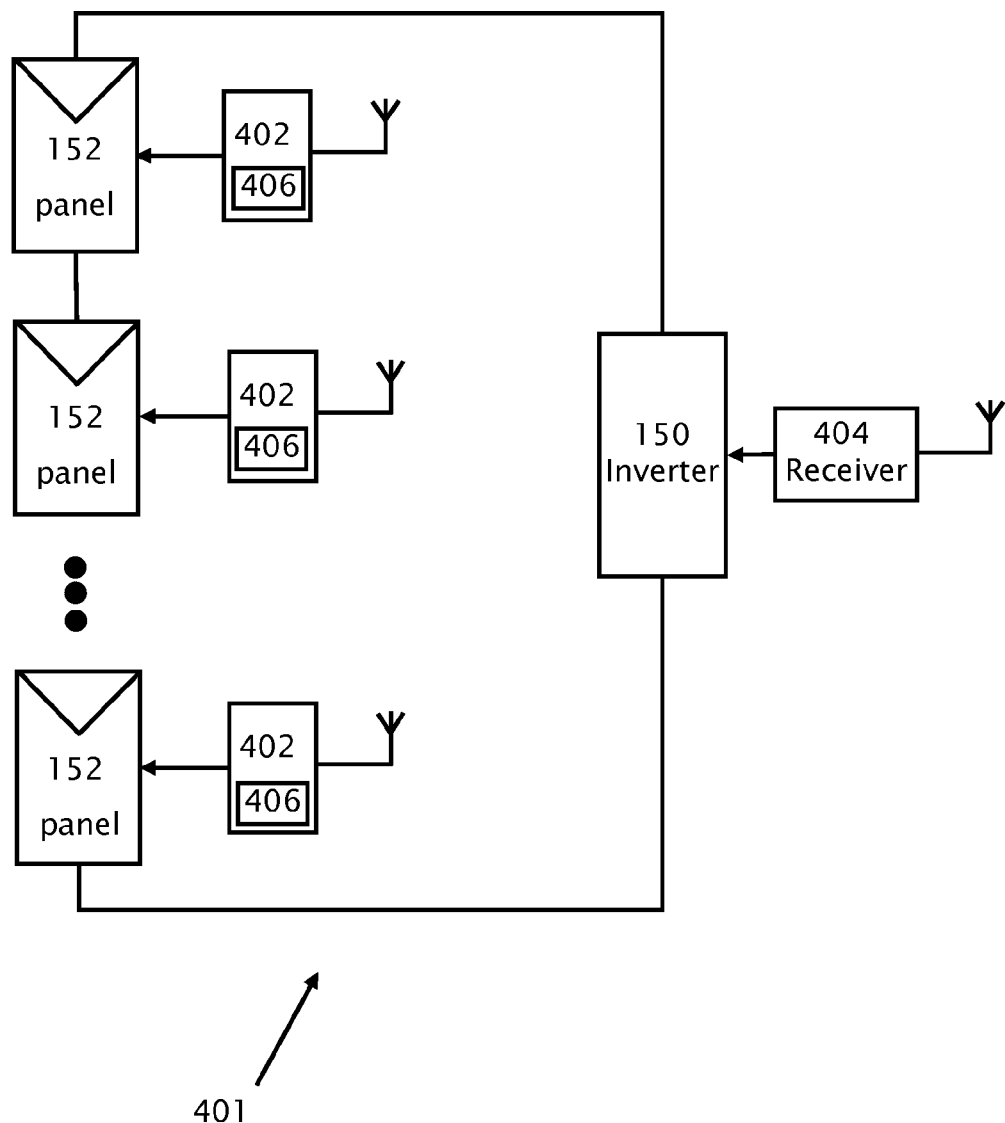
FIG. 4a shows a power generation system including a theft prevention feature according to an embodiment of the present invention.

Reference is now made to FIG. 4a which shows a power generation system 401 including a theft prevention feature according to an embodiment of the present invention. Photovoltaic panels 152 have transmitters 402 operatively attached thereto. Transmitter 402 preferably has a charge storage device 406 used to power transmitter 402 during the nighttime. The charge storage device 406 of transmitter 402 is charged during normal daylight by electricity generated by irradiation of panels 152. Multiple panels 152 are connected in series to a load 150. Load 150 is preferably a direct current (DC) to alternating current (AC) inverter. Attached to and in the vicinity of load 150 is a receiver 404. Receiver 404 receives signals from transmitters 402. Receiver 401 may be composed of an array of receivers/repeaters spread in the solar field installations which eventually send all received information to inverter 150.

Figure 4B:
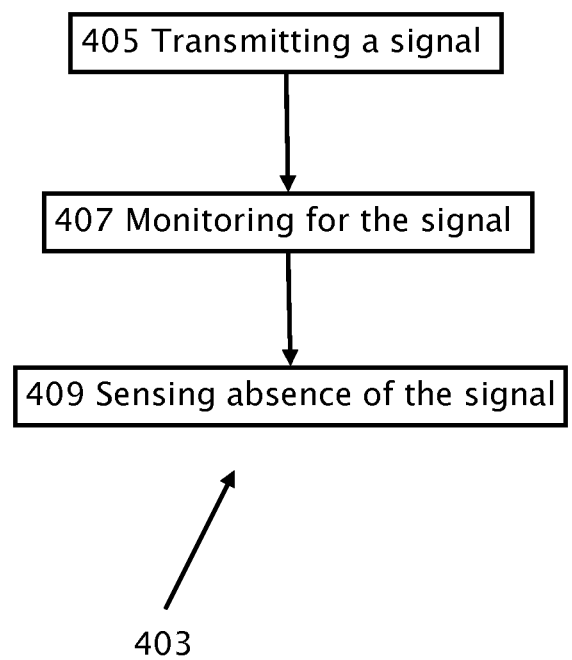
FIG. 4b shows a method for theft prevention using the system shown in FIG. 4a, according to an embodiment of the present invention.

Reference is now also made to FIG. 4b which shows a method 403 for theft prevention using system 401, the method 403 is according to an embodiment of the present invention. Transmitters 402 operatively attached to panels 152 transmit signals (step 405). The transmitted signals of transmitters 402 are preferably transmitted each on different frequencies. The different frequencies that transmitters 402 transmit allow for the unique identification of a particular panel 152. The transmitted signals of transmitters 402 are monitored (step 407) by receiver 404. The monitoring (step 407) by receiver 404 preferably allows for differentiation and identification of which transmitter 402 is transmitting. The absence of a signal from a transmitter is preferably sensed (step 409) by receiver 404. Receiver 404 preferably alerts the situation a theft by virtue of an absence of a received signal or signals from transmitters 402.

In an additional method, transmitter 402 sends a signal only upon theft (detected by either specific sensors like accelerometers or by disconnection from the cable which cuts off signaling or DC feeding from inverter 150.

In an additional implementation, transmitter 402 is passive and contains only a resonance circuit (in series/parallel) and an antenna. Inverter 150 sends an AC signal via the cable that is transmitted passively by the antenna of 402 and is amplified by the resonance circuit of 402. An advantage is that there is no need to feed anything during the night, besides sending a signal on the cable.

Another variant of this method is where photovoltaic panels include a module with a resonance circuit in a different frequency band such that load 150 sends all the relevant frequencies (e.g. a frequency sweep) and receiver 402 senses occurrence of frequency dips, a dip is a specific indication of a stolen module. It gives both identification and additional accuracy (since the received strength signal is not summed over all modules).

Figure 4C:
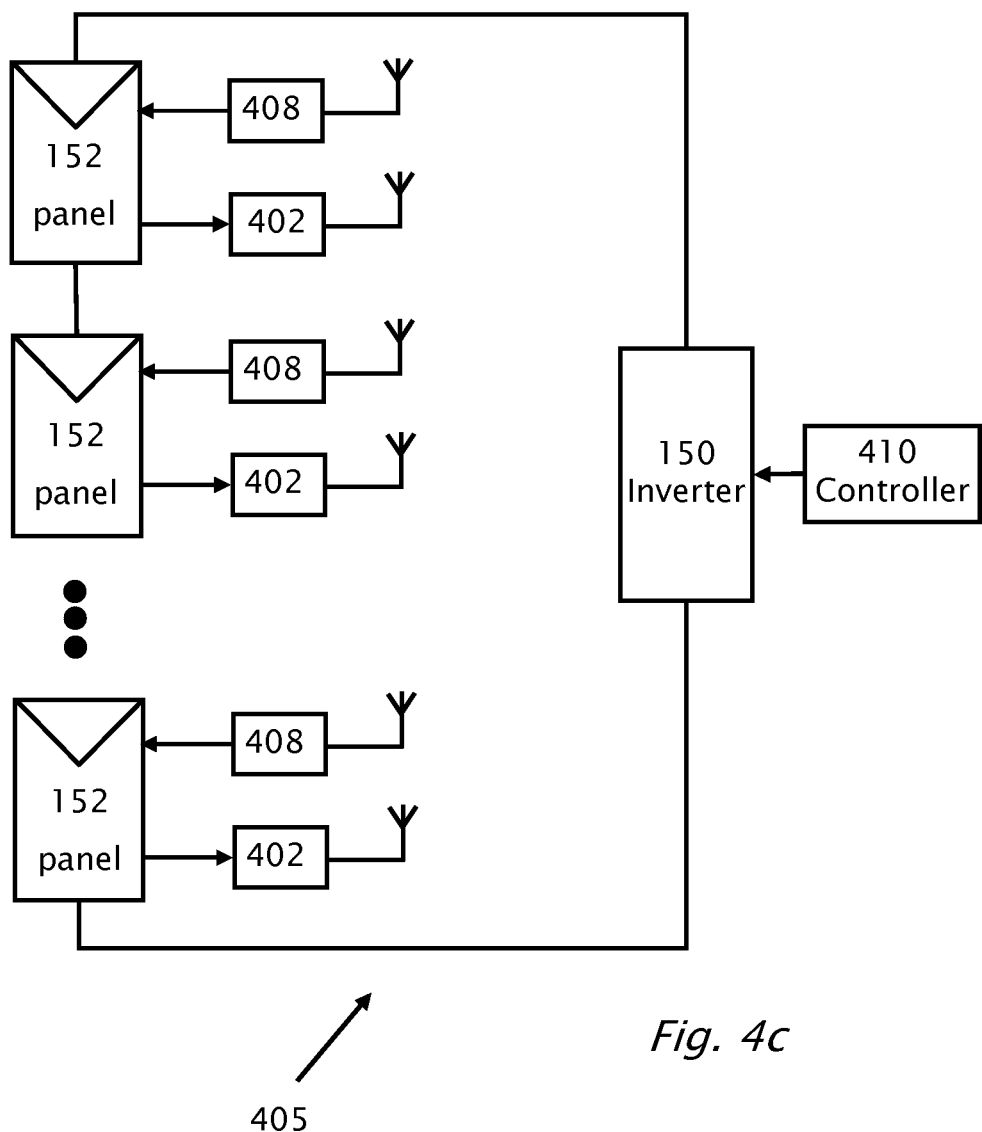
FIG. 4c shows a power generation system including a theft prevention feature according to an embodiment of the present invention.

Reference is now made to FIG. 4c which shows a power generation system 405 including a theft prevention feature according to an embodiment of the present invention. Multiple photovoltaic panels 152 are connected in series to form a string. The string of photovoltaic panels 152 are connected across a load 150. Load 150 is preferably a direct current (DC) to alternating current (AC) inverter. Attached to each panel 152 are a transmitter 402 and a receiver 408. The transmitter 402 and receiver 408 may share common components and may be unified into a transceiver. A central control unit 410 is operatively attached to a transmitter 402 and a receiver 408 via load 150. Control unit 706 may be operatively attached to transmitter 402 and a receiver 408 via power line communications or via a wireless connection. Receiver 408 optionally receives a signal from transmitter 402.

Figure 4D:
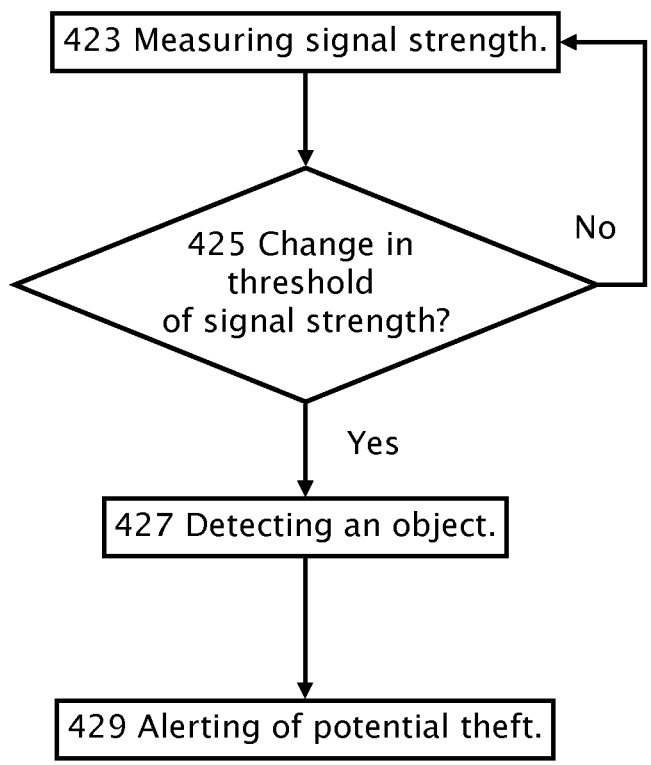
FIG. 4d shows a method of theft detection/prevention according to an embodiment of the present invention.

Reference is now made to FIG. 4d which shows a method 421 for theft detection/prevention according to an embodiment of the present invention. Receiver 408 measures the signal strength (step 423) of transmitters 402 within in the immediate vicinity of panel 152. A change in signal strength measured in the immediate vicinity of panel 152 according to a predetermined threshold (step 425) is used to detect (step 427) an object in the immediate vicinity of panel 152. The change in signal strength detected by receiver 408 is conveyed to central controller 410 which provides an alert of a potential theft of panel 152 (step 429). If there is no significant change in threshold signal strength (step 425) receiver 408 continues to measures the signal strength (step 423) of transmitters 402 within in the immediate vicinity of panel 152.

Electric Field Strength Measurement

The term "electric field" as used herein refers to the electric flux present in the space surrounding an electric charge or the electric flux present in the space of a time-varying magnetic field. The space surrounding an electric charge or the space in the presence of a time-varying magnetic field may be air and/or a dielectric material. The electric field exerts a force on other electrically charged objects with the magnitude of the force dependant on the inverse square relationship of the distance between electrically charged objects.

Figure 5A:
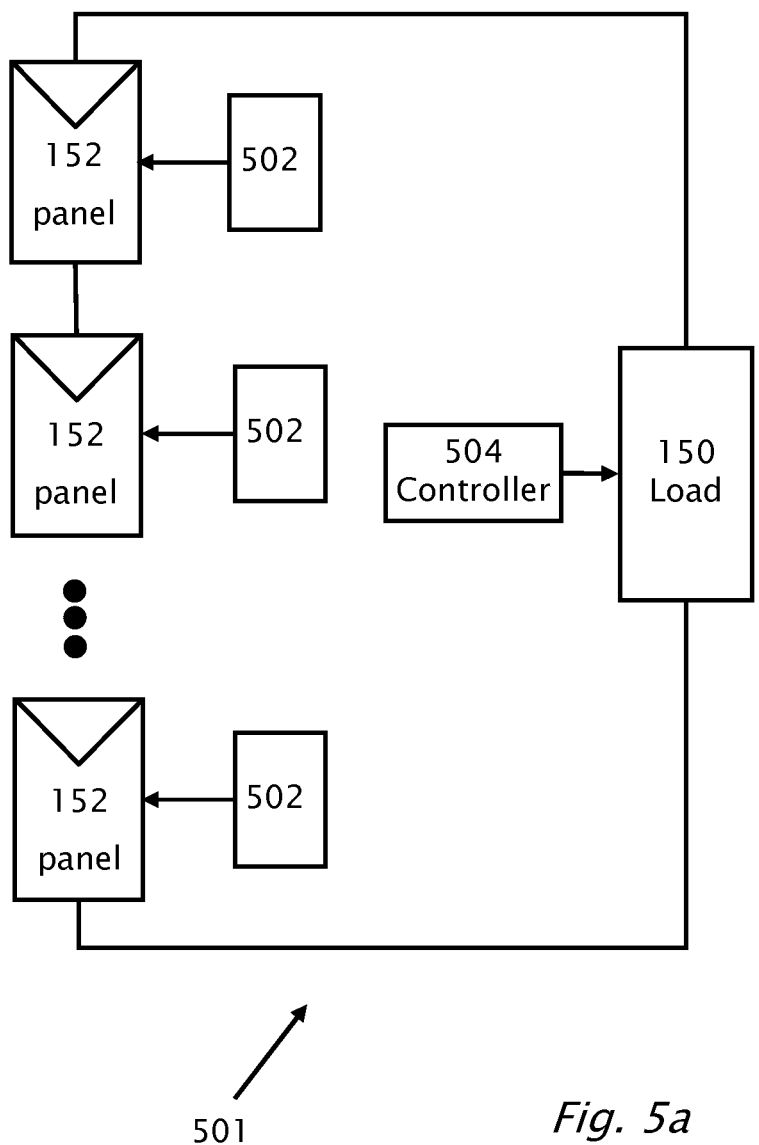
FIG. 5a shows a power generation system including a theft prevention feature according to an embodiment of the present invention.

Reference is now made to FIG. 5a which shows a power generation system 501 including a theft prevention feature according to an embodiment of the present invention. Multiple photovoltaic panels 152 are connected in series to form a string. The string of photovoltaic panels 152 are connected across a load 150. Load 150 is preferably a direct current (DC) to alternating current (AC) inverter. Operatively attached to each panel 152 is a field sensor 502. Field sensor 502 typically measures the electric field within panel 152 or in the electric field in the immediate vicinity of panel 152. Attached to sensors 502 is a controller 504 which is also attached to load 150.

Reference is now made to FIG. 5b which shows a typical cross section 590 of photovoltaic panel 152. Cross section 590 shows typical parts 520a, 520b, 522, 524a, 534b, 526 and 528 which may be included in a photovoltaic panel 152. Parts 522, 524a, 534b, 526 and 528 are located in a casing 520 formed by parts 520a (typically a metal alloy) and 520b (typically a metal alloy or a plastic type of material) is used to house an insulating sheet 522. Next to insulating sheet 522 is a reactive encapsulant sheet 524a which is typically made from ethylene vinyl acetate polymer. Next to reactive encapsulant sheet 524a is photovoltaic substrate 526 followed by another reactive encapsulant sheet 524b. Finally after reactive encapsulant sheet 524b is a sheet typically of low iron flat glass 528. The side of photovoltaic substrate 526 adjacent to reactive encapsulant sheet 524b is where the metal tracks 550 (not shown) are which connect electrically the photovoltaic cells 552 (not shown) of photovoltaic substrate 526. Sensor 502 may be placed between photovoltaic substrate 526 and reactive encapsulant sheet 524a or in area A.

Reference is now made to FIG. 5c which shows a plan view photovoltaic panel 152. The plan view shows casing 520 and photovoltaic cells 552 with tracks 550 showing through transparent glass 528 and sheet 524b.

Reference is now also made to FIG. 5d which shows an equivalent capacitor 505 representing photovoltaic panel 152. Plate 530 and node D equivalently represent the casing 520 of panel 152. Dielectric 534 represents collectively; insulating sheet 522, reactive encapsulant sheets 524b/524a, photovoltaic substrate 526, low iron flat glass 528 and the air space shown by area A in FIG. 5b. Plates 532 with node E represent the metal track deposit 550 which connects electrically the photovoltaic cells 552 shown in FIG. 5c of photovoltaic sub strate 526. The capacitance (C) in farads of capacitor 505 is given by equation Eq. 1:

$$C = \frac{\varepsilon_0 \varepsilon_r X}{d} \qquad \text{Eq. 1}$$

with $\varepsilon_o$=permittivity of free space=$8.85 \times 10^{-12}$ farads per meter, $\varepsilon_r$=relative permittivity or dielectric constant of dielectric 534, X=the area of plates 530 and 532 and d=the distance between plates 530 and 532. An object in the vicinity of area A causes the dielectric constant ($\varepsilon_r$) to vary since the air space shown by area A in FIG. 5b makes up part of the dielectric constant ($\varepsilon_r$), hence the capacitance (C) varies and hence the electric field (E) varies in capacitor 505.

Figure 5E:
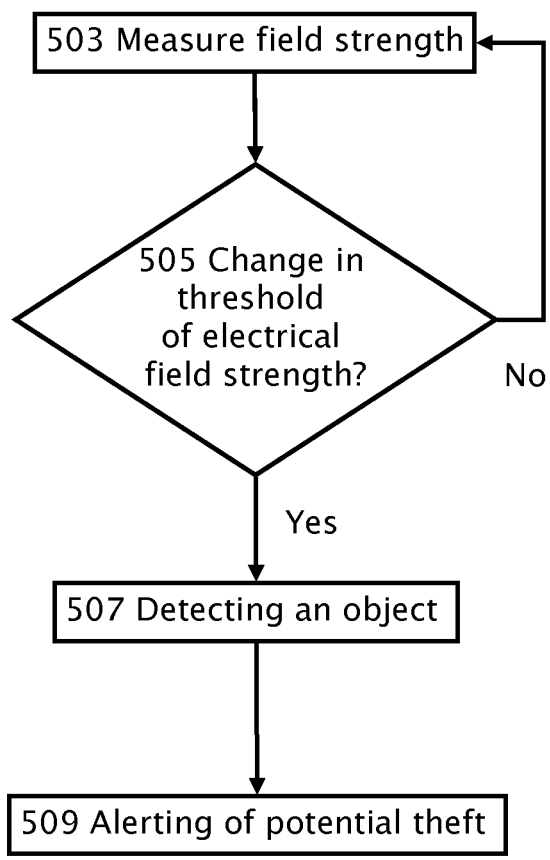
FIG. 5e shows a method for theft detection/prevention according to an embodiment of the present invention.

Reference is now also made to FIG. 5e which shows a method 511 for theft detection/prevention according to an embodiment of the present invention using equivalent capacitor 505. Sensor 502 measures the electric field strength (step 503) within panel 152 or in the electric field in the immediate vicinity of panel 152 i.e. area A. A change in the electric field strength measured field in the immediate vicinity of panel 152 or in panel 152 according to a predetermined threshold (step 505) is used to detect (step 507) an object in the immediate vicinity of panel 152. The change in electric field strength detected by sensor 502 is conveyed to central controller 504 which provides an alert of a potential theft of panel 152 (step 509). If there is no significant change in threshold of electric field strength (step 505) sensor 502 continues to measures the electric field strength (step 503).

Reflectometry from within a String

Figure 6A:
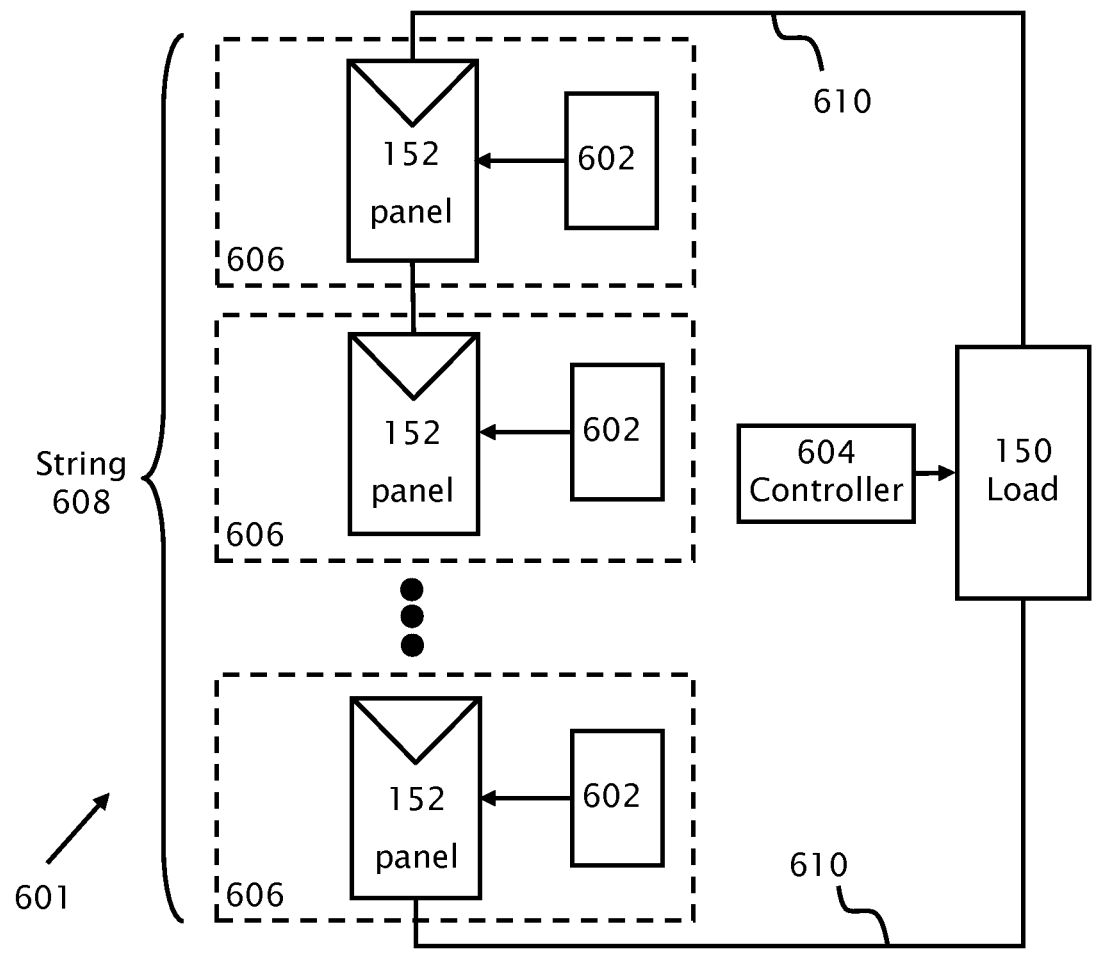
FIG. 6a shows a power generation system including a theft prevention feature according to an embodiment of the present invention.

Reference is now made to FIG. 6a which shows a power generation system 601 including a theft prevention feature according to an embodiment of the present invention. Multiple photovoltaic modules 606 are connected in series to form a photovoltaic string 608. Photovoltaic string 608 is connected across a load 150 via direct current (DC) power lines 610. Load 150 is preferably a direct current (DC) to alternating current (AC) inverter. Photovoltaic modules 606 have a photovoltaic panel 152 which is operatively attached to switch unit 602. A central control unit 604 is operatively attached to load 150 and typically provides a control signal and a test signal which are superimposed onto power lines 610 via load 150. Switch unit 602 optionally receives the control signal from unit 604 and in response to the control signal from unit 604; switch unit 602 typically reconfigures the connection of panel 152 to load 150 by adding a resonant circuit in either series or parallel with panel 152.

Figure 6B:
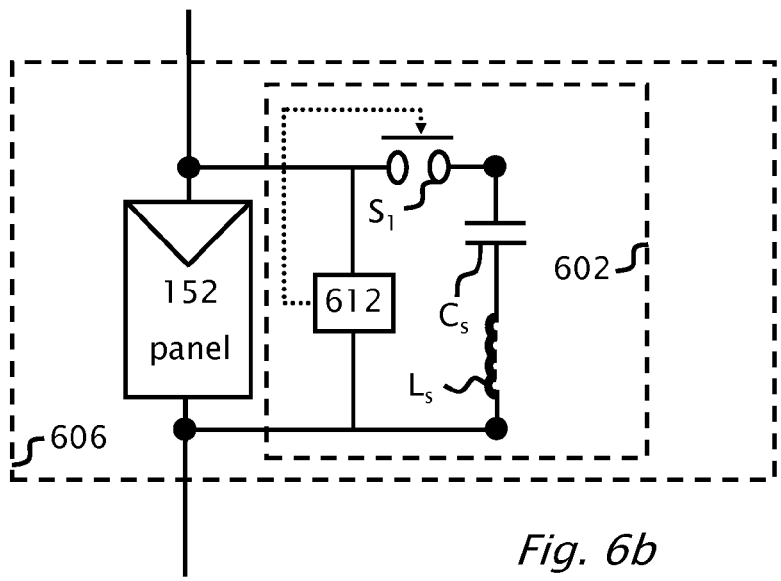
FIG. 6b shows further details of photovoltaic module according to an embodiment of the present invention.

Reference is now made to FIG. 6b which shows further details of photovoltaic module 606 according to an embodiment of the present invention. Photovoltaic module 606 typically has switch unit 602 connected across in parallel with a panel 152, in series with a string of panels or switch unit 602 may be connected across a string of panels 152. Multiple switch units may be activated independently. Switch unit 602 is operatively attached to controller 604 and when switch unit 602 connected in parallel with module 606, switch unit 602 preferably has a switch $S_1$ connected in series with a capacitor $C_s$ and inductor $L_s$. Switch $S_1$ is activated by actuator 612 with actuator 612 deriving power from connection across panel 152 as well as the control signal from central control unit 604 to close switch $S_1$. The power that actuator 612 derives from panel 152 additionally charges a storage device such as a battery located in actuator 612 to allow for nighttime operation of switch unit 602. Multiple switch units 602 may be activated/de-activated independently.

FIG. 6b shows that the resonant circuit is connected in parallel to panel 152. Alternatively, the resonant circuit may be in series to panel 152 (with the resonance circuit being a parallel LC instead of a series LC).

The need for switching the resonance circuit is not mandatory and might be not available if actuator 612 does not have power for doing so. Reflectometry may be measured even if the resonance circuit is always connected (either in series or in parallel). However, the reason for adding this resonance switching is in order to command each string to either activate or not activate the resonance. That way, we can control (via central unit, e.g load 150 in this case) which strings participate in the reflectometry measurement. Specifically, we would prefer to have only one string participating at a time which will enable us to get good accuracy for the measurement (meaning that all the other strings will have their resonance switched off).

Figure 6C:
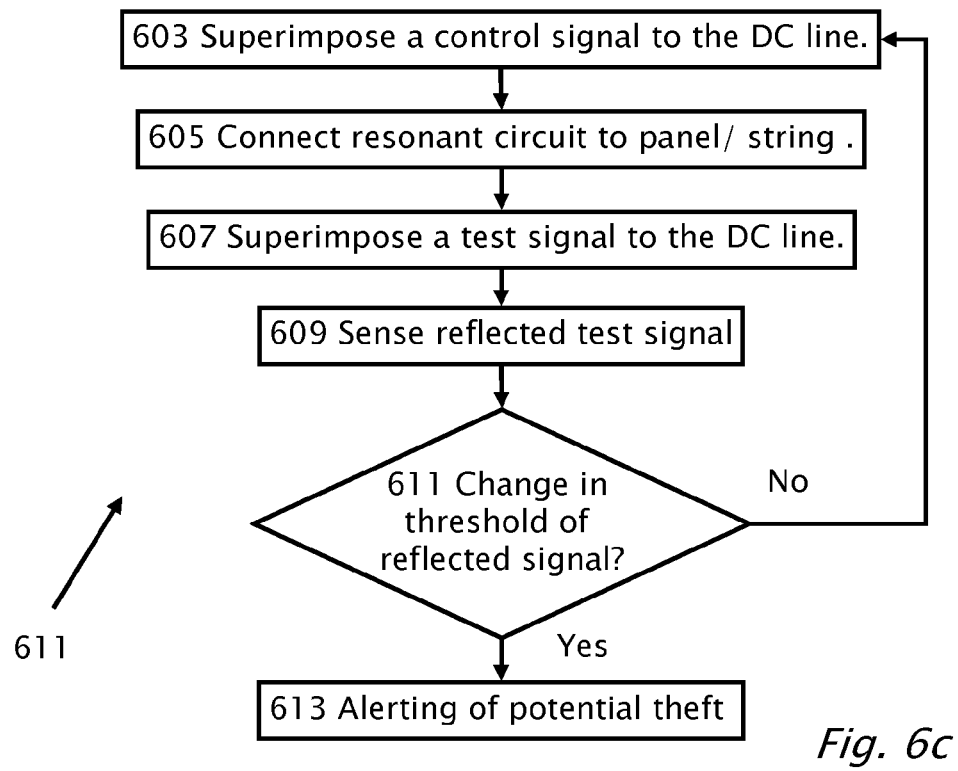
FIG. 6c shows a method for theft detection/prevention using the system shown in FIG. 6a according to an embodiment of the present invention.

Reference is now made to FIG. 6c which shows a method 611 for theft detection/prevention using system 601 according to an embodiment of the present invention. A control signal is superimposed onto power lines 610 by controller 604 (step 603). The control signal superimposed onto power lines 610 by controller 604 causes switch $S_1$ to close in switch unit 602. Switch $S_1$ in closing switch unit 602 cause series resonant circuit capacitor $C_s$ and inductor $L_s$ to be connected across panel 152 (step 605). Typically switch $S_1$ closes for a predetermined time period. With $S_1$ closed a test signal is superimposed onto power lines 610 by controller 604 (step 607). The test signal controller 604 superimposes onto power lines 610 may be a time division reflectometry (TDR) signal or a frequency division reflectometry signal (FDR). The test signal preferably resonates with series capacitor $C_s$ and inductor $L_s$. Series capacitor $C_s$ and inductor $L_s$ have values chosen to give a narrow band circuit of typically 15-25 MHz. Controller 604 then senses (step 609) the reflected TDR or FDR signal on power lines 610. If a change in sense threshold of reflected test signal is detected (step 611) an alerting of potential theft may be made (step 613) otherwise theft detection continues again with step 603.

Mesh Network

Figure 7A:
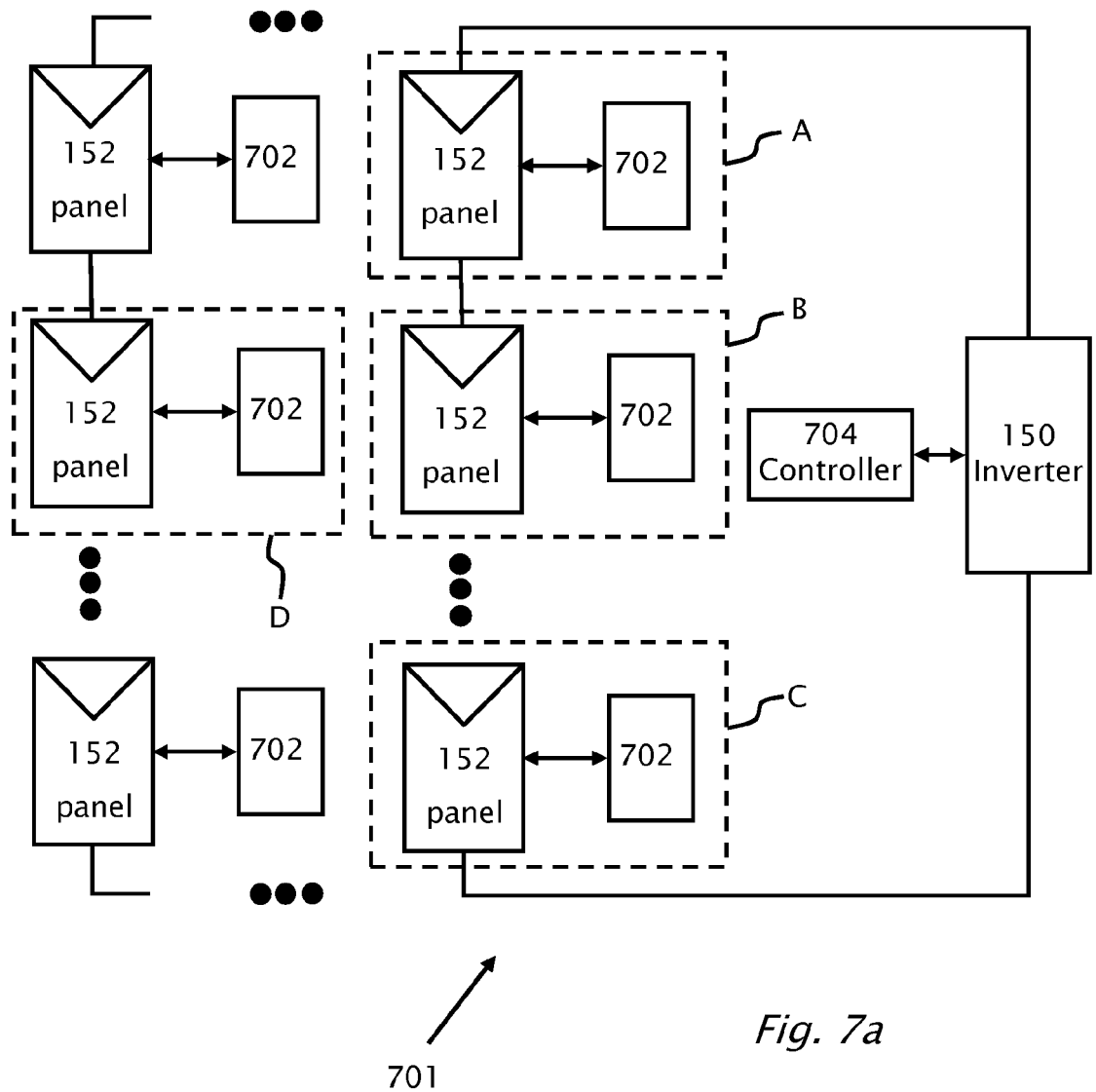
FIG. 7a which shows a power generation system including a theft prevention feature according to an embodiment of the present invention.

Reference is now made to FIG. 7a which shows a power generation system 701 including a theft prevention feature according to an embodiment of the present invention. Multiple photovoltaic panels 152 are connected in series to form a string. The string of photovoltaic panels 152 are connected across a load 150. Multiple strings are then also connected in parallel. Load 150 is preferably a direct current (DC) to alternating current (AC) inverter. Attached to each panel 152 is an electronic module 702. Module 702 typically receives a data signal from controller 704 via wireless or power line communications. For example, the data signal that panel module B receives from controller 704 typically requests panel module B to provide details of other panel modules in the immediate vicinity of panel module B. The panel modules in the immediate vicinity of panel B are panel modules A, C and D. A panel module typically collects data of other panel modules in the immediate vicinity and sends a data signal back to controller 704 via wireless communication or through the power lines connecting panels 152 to load 150.

Figure 7B:
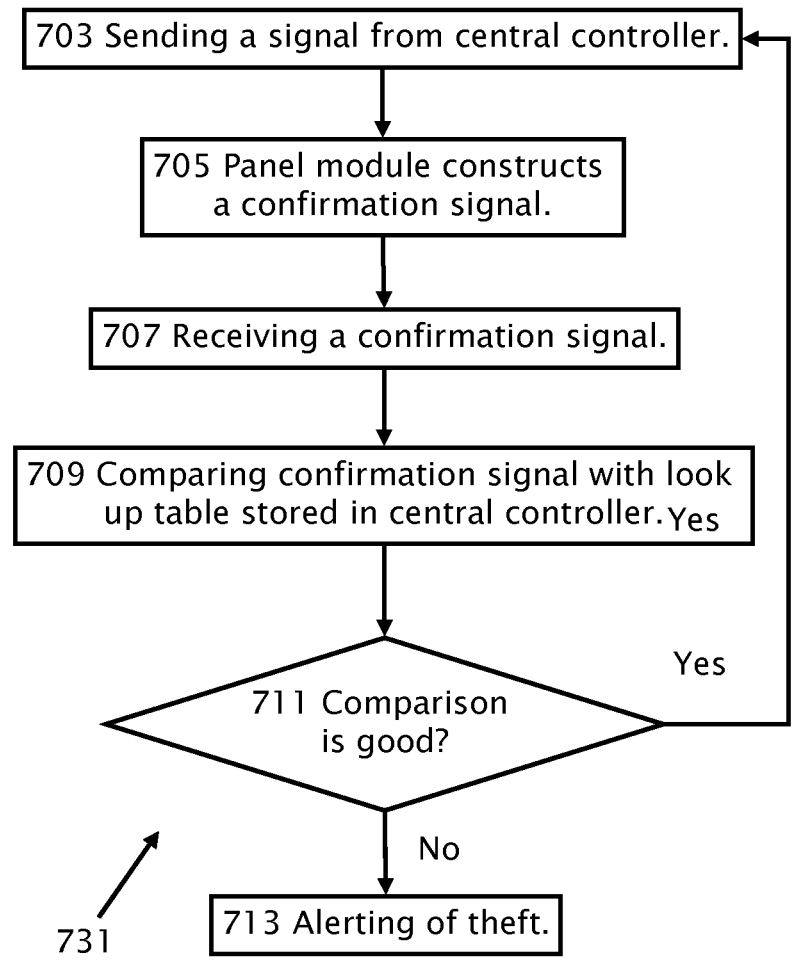
FIG. 7b which shows a method for theft detection/prevention according to an embodiment of the present invention.

Reference is now made to FIG. 7b which shows a method 731 for theft detection/prevention according to an embodiment of the present invention. Typically at the installation or upgrade of power generation system 701, details of system 701 in terms of electrical connection and/or topological layout of panels 152 in system 701 is programmed in a look up table in controller 704. Using panel module B as an exemplary embodiment of the present invention, controller 704 typically sends (step 703) a signal to panel module B via wireless communication or through the power lines connecting panels 152 to load 150. The signal sent from controller 704 to panel module B causes panel module B to construct a confirmation signal based on the signal sent from controller 704 (step 705). The constructed confirmation typically includes information about panel module B and according to a feature of the present invention, information that panel module B collects from panel modules A, C and D which are in the immediate vicinity of panel module B. Panel module B transmits the confirmation signal via wireless communication or through the power lines connecting panels 152 to load 150 where the confirmation signal is received by controller 704 (step 707). Controller 704 then compares the received confirmation signal with the look up table stored in controller 704 (step 709). If the comparison is good (step 711), theft detection continues by sending a signal from central controller 704 (step 703) otherwise a potential alert of theft of a panel and/or panels 152 is made (step 713).

Alternatively, probe signal (step 703) and confirmation signal (step 705) may not be required. Instead, each module 702 may be programmed to send a message periodically towards its neighbors, every three minutes for instance. The message when received is first of all a message that says transmitting module 702 is alive and can also measure data, e.g impedance and transmit data. The transmitted message is received by neighboring modules 702 and the transmission propagates along the mesh network until the transmission reaches controller 704 typically at the site of the load/inverter/main-receiver.

It is to be understood that although there are described herein different embodiments, the features of the various embodiments could be combined together, in any combination preferred by the skilled person. So doing can, for instance, provide a system with two or more theft prevention/detection devices and/or methods.

The definite articles "a", "an" is used herein, such as "a converter", "a switch" have the meaning of "one or more" that is "one or more converters" or "one or more switches".

Examples of various features/aspects/components/operations have been provided to facilitate understanding of the disclosed embodiments of the present invention. In addition, various preferences have been discussed to facilitate understanding of the disclosed embodiments of the present invention. It is to be understood that all examples and preferences disclosed herein are intended to be non-limiting.

Although selected embodiments of the present invention have been shown and described individually, it is to be understood that at least aspects of the described embodiments may be combined.

Also although selected embodiments of the present invention have been shown and described, it is to be understood the present invention is not limited to the described embodiments. Instead, it is to be appreciated that changes may be made to these embodiments without departing from the principles and spirit of the invention, the scope of which is defined by the claims and the equivalents thereof.

The invention claimed is:

1. A method comprising:
   receiving a first code from a direct current power source;
   comparing the first code to a second code assigned to a load including an inverter to produce a comparison result, the load connected to and receiving power from the direct current power source; and
   switching electrical power output of the load from being disabled to being enabled based on the comparison result being correct.

2. The method according to claim 1, wherein the comparison result being correct includes the first and second codes being the same or one of the first and second codes being a hash of the other of the first and second codes.

3. The method according to claim 1, wherein the comparing is performed by a remote server coupled to the direct current power source through a network.

4. The method according to claim 3, further comprising:
   receiving the second code by the remote server from the load, wherein the comparing of the first code and the second code includes comparing the first code and the second code to a third code stored at the remote server.

5. The method according to claim 1, further comprising:
   retrieving the second code from a memory in the load, wherein the comparing is performed by a microprocessor in the load.

6. The method, according to claim 1, wherein the first code or the second code is generated by a global positioning system module which bases the first code or the second code respectively on global coordinates of the direct current power source or the load.

7. The method, according to claim 1, wherein at least a portion of the first code or the second code is based on global coordinates of at least one of the direct current power source or the load at a time of installation of the direct current power source or the load.

8. The method, according to claim 1, further comprising disabling the electrical power output of the load based on the comparison result being incorrect.

9. The method of claim 1, wherein the direct current power source includes a photovoltaic source.

10. The method of claim 1, wherein the enabling of the electrical power output from the load includes enabling power conversion by the inverter.

11. The method of claim 1, further comprising:
    comparing the first code and the second code to produce a second comparison result; and
    enabling and disabling the electrical power output from the direct current power source based on the second comparison result being correct and incorrect, respectively.

12. The method of claim 1, further comprising:
    determining a unique association between the direct current power source and the load based on the comparison result being correct.

13. A system comprising:
    a direct current power source including a first memory storing a first code assigned to the direct current power source;
    a load including an inverter including a second memory storing a second code assigned to the load; and
    a processor configured to:
      receive the first code from the first memory and the second code from the second memory;
      compare the first code and the second code to produce a comparison result; and
      disable electrical power output from the load based on the comparison result not being correct.

14. The system according to claim 13, wherein the processor is attached to the load or a remote server configured to receive the first code from the first memory and the second code from the second memory through a network.

15. The system according to claim 13, further comprising a global position module located at a location of the load or a location of the direct current power source, wherein at least one of the first code or the second code is based on global coordinates generated by the global position module.

16. An apparatus comprising:
a microprocessor configured to:
receive a first code from a memory attached to a photovoltaic module,
compare the first code to a second code assigned to a power converter, and
control, in response to the compare being correct, a signal that enables the power converter.

17. The apparatus of claim 16, further comprising the power converter, which includes a direct-current-to-direct-current power converter.

18. The apparatus of claim 17, further comprising a communication interface, wherein the second code is received through the communication interface from an inverter.

19. The apparatus of claim 16, further comprising the power converter, which includes an inverter.

20. The apparatus of claim 16, wherein the compare being correct includes the first and second codes being the same or one of the first and second codes being a hash of the other of the first and second codes.

* * * * *